US009553101B2

(12) United States Patent
Kim et al.

(10) Patent No.: US 9,553,101 B2
(45) Date of Patent: Jan. 24, 2017

(54) SEMICONDUCTOR DEVICE

(71) Applicant: Samsung Electronics Co., Ltd., Suwon-si (KR)

(72) Inventors: Taekyung Kim, Seoul (KR); Kwang Soo Seol, Yongin-si (KR); Hyunchul Back, Suwon-si (KR); Jin-Soo Lim, Yongin-si (KR); Seong Soon Cho, Suwon-si (KR)

(73) Assignee: SAMSUNG ELECTRONICS CO., LTD., Samsung-ro, Yeongtong-gu, Suwon-si (KR)

( * ) Notice: Subject to any disclaimer, the term of this patent is extended or adjusted under 35 U.S.C. 154(b) by 0 days.

(21) Appl. No.: 14/258,772

(22) Filed: Apr. 22, 2014

(65) Prior Publication Data

US 2015/0001460 A1 Jan. 1, 2015

(30) Foreign Application Priority Data

Jun. 27, 2013 (KR) ........................ 10-2013-0074592

(51) Int. Cl.
*H01L 27/115* (2006.01)
*H01L 27/06* (2006.01)
(Continued)

(52) U.S. Cl.
CPC ..... *H01L 27/11578* (2013.01); *H01L 27/0688* (2013.01); *H01L 27/11519* (2013.01); *H01L 27/11556* (2013.01); *H01L 27/11582* (2013.01); *H01L 27/11597* (2013.01); *H01L 27/249* (2013.01); *H01L 27/2409* (2013.01); *H01L 27/2454* (2013.01); *H01L 29/66825* (2013.01); *H01L 29/66833* (2013.01); *H01L 29/7889* (2013.01); *H01L 29/7926* (2013.01);
*H01L 45/04* (2013.01); *H01L 45/06* (2013.01); *H01L 45/10* (2013.01); *H01L 45/1226* (2013.01);
(Continued)

(58) Field of Classification Search
CPC ................... H01L 27/11578; H01L 27/11519; H01L 29/66825; H01L 29/66833; H01L 29/7889; H01L 29/7926; H01L 27/11582; H01L 27/11597; H01L 29/4234
USPC ............................. 257/5, 314, 324
See application file for complete search history.

(56) References Cited

U.S. PATENT DOCUMENTS 7,989,880 B2   8/2011   Wada et al.
8,084,805 B2  12/2011   Shim et al.
(Continued)

FOREIGN PATENT DOCUMENTS

KR        10-1056113 B1    8/2011
KR   10-2011-0107985 A    10/2011
KR        10-1090979 B1   12/2011

*Primary Examiner* — David Vu
*Assistant Examiner* — Mouloucoulaye Inoussa
(74) *Attorney, Agent, or Firm* — Muir Patnet Law, PLLC

(57) ABSTRACT

A semiconductor device may include gate structures spaced apart above a top surface of a substrate. The gate structures may include a horizontal electrode extending in a first direction parallel with the top surface of a substrate. An isolation insulating layer may be disposed between the gate structures. A plurality of cell pillars may penetrate the horizontal electrode and connect to the substrate. The plurality of cell pillars may include a minimum spacing defined by a shortest distance between any two of the plurality of cell pillars. The thickness of the horizontal electrode may be greater than the minimum spacing of the cell pillars.

21 Claims, 47 Drawing Sheets

(51) Int. Cl.
- *H01L 27/24* (2006.01)
- *H01L 29/66* (2006.01)
- *H01L 29/788* (2006.01)
- *H01L 29/792* (2006.01)
- *H01L 45/00* (2006.01)

(52) U.S. Cl.
CPC ........... *H01L 45/144* (2013.01); *H01L 45/146* (2013.01); *H01L 45/147* (2013.01); *H01L 45/148* (2013.01)

(56) References Cited

U.S. PATENT DOCUMENTS

| | | |
|---|---|---|
| 8,236,673 B2 | 8/2012 | Son et al. |
| 8,325,527 B2 | 12/2012 | Jin et al. |
| 8,338,876 B2 | 12/2012 | Kito et al. |
| 8,415,242 B2 | 4/2013 | Mizushima et al. |
| 2009/0097321 A1* | 4/2009 | Kim .................. G11C 16/0483 365/185.18 |
| 2010/0202206 A1 | 8/2010 | Seol et al. |
| 2010/0207193 A1 | 8/2010 | Tanaka et al. |
| 2011/0156132 A1 | 6/2011 | Kiyotoshi |
| 2012/0092926 A1 | 4/2012 | Whang et al. |
| 2012/0098050 A1* | 4/2012 | Shim .................. H01L 27/11578 257/324 |
| 2012/0193705 A1 | 8/2012 | Lim et al. |
| 2012/0238093 A1* | 9/2012 | Park .................. H01L 21/76838 438/675 |
| 2013/0134493 A1* | 5/2013 | Eom .................. H01L 29/7926 257/314 |
| 2014/0063890 A1 | 3/2014 | Lee et al. |

* cited by examiner

SEMICONDUCTOR DEVICE

CROSS-REFERENCE TO RELATED APPLICATION

This application claims priority under 35 U.S.C. §119 to Korean Patent Application No. 10-2013-0074592, filed on Jun. 27, 2013, in the Korean Intellectual Property Office, the disclosure of which is hereby incorporated by reference in its entirety.

BACKGROUND

The inventions relate to semiconductor devices and, more particularly, to vertical semiconductor devices.

Semiconductor devices have become over time more highly integrated in order to provide increasingly improved performance and lower cost. The integration density of semiconductor devices is a primary factor that directly influences the costs of the semiconductor devices. The area that a unit memory cell occupies mainly determines the integration density of a conventional two-dimensional (2D) memory. Improvement in the integration density of conventional 2D memory devices is greatly affected by the technology for forming fine patterns for which the dimensions are typically measured in nanometers. Extremely high-priced equipment is needed in order to form these fine patterns, however, and while the integration density of 2D memory devices continues to increase, there are practical and economic limits that affect this technology.

Three-dimensional (3D) semiconductor devices including three-dimensionally arranged blocks of memory cells have been proposed to address the above issues. However, production of 3D semiconductor memory devices is expensive when compared with 2D semiconductor memory devices, and there are concerns regarding providing reliable product characteristics.

SUMMARY

Embodiments of the inventions disclosed herein provide semiconductor devices capable of improving reliability.

In one aspect, a semiconductor device may include a plurality of gate structures spaced apart above a top surface of a substrate, the plurality of gate structures including a horizontal electrode extending in a first direction parallel with the top surface of the substrate. An isolation insulating material may be disposed between the gate structures, and a plurality of cell pillars penetrate the horizontal electrode and connect to the substrate. A thickness of the horizontal electrode may be greater than a first spacing defined by a shortest distance between any two of the plurality of the cell pillars.

In some embodiments, the thickness of the horizontal electrode may be greater than a second spacing of the cell pillars defined by a shortest distance between two adjacent cell pillars of the plurality of cell pillars that are nearest to the isolation insulating material.

In some embodiments, the second spacing of the cell pillars may be greater than the first spacing of the cell pillars.

In some embodiments, the plurality of cell pillars may include first cell pillars nearest to the side of the isolation insulating material and second cell pillars next nearest to the side of the isolation insulating material, and the first cell pillars and the second cell pillars may be arranged in a zigzag.

In some embodiments, a distance between a pair of immediately adjacent first cell pillars may be equal to or greater than a distance between a pair of immediately adjacent second cell pillars. A diameter of a first cell pillar may be less than a diameter of a second cell pillar. The distance between the pair of the immediately adjacent first cell pillars may be greater than a distance between one of the first cell pillars and one of the second cell pillars nearest to the one of the first cell pillars.

In some embodiments, the plurality of cell pillars may further include third cell pillars third-nearest to the side of the first isolation insulating material, and the first to third cell pillars may be arranged in a zigzag. In some embodiments, a distance between one of the second cell pillars and one of the first cell pillars nearest thereto may be greater than a distance between one of the second cell pillars and one of the third cell pillars nearest thereto.

In another aspect, a semiconductor device may include gate structures disposed above a substrate, each of the gate structures including vertically stacked horizontal electrodes and insulating patterns between the horizontal electrodes. A first isolation insulating layer may be disposed between the gate structures. A plurality of cell pillars may penetrate the gate structures and connect to the substrate. A thickness of each of the horizontal electrodes in the gate structures may be greater than a distance between adjacent cell pillars where the cell pillars penetrate the horizontal electrode.

In some embodiments, each of the gate structures may include horizontally spaced apart first and second uppermost horizontal electrodes.

In some embodiments, the semiconductor device may further include a second isolation insulating layer filling a trench that penetrates the horizontal electrodes and the insulating patterns between the upper selection gates in each of the gate structures. The trench may expose the substrate and extend in the first direction.

In some embodiments, the trench may be provided between the cell pillars in a center portion of each of the gate structures. The distance between the second isolation insulating layer and a cell pillar nearest to the second isolation insulating layer may be less than a distance between a pair of immediately adjacent cell pillars.

In some embodiments, the semiconductor device may further include dummy pillars extending to the substrate through the gate structures between the horizontally spaced apart first and second uppermost horizontal electrodes.

In some embodiments, the dummy pillars may be disposed between the cell pillars in a center portion of each of the gate structures, and the dummy pillars and the cell pillars adjacent thereto may be arranged in a zigzag.

In some embodiments, a distance between one of the dummy pillars and one of the cell pillars nearest to the one of the dummy pillars may be greater than a distance between a pair of immediately adjacent cell pillars.

In some embodiments, the cell pillars may be semiconductor pillars. In this case, the semiconductor device may further include a charge storage element between each of the semiconductor pillars and each of the horizontal electrodes.

In some embodiments, the charge storage element may include a charge storage layer, a blocking insulating layer between the charge storage layer and each of the horizontal electrodes, and a tunnel insulating layer between the charge storage layer and each of the semiconductor pillars.

In some embodiments, the semiconductor device may further include a common source line provided in the substrate overlapping with the first isolation insulating layer, and a bit line coupled to the cell pillars In some embodiments, the cell pillars may be conductive pillars, and the semiconductor device may further include a charge storage element between each of the conductive pillars and each of the horizontal electrodes. In this case, the charge storage element may be a variable resistance pattern.

In yet another aspect, a semiconductor device may comprise a plurality of gate structures spaced apart above a top surface of a substrate. The plurality of gate structures may include a horizontal electrode extending in a first direction parallel with the top surface of the substrate. An isolation insulating material may be disposed between the gate structures. A plurality of cell pillars may penetrate the horizontal electrode and connects to the substrate. The plurality of cell pillars may include a minimum spacing defined by a shortest distance between any two of the plurality of cell pillars. The thickness of the horizontal electrode may be greater than the minimum spacing of the cell pillars.

In some embodiments, the plurality of cell pillars may include a second minimum spacing of the cell pillars defined by a shortest distance between two adjacent cell pillars of the plurality of cell pillars that are nearest to the isolation insulating material. The thickness of the horizontal electrode may be greater than the second minimum spacing of the cell pillars. The second minimum spacing of the cell pillars may be greater than the first minimum spacing of the cell pillars.

In some embodiments, the plurality of cell pillars may include first cell pillars nearest to the isolation insulating material and second cell pillars next nearest to the isolation insulating material. The first cell pillars and the second cell pillars may be arranged in a zigzag. The distance between a pair of immediately adjacent first cell pillars may be equal to or greater than a distance between a pair of immediately adjacent second cell pillars.

In some embodiments, the diameter of a first cell pillar may be less than a diameter of a second cell pillar. The distance between the pair of immediately adjacent first cell pillars may be greater than a distance between one of the first cell pillars and one of the second cell pillars nearest to the one of the first cell pillars.

According to yet still another aspect, a semiconductor device may comprise first and second spaced-apart gate structures disposed above a substrate. Each of the gate structures may include vertically stacked horizontal electrodes and insulating patterns between the horizontal electrodes. A first isolation insulating layer may be disposed between the gate structures, and a plurality of cell channel structures may penetrate the gate structures and connects to the substrate. The thickness of each of the horizontal electrodes in the gate structures may be greater than a distance between adjacent cell channel structures where the cell channel structures penetrate the horizontal electrode.

In some embodiments, each of the gate structures may include horizontally spaced apart first and second uppermost horizontal electrodes.

Each of the first and second gate structures may further comprise a second isolation insulating layer filling a trench extending from a top surface of the gate structure to the substrate through the vertically stacked horizontal electrodes. The trench may be provided between cell channel structures in a center portion of each of the gate structures. A distance between the second isolation insulating layer and a cell channel structure nearest to the second isolation insulating layer may be less than a distance between a pair of immediately adjacent cell channel structures.

In some embodiments, dummy pillars may extend to the substrate through the gate structures between the horizontally spaced apart first and second uppermost horizontal electrodes. The dummy pillars may be disposed between the cell channel structures in a center portion of each of the gate structures and the dummy pillars and the cell channel structures adjacent thereto may be arranged in a zigzag. A distance between a dummy pillar and a cell channel structure may be less than a distance between a pair of immediately adjacent cell channel structures.

In some embodiments, the cell channel structures may be semiconductor pillars, and there may be a charge storage element between each of the semiconductor pillars and each of the horizontal electrodes. The charge storage element may include a charge storage layer, a blocking insulating layer between the charge storage layer and each of the horizontal electrodes, and a tunnel insulating layer between the charge storage layer and each of the semiconductor pillars. The charge storage element may be a variable resistance pattern.

According to still yet another aspect, a semiconductor device may comprise a gate structure disposed above a substrate, the gate structure including vertically stacked horizontal electrodes and insulating patterns between the horizontal electrodes. An isolation insulating layer may extend along a side of the gate structure. A first plurality of cell pillars may penetrate the gate structure and connect to the substrate, each pillar of the first plurality having a first diameter and located a first distance from the isolation insulating layer. A second plurality of cell pillars may penetrate the gate structure and connect to the substrate, each pillar of the second plurality having a second diameter and located a second distance from the isolation insulating layer. The first diameter may be smaller than the second diameter and the first distance may be less than the second distance.

In some embodiments, at least one of the horizontal electrodes may have a thickness greater than a distance between adjacent pillars of the first plurality of cell pillars where the pillars penetrate the horizontal electrode. The cell channel pillars each may comprise an inner columnar insulating layer and an outer cylindrical conductive layer.

In some embodiments, the first plurality of cell pillars may comprise a first column of cell pillars, the second plurality of cell pillars may comprise a second column of cell pillars, and the first and second columns of pillars may be arranged in a zigzag pattern. A plurality of charge storage elements may be positioned between the vertically stacked horizontal electrodes and the first and second plurality of cell pillars.

According to other aspects, a method of providing a semiconductor device may comprise providing a gate structure disposed above a substrate, the gate structure including vertically stacked horizontal electrodes and insulating patterns between the horizontal electrodes. An isolation insulating layer extending along a side of the gate structure may also be provided. A first plurality of cell pillars penetrating the gate structure and connected to the substrate may also be provided, the first plurality of cell pillars extending in a column parallel to the side of the gate structure adjacent the isolating insulating layer. A second plurality of cell pillars penetrating the gate structure and connected to the substrate may also be provided, the second plurality of cell pillars extending in a column parallel to and adjacent the first plurality of cell pillars. At least one of the horizontal electrodes may have a thickness greater than a distance between adjacent pillars of the first plurality of cell pillars where the pillars penetrate the horizontal electrode.

In some embodiments, the first and second pluralities of cell pillars may be provided as first and second columns of cell pillars arranged in a zigzag pattern. The first column of pillars may be provided as pillars with a first diameter and the second column of pillars as pillars with a second diameter smaller than the first diameter.

In some embodiments, a trench may be provided in the gate structure extending through the horizontal electrodes and insulating patterns to the substrate. Dummy pillars may be provided in the trench.

BRIEF DESCRIPTION OF THE DRAWINGS

The inventions will become more apparent in view of the attached drawings and accompanying detailed description.

FIGS. 8A to 13A and 16A are plan views illustrating stages of fabrication of an embodiment corresponding to FIG. 7B;

FIG. 8B to 13B and 16B are cross-sectional views corresponding to FIG. 7C;

FIGS. 19A to 24A are plan views illustrating stages of fabrication corresponding to FIG. 18B;

FIGS. 19B to 24B are cross-sectional views corresponding to FIG. 18C;

FIGS. 27A to 32A are plan views illustrating stages of fabrication corresponding to FIG. 26B;

FIGS. 27B to 32B are cross-sectional views corresponding to FIG. 26C;

FIGS. 35A to 38A are plan views illustrating stages of fabrication corresponding to FIG. 34B;

FIGS. 35B to 38B are cross-sectional views corresponding to FIG. 34C;

DETAILED DESCRIPTION OF THE EMBODIMENTS

Figure 1:
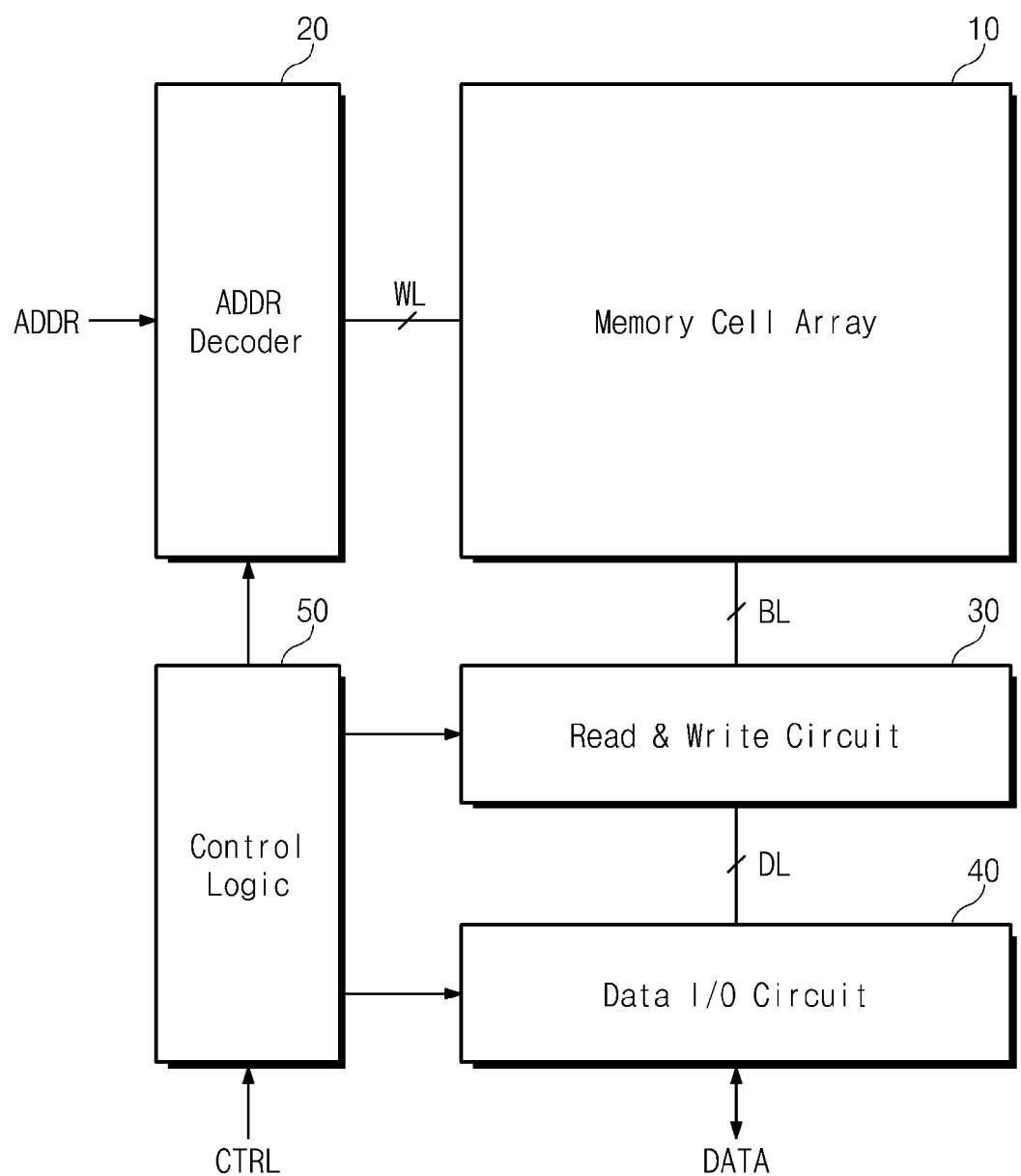
FIG. 1 is a schematic block diagram illustrating a semiconductor device according to embodiments of the inventions.

Exemplary embodiments and aspects of the inventions will now be described more fully hereinafter with reference to the accompanying drawings. The advantages and features of the inventions and methods of implementing them will be apparent from the following exemplary embodiments that will be described in more detail with reference to the accompanying drawings. It should be noted, however, that the inventions are not limited to the following exemplary embodiments, and may be implemented in various forms. Accordingly, the exemplary embodiments are provided only to disclose the inventions and let those skilled in the art understand how to make and use the inventions. In the drawings, aspects of the inventions are not limited to the specific examples provided herein. It also is noted that some features are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising", "includes", "including", "has" and/or "having", when used herein, specify the presence of stated features, integers, steps, operations, elements, and/or components, but do not preclude the presence or addition of one or more other features, integers, steps, operations, elements, components, and/or groups thereof.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Additionally, the embodiment in the detailed description will be described with sectional views as ideal exemplary views of embodiments of the inventions. Accordingly, shapes of the exemplary views may be modified according to manufacturing techniques and/or allowable errors. Therefore, the embodiments of the inventions are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventions.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventions explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the present specification, a distance between cell pillars is defined as the shortest distance between outer sidewalls of a pair of cell pillars adjacent to each other. In the present specification, the comparison of a thickness of horizontal electrodes and a distance between adjacent cell pillars is provided at substantially the same level in the structure, such as at the same height above the substrate.

Embodiments of various aspects of the inventions will now be described with reference to the drawings in detail.

FIG. 1 is a schematic block diagram illustrating a semiconductor device according to embodiments of the inventions. Referring to FIG. 1, a semiconductor device according to embodiments of the inventions may include a memory cell array 10, an address decoder 20, a read/write circuit 30, a data input/output (I/O) circuit 40, and a control logic circuit 50.

The memory cell array 10 may be connected to the address decoder 20 through a plurality of word lines WL and may be connected to the read/write circuit 30 through bit lines BL. The memory cell array 10 includes a plurality of memory cells. For example, the memory cell array 10 may be configured to store one or more bits in one memory cell.

The address decoder 20 may be connected to the memory cell array 10 through the word lines WL. The address decoder 20 is configured to be operated in response to control of the control logic circuit 50. The address decoder 20 may receive address signals ADDR from the outside of the semiconductor device. The address decoder 20 decodes a row address signal of the received address signals ADDR to select a corresponding word line of the plurality of wore lines WL. Additionally, the address decoder 20 decodes a column address signal of the received address signals ADDR and then transmits the decoded column address signal to the read/write circuit 30. For example, the address decoder 20 may include well-known components such as a row decoder, a column decoder, and an address buffer.

The read/write circuit 30 may be connected to the memory cell array 10 through the bit lines BL and may be connected to the data I/O circuit 40 through data lines DL. The read/write circuit 30 may be operated in response to control of the control logic circuit 50. The read/write circuit 30 is configured to receive the decoded column address signal. The read/write circuit 30 selects one of the bit lines BL by using the decoded column address. For example, the read/write circuit 30 receives data from the data I/O circuit 40 and writes the received data into the memory cell array 10. The read/write circuit 30 reads data from the memory cell array 10 and transmits the read data to the data I/O circuit 40. The read/write circuit 30 may read data from a first storage region of the memory cell array 10 and may write the read data into a second storage region of the memory cell array 10. For example, the read/write circuit 30 may be configured to perform a copy-back operation.

The read/write circuit 30 may include components such as a page buffer (or a page register) and a column selection circuit. In other embodiments, the read/write circuit 30 may include components such as a sense amplifier, a write driver, and a column selection circuit.

The data I/O circuit 40 may be connected to the read/write circuit 30 through the data lines DL. The data I/O circuit 40 is operated in response to control of the control logic circuit 50. The data I/O circuit 40 is configured to exchange data DATA with an external system. The data I/O circuit 40 is configured to transmit data DATA transmitted from the external system to the read/write circuit 30 through the data lines DL. The data I/O circuit 40 is configured to output data DATA transmitted from the read/write circuit 30 through the data lines DL to the external system. For example, the data I/O circuit 40 may include a component such as a data buffer.

The control logic circuit 50 may be connected to the address decoder 20, the read/write circuit 30, and the data I/O circuit 40. The control logic circuit 50 is configured to control operations of the semiconductor device. The control logic circuit 50 may be operated in response to a control signal CTRL transmitted from the external system.

Figure 2:
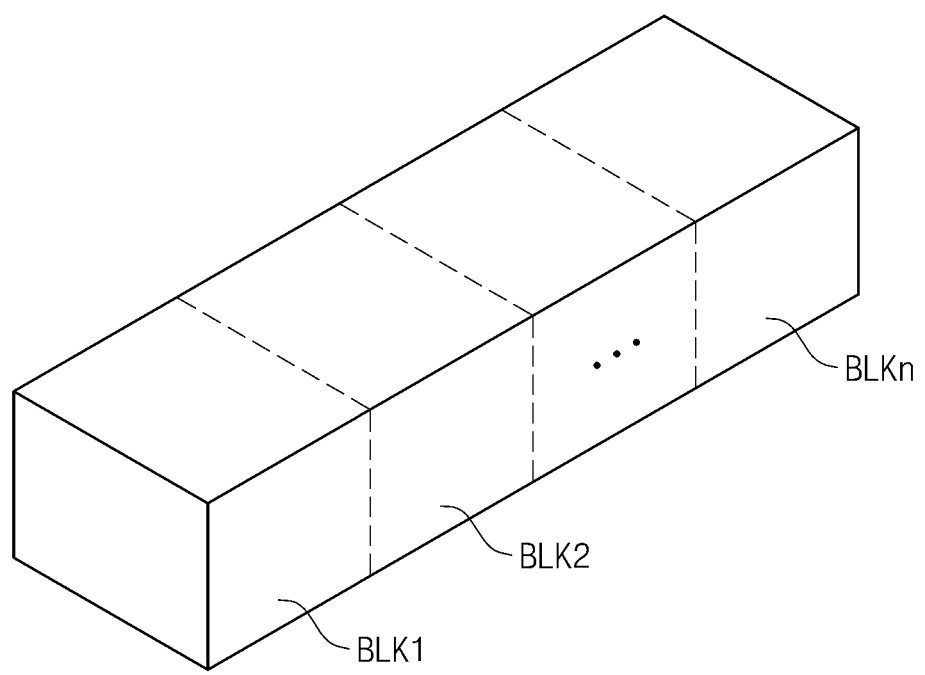
FIG. 2 is a block diagram illustrating an example of a memory cell array of FIG. 1.

FIG. 2 is a block diagram illustrating an example of a memory cell array of FIG. 1. Referring to FIG. 2, the memory cell array 10 may include a plurality of memory blocks BLK1 to BLKn. Each of the memory blocks BLK1 to BLKn may have a three-dimensional (3D) structure (e.g., a vertical structure). For example, each of the memory blocks BLK1 to BLKn may include a plurality of cell strings extending in a vertical direction.

Figure 3:
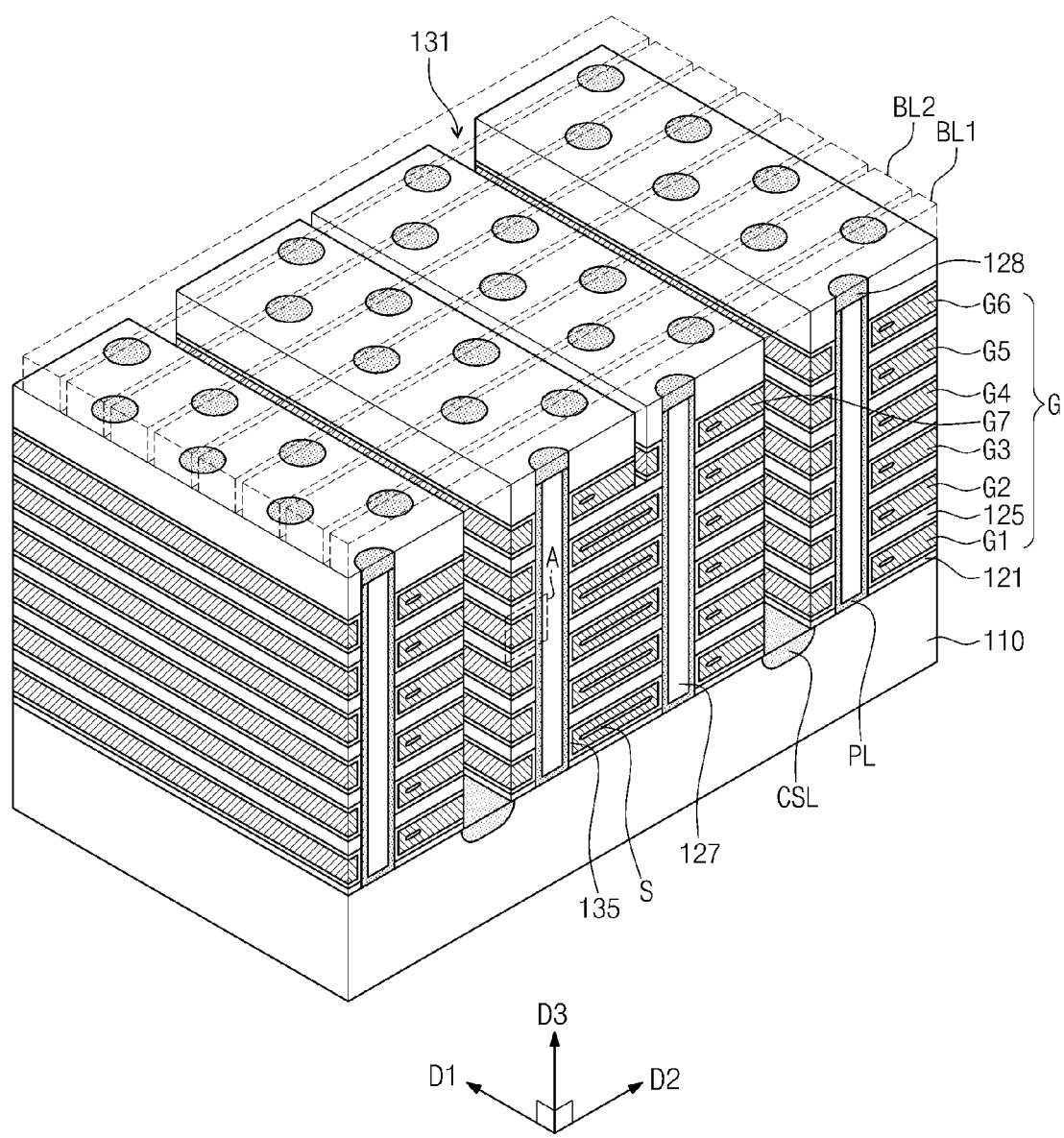
FIG. 3 is a perspective view illustrating a memory block of a semiconductor device according to some embodiments of the invention.

FIG. 3 is a perspective view illustrating a portion of a memory block of a semiconductor device according to some aspects of the inventions. Referring to FIG. 3, a substrate 110 is provided. The substrate 110 may have a first conductivity type (e.g., a P-type). A buffer dielectric layer 121 is provided on the substrate 110. The buffer dielectric layer 121 may for example be a silicon oxide layer. Insulating patterns 125 and horizontal electrodes of a gate structure are provided above the buffer dielectric layer 121. The horizontal electrodes are spaced apart from each other with the insulating patterns 121 therebetween.

The horizontal electrodes include first to seventh horizontal electrodes G1 to G7 as shown in FIG. 3. G6 and G7 may be referred to as uppermost gate structure in that they are situated farthest above the substrate 110 of any electrodes in their respective gate structures. As can be seen in FIG. 3, in the gate structure containing G7 there are two uppermost electrodes that are separated by a trench in the gate structure.

Figure 4A:
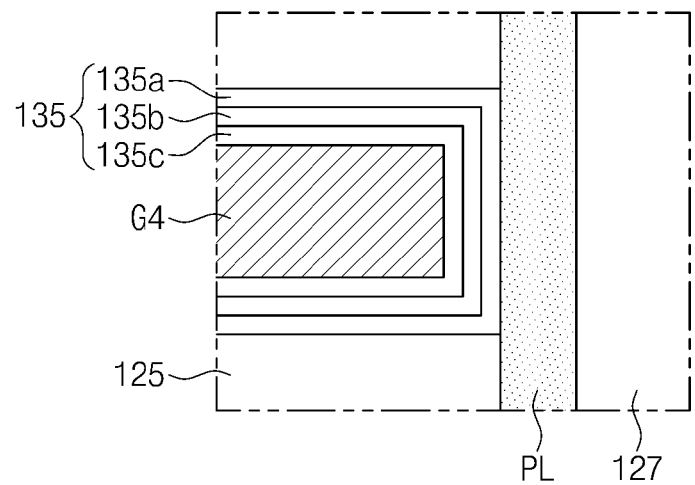
FIGS. 4A and 4B are enlarged views of embodiments of a portion 'A' of FIG. 3.
Figure 4B:
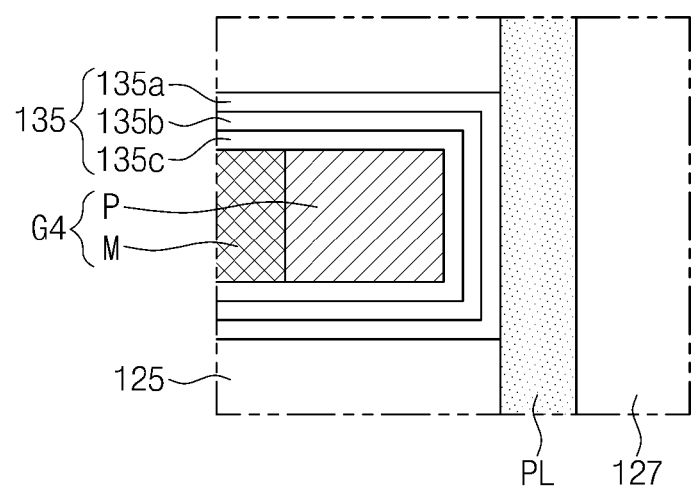

The insulating patterns 125 may include silicon oxide. The buffer dielectric layer 121 may be thinner than the insulating patterns 125. The horizontal electrodes G1 to G7 may include materials such as doped silicon, a metal (e.g., tungsten), a metal nitride, a metal silicide, or any combination thereof. FIG. 4A illustrates details of the horizontal electrodes G1 to G7 with the example of G4, illustratively formed including doped silicon, a metal (e.g., tungsten), or a metal nitride. FIG. 4B illustrates another example of the horizontal electrodes G1 to G7 in which each includes a doped poly-silicon P and a metal silicide M. Additional details of FIGS. 4A and 4B can be found in the description below of FIG. 5A.

Hollow regions S may be provided in the horizontal electrodes G1 to G7. The hollow regions S correspond to empty regions in the gate structures not filled with the material constituting the horizontal electrodes G1 to G7. A cross section of each hollow region S may have a slit-shape. The insulating patterns 125 and the horizontal electrodes G1 to G7 are vertically stacked and extend in a first direction D1 which is parallel with the plane defined by the top surface of the substrate 110. Each of gate structures G may include the stacked insulating patterns 125 and the horizontal electrodes G1 to G7. The gate structures G may face each other in a second direction D2 crossing the first direction D1, which illustratively is perpendicular to D1 and parallel to the plane of the top surface of substrate 110.

In FIG. 3, a plurality of uppermost horizontal electrodes and one lowermost horizontal electrode are shown in one gate structure G. However, this is not a constraint on the inventions. The uppermost sixth and seventh horizontal electrodes G6 and G7 may be separated from each other in the second direction D2 and may extend in the first direction D1. In FIG. 3, the uppermost horizontal electrodes are two. However, the inventions are not limited thereto. The uppermost horizontal electrodes may be two or more.

Figure 7A:
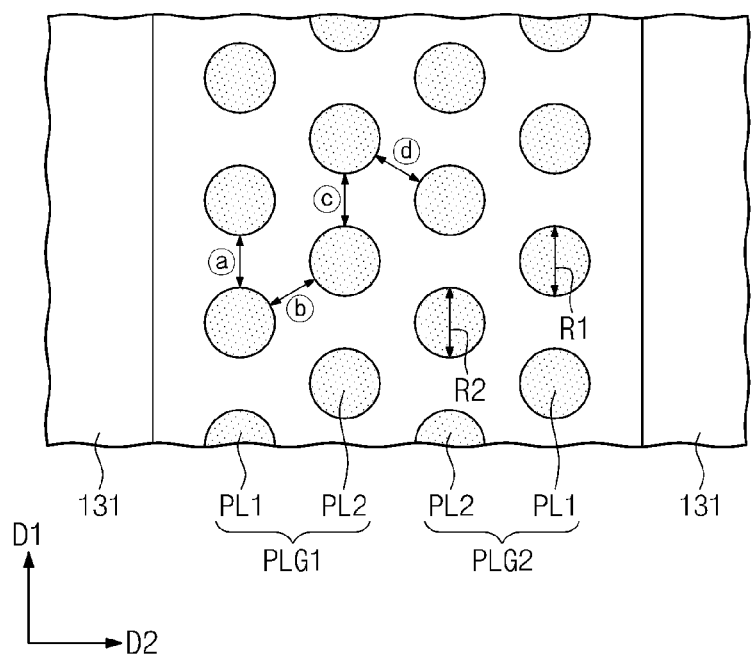
FIG. 7A is a plan view illustrating arrangement of cell pillars of the memory block of FIG. 3.
Figure 7B:
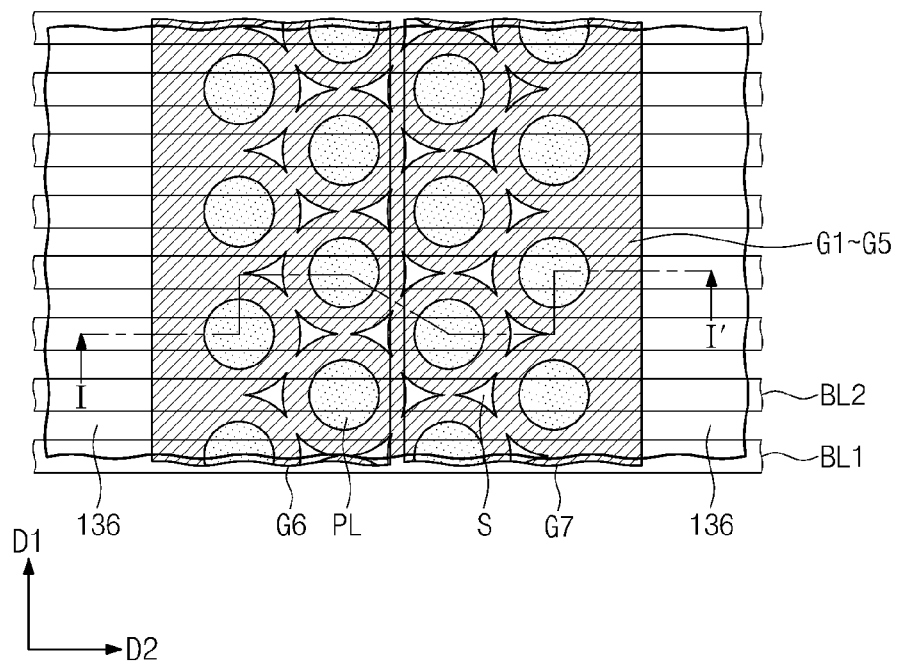
FIG. 7B is a plan view illustrating shapes of horizontal electrodes of the memory block of FIG. 3.
Figure 7C:
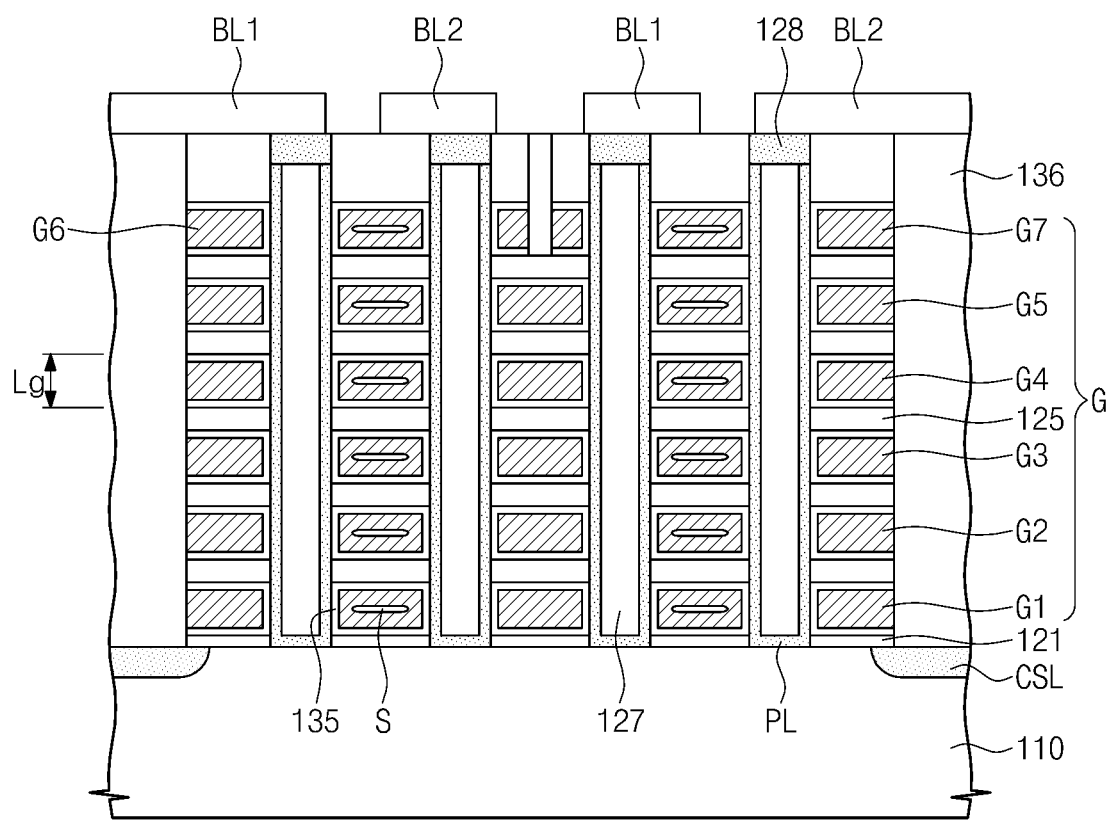
FIG. 7C is a cross-sectional view taken along a line I-I' of FIG. 7B.

Isolation regions 131 extending in the first direction D1 may be provided between the gate structures G. The isolation regions 131 and the gate structures G may be alternately arranged in the second direction D2. The isolation regions 131 may be filled with a first isolation insulating layer 136 as illustrated in FIGS. 7B AND 7C. Common source lines CSL are provided in the substrate 110 underneath the isolation regions 131. The common source lines CSL may be spaced apart from each other and may extend in the first direction D1 in the substrate 110. The common source lines CSL may have a second conductivity (e.g., an N-type) different from the first conductivity. Although not shown in FIG. 3, the common source lines CSL may include conductive lines provided between the substrate and the lowermost first horizontal electrode G1 and extending in the first direction D1.

As illustrated in FIGS. 3 and 7C, a plurality of cell pillars PL penetrate the horizontal electrodes G1 to G7 and are connected to the substrate 110. Each of the cell pillars PL has a long axis extending upward from the substrate 110 (i.e., in a third direction D3, perpendicular to both D1 and D2 and to the top surface of substrate 110). The plurality of cell pillars PL may be arranged in zigzag. In other words, the plurality of cell pillars PL may be alternately offset in the first direction D1. First ends of the cell pillars PL may be connected to the substrate 110 and second ends of the cell pillars PL may be connected to upper interconnections extending in the second direction D2. The upper interconnections may include a first upper interconnection BL1 and a second upper interconnection BL2, which extend in the second direction and are adjacent to each other.

A data storage element 135 may be provided between each of the cell pillars PL and each of the horizontal electrodes G1 to G7. Alternatively, a gate insulating layer instead of the data storage element 135 may be provided between each of the cell pillars PL and each of the uppermost and lowermost horizontal electrodes G1, G6 and G7.

In an aspect, the cell pillars PL may include a semiconductor material. Each of the cell pillars PL may, for example, have a solid columnar structure or a hollow cylinder structure (e.g., a macaroni-shape). An inner region of the cell pillar PL having the macaroni-shape may be filled with a filling insulating layer 127. The filling insulating layer 127 may be formed of a silicon oxide layer. The cell pillars PL and the substrate 110 may be a semiconductor having a continuous structure. In this case, the cell pillars PL may be a single-crystalline semiconductor. Alternatively, the substrate 110 and each of the cell pillars PL may have a discontinuous interface therebetween. In this case, the cell pillars PL may be semiconductor pillars having a polycrystalline or amorphous structure. A conductive pattern 128 may be provided on one end of each of the cell pillars PL.

While the illustrated embodiments show cell pillars PL with generally circular cross-sections, aspects of the inventions do not require this specific structure. Other structures such as vertically extending cell channel structures with cross-sections that may variously be elliptical, hexagonal, rectangular, etc. may be used to implement pillars. In situations where it is important to consider the diameter of a pillar, one of skill will understand how to determine an effective diameter of a pillar with a non-circular cross-section (e.g., for an equilateral hexagon it is typical to use twice the length of one side, or for a rectangle to use the corner-to-corner diagonal length, or for an ellipse to use the average of the major and minor diameters, etc.). Also, embodiments of aspects of the inventions may include other cell channel structures that might not be referred to as pillars. The term cell channel structure refers to its typical use with a gate electrode as shown for example in the various FIGS. 4 to 6, where the cell channel structure (e.g., a cell pillar) provides a transistor channel, such as the types used in a memory cell or a selection transistor.

A plurality of cell strings may be provided between the upper interconnections BL1 and BL2 and the common source lines CSL. The upper interconnections BL1 and BL2 may be bit lines of a flash memory device. One cell string may include an upper selection transistor connected to one of the upper interconnections BL1 and BL2, a lower selection transistor connected to the common source line CSL, and a plurality of memory cells provided between the upper and lower transistors. The first horizontal electrode G1 may be a lower selection gate of the lower selection transistor. The second to fifth horizontal electrodes G2 to G5 may be cell gates of the plurality of memory cells. The sixth and seventh horizontal electrodes G6 and G7 may be upper selection gates of the upper selection transistors. The plurality of memory cells is provided on one cell pillar PL. The lower selection gate may be a ground selection gate of the flash memory device. The upper selection gates may be string selection gates of the flash memory device.

Figure 5A:
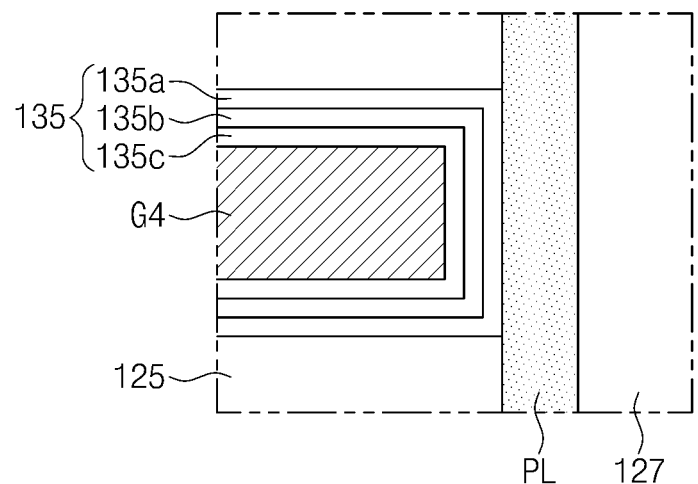
FIGS. 5A to 5D are enlarged views of embodiments of a portion 'A' of FIG. 3.

FIGS. 5A to 5D are enlarged views of a portion 'A' of FIG. 3, and similar to FIGS. 4A and 4B show electrode G4 as an example for embodiments of the structure for the electrodes G1 to G7. Referring to FIG. 5A, a data storage element 135 may include a blocking insulating layer 135c adjacent to each of the horizontal electrodes G1 to G7, a tunnel insulating layer 135a adjacent to each of the cell pillars PL, and a charge storage layer 135b between the blocking insulating layer 135c and the tunnel insulating layer 135a. The data storage element 135 may extend between the horizontal electrodes G1 to G7 and the insulating patterns 125. The blocking insulating layer 135c may include a high-k dielectric layer (e.g., an aluminum oxide layer or a hafnium oxide layer). The blocking insulating layer 135c may be a multi-layer consisting of a plurality of thin films. For example, the blocking insulating layer 135c may include an aluminum oxide layer and/or a hafnium oxide layer, and a stack order of the aluminum oxide layer and the hafnium oxide layer may be various. The charge storage layer 135b may be a charge trap layer or an insulating layer including conductive nano particles. The charge trap layer may include, for example, a silicon nitride layer. The tunnel insulating layer 135a may include a silicon oxide layer.

Figure 5B:
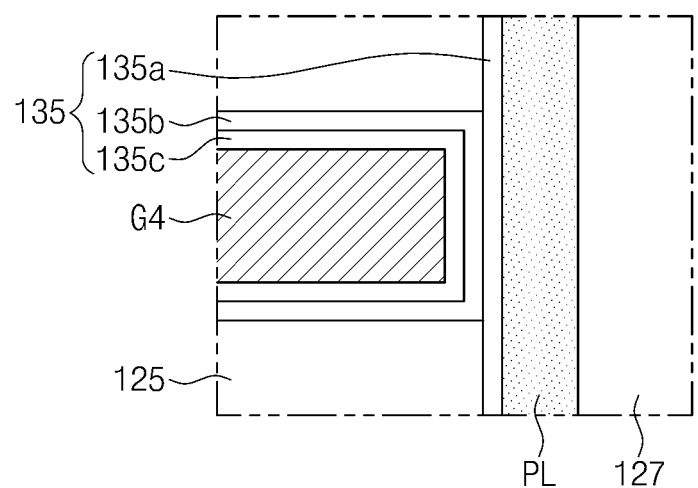
Figure 5C:
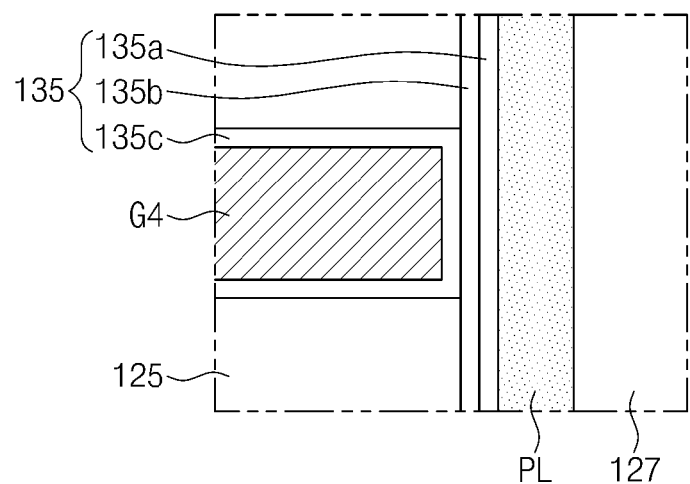
Figure 5D:
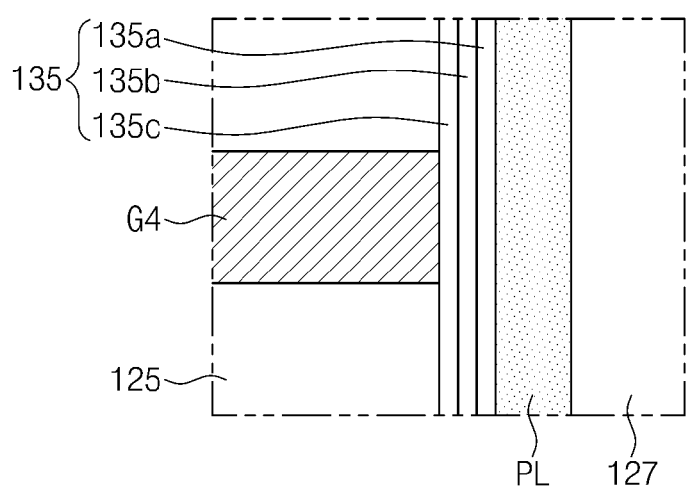

Referring to FIGS. 5B to 5D, at least a portion of the data storage element 135 may extend between the insulating pattern 125 and the cell pillar PL (unlike the illustrated embodiments of FIGS. 3, 4A, 4B, and 5A). Referring to FIG. 5B, the tunnel insulating layer 135a may extend to be disposed between the cell pillar PL and the insulating patterns 125, and the charge storage layer 135b and the blocking insulating layer 135c may extend to be disposed between each of the horizontal electrodes G1 to G7 and the insulation patterns 125. Referring to FIG. 5C, the tunnel insulating layer 135a and the charge storage layer 135b may extend to be disposed between the cell pillar PL and the insulating patterns 125, and the blocking insulating layer 135c may extend to be disposed between each of the horizontal electrodes G1 to G7 and the insulating patterns 125. Referring to FIG. 5D, the tunnel insulating layer 135a, the charge storage layer 135b and the blocking insulating layer 135c may extend to be disposed between the cell pillar PL and the insulating patterns 125.

In another aspect, the cell pillars PL may be conductive pillars. The cell pillars PL may include at least one of conductive materials such as a doped semiconductor, a metal, a conductive metal nitride, a metal silicide, and a nano-structure (e.g., a carbon nano-tube or a graphene). The charge storage element 135 may be a variable resistance pattern. The variable resistance pattern may include one or more materials having a variable resistance property. In other words, resistances of the materials having the variable resistance property are changeable.

Figure 6A:
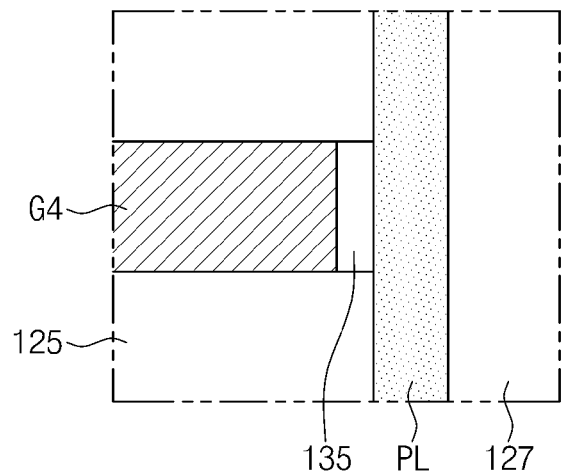
FIGS. 6A to 6D are enlarged views of embodiments of a portion 'A' of FIG. 3.
Figure 6B:
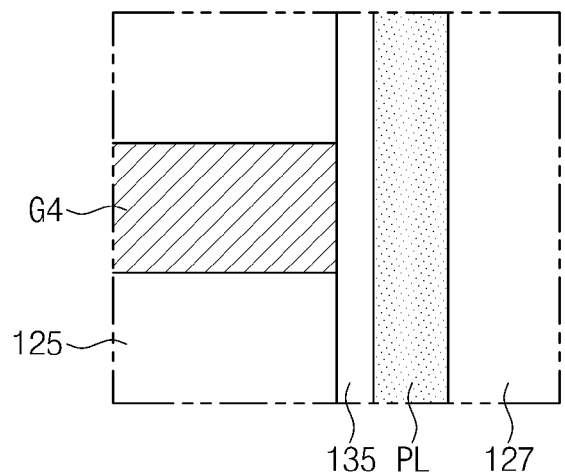
Figure 6C:
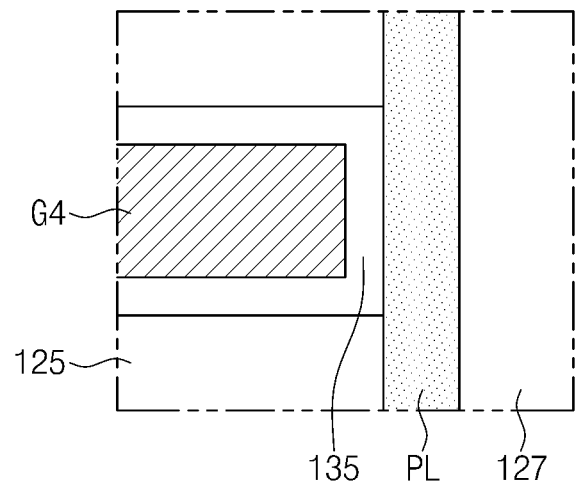

FIGS. 6A to 6D are enlarged views of a portion 'A' of FIG. 3. Referring to FIG. 6A, the data storage element 135 may be confined between each of the horizontal electrodes G1 to G7 and each of the cell pillars PL. Alternatively, referring to FIGS. 6B and 6C, the data storage element 135 may extend to be disposed between the cell pillar PL and the insulating patterns 125 or between each of the horizontal electrodes G1 to G7 and the insulating patterns 125.

In some embodiments, the data storage element 135 may include a material of which an electrical resistance can be changed by heat generated using a current passing through an electrode adjacent thereto. For example, the data storage element 135 may include a phase change material. The phase change material may include at least one of antimony (Sb), tellurium (Te), and selenium (Se). For example, the phase change material may include a chalcogenide including tellurium (Te) of about 20% to about 80%, antimony (Sb) of about 5% to about 50%, and germanium (Ge). Additionally, the phase change material may further include impurities including at least one of nitrogen (N), oxygen (O), carbon (C), bismuth (Bi), indium (In), boron (B), tin (Sn), silicon (Si), titanium (Ti), aluminum (Al), nickel (Ni), iron (Fe), dysprosium (Dy), and lanthanum (La). Alternatively, the variable resistance pattern may be formed, for example, of one of GeBiTe, InSb, GeSb, and GaSb.

In other embodiments, the data storage element 135 may include a thin layer structure of which an electrical resistance can be changed using spin torque transfer by a current passing through the thin layer structure. The data storage element 135 may have the thin layer structure configured to exhibit a magneto-resistance property. The data storage element 135 may include at least one ferromagnetic material and/or at least one anti-ferromagnetic material.

In still other embodiments, the data storage element 135 may include at least one of perovskite compounds or transition metal oxides. For example, the data storage element 135 may include at least one of niobium oxide, titanium oxide, nickel oxide, zirconium oxide, vanadium oxide, (Pr, Ca)MnO$_3$ (PCMO), strontium-titanium oxide, barium-strontium-titanium oxide, strontium-zirconium oxide, barium-zirconium oxide, or barium-strontium-zirconium oxide.

Figure 6D:
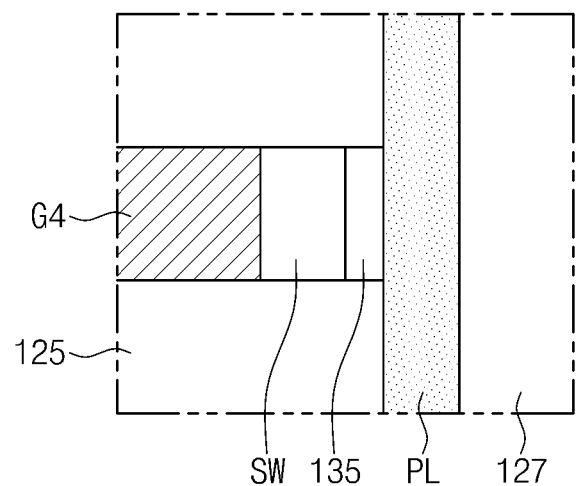

According to another aspect of the inventions, some embodiments, referring now to FIG. 6D, include at least one material SW (e.g., a PN junction diode) having a self-rectifying property further formed between each of the data storage elements 135 and some or all of the horizontal electrodes G1 to G7.

Aspects of semiconductor device including gate structures and cell channel structures such as pillars according to some embodiments of the inventions will be described in more detail hereinafter. FIG. 7A is a plan view illustrating arrangement of cell pillars of a memory block of FIG. 3. FIG. 7B is a plan view illustrating shapes of horizontal electrodes of the memory block of FIG. 3. FIG. 7C is a cross-sectional view taken along a line I-I' of FIG. 7B. In FIGS. 7A and 7B, the data storage element 135 is not illustrated for the purpose of simplicity in the drawings.

Referring to FIGS. 7A, 7B, and 7C, the isolation regions 131 are filled with a first isolation insulating layer 136. As illustrated in FIGS. 7B and 7C, hollow regions S are provided in the horizontal electrodes G1 to G7 between the cell pillars PL.

The cell pillars PL may include a first group PLG1 and a second group PLG2. Each of the groups PLG1 and PLG2 may include first cell pillars PL1 in a first section nearest to the first isolation insulating layer 136, and second cell pillars PL2 in a second section next nearest to the first isolation insulating layer 136. The sections may be referred to as columns, in that they are columnar arrangements of pillars extending in direction D1. The groups PLG1 and PLG2 may be adjacent to each other in the second direction D2. One group (e.g., PLG1) may be directly adjacent and parallel to another group (e.g., PLG2). The second cell pillars PL2 may shift from the first cell pillars PL1 in the first direction D1. A shift distance may be about a half of a pitch of the cell pillars in the first direction D1. The first and second cell pillars PL1 and PL2 may be alternately offset from each other in the first direction D1.

Figure 14:
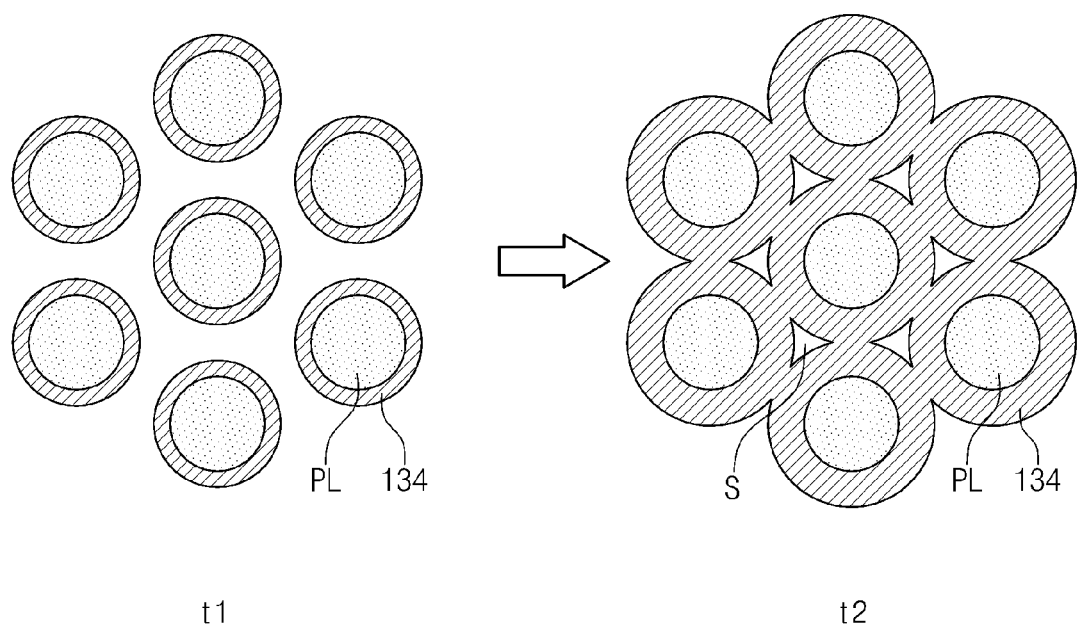
FIG. 14 is an enlarged view of a portion 'B' of 13A to illustrate filling of a conductive layer for horizontal electrodes.

As illustrated in FIGS. 7A to 7C, the cell pillars PL1 and PL2 of one group (e.g., PLG1) may be arranged in the same form as those of another group (e.g., PLG2) adjacent to the one group. With the spacing of pillars as shown in FIGS. 7A and 7B, groups of six pillars PL may form a substantially equilateral hexagonal pattern, as also illustrated in FIG. 14. Alternatively, the cell pillars of one group (e.g., PLG1) and the cell pillars of another group (e.g., PLG1) adjacent to the one group may be mirror-symmetrical (See FIG. 18A, where PLG1 and PLG2 are mirror symmetrical about the longitudinal axis of trench 132). In FIGS. 7A to 7C, one group has the cell pillars PL1 and PL2 arranged along two columns. However, embodiments of the inventions are not limited thereto. In other embodiments, for example, one group may have the cell pillars arranged along two or more columns. In FIGS. 7A to 7C, the two groups are disposed to be parallel to each other in one gate structure. However, the inventions are not limited thereto. Two or more groups may be disposed to be parallel to each other in one gate structure.

The cell pillars of one group PLG1 or PLG2 may be coupled to one upper selection gate G6 or G7.

According to embodiments of the inventions, as illustrated in FIGS. 7A and 7C, a thickness Lg of each of the horizontal electrodes G1 to G7 is greater than a distance (a) between cell pillars (e.g., the first cell pillars PL1) that are nearest to the first isolation insulating layer 136 and are immediately adjacent to each other. Additionally, the thickness Lg of each of the horizontal electrodes G1 to G7 may be greater than the minimum value of distances (a), (b), (c), and (d) between the cell pillars PL immediately adjacent to each other. Generally speaking, Lg may be greater than any distance between any pillar and its nearest neighboring pillar The distances between the cell pillars PL may be non-uniform. A distance between the cell pillars is defined as a distance between sidewalls of a pair of cell pillars adjacent to each other. A distance between at least a pair of cell pillars that are near to the first isolation insulating layer 136 and are adjacent to each other may be greater than a distance between at least a pair of cell pillars that are far from the first isolation insulating layer 136 and are adjacent to each other. In other words, the distance between the cell pillars that are nearest to the first isolation insulating layer 136 and are adjacent to each other may be greater than distances between other cell pillars.

The distances between the cell pillars may be determined depending on a pitch of the cell pillars and/or diameters of the cell pillars. For example, a diameter R1 of the first cell pillars PL1 nearest to the first isolation insulating layer 136 may be less than a diameter R2 of the second cell pillars PL2 far from the first isolation insulating layer 136.

The distance (a) between immediately adjacent first cell pillars PL1 may be greater than the distance (c) between immediately adjacent second cell pillars PL2. The distance (a) between the immediately adjacent first cell pillars PL1 may be greater than the distance (b) between one of the first cell pillars PL1 and one of the second pillars PL2 nearest thereto. The distance (c) between the immediately adjacent second cell pillars PL2 may be less than the distance (b) between one of the first cell pillars PL1 and one of the second pillars PL2 nearest thereto. The distance (c) between the immediately adjacent second cell pillars PL2 may be greater than the distance (d) between immediately adjacent cell pillars in a center portion of the gate structure G. In other words, the distance (c) between the immediately adjacent second cell pillars PL2 may be greater than the distance (d) between one of the second cell pillars PL2 of the first group PLG1 and one of the second cell pillars PL2 of the second group PLG2 nearest thereto.

The upper interconnections may include the first upper interconnection BL1 and the second interconnection BL2. The first cell pillars PL1 and the second cell pillars PL2 in one group may be connected by different upper interconnections. The first cell pillar PL 1 of the first group PLG1 and the second cell pillar PL2 of the second group PLG2 may be connected to the first upper interconnection BL1. The second cell pillar PL2 of the first group PLG1 and the first cell pillar PL1 of the second group PLG2 may be connected to the second upper interconnection BL2. The first upper interconnection BL1 may be immediately adjacent to the second upper interconnection BL2.

A method of manufacturing the semiconductor device of FIG. 3 will now be described with reference to FIGS. 8A to 13A and 16A, which are plan views corresponding to FIG. 7B, and FIG. 8B to 13B and 16B, which are cross-sectional views corresponding to FIG. 7C.

Figure 8A:
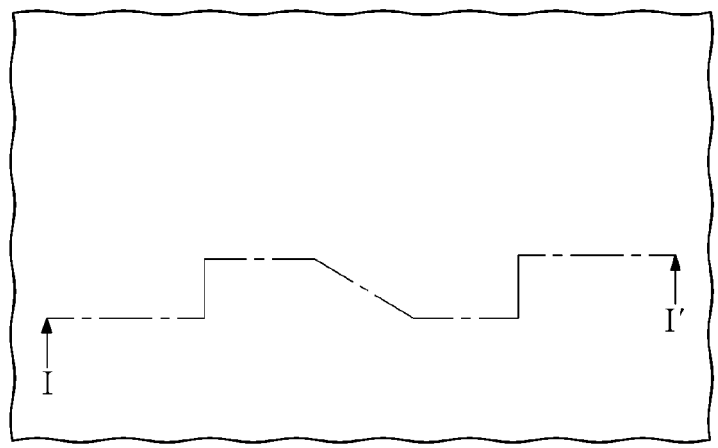
Figure 8B:
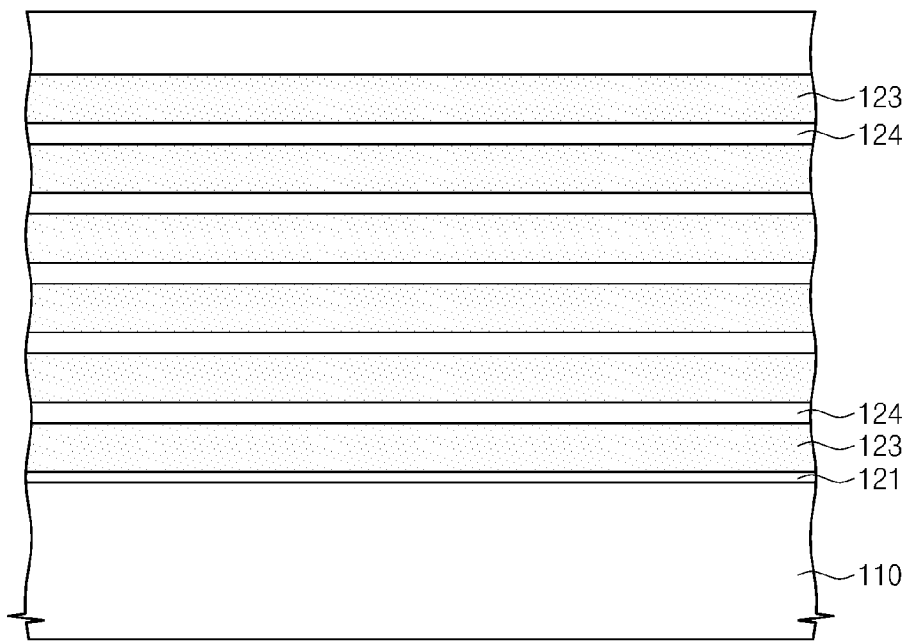

Referring to FIGS. 8A and 8B, a substrate 110 is provided. The substrate 110 may have a first conductivity type (e.g., a P-type). A buffer dielectric layer 121 may be formed on the substrate 110. The buffer dielectric layer 121 may be, for example, a silicon oxide layer. The buffer dielectric layer 121 may be formed by, for example, a thermal oxidation process. Sacrificial layers 123 and insulating layers 124 may be provided to be alternately stacked on the buffer dielectric layer 121. The thickness of the uppermost insulating layer may be greater than those of other insulating layers. The insulating layers 124 may be, for example, silicon oxide layers. The sacrificial layers 123 may include a material having a wet etching property different from those of the buffer dielectric layer 121 and the insulating layers 124. For example, each of the sacrificial layers 123 may include a silicon nitride layer, a silicon oxynitride layer, a poly-silicon layer, or a poly-silicon-germanium layer. The sacrificial layers 123 and the insulating layers 124 may be formed by, for example, chemical vapor deposition (CVD) methods.

Figure 9A:
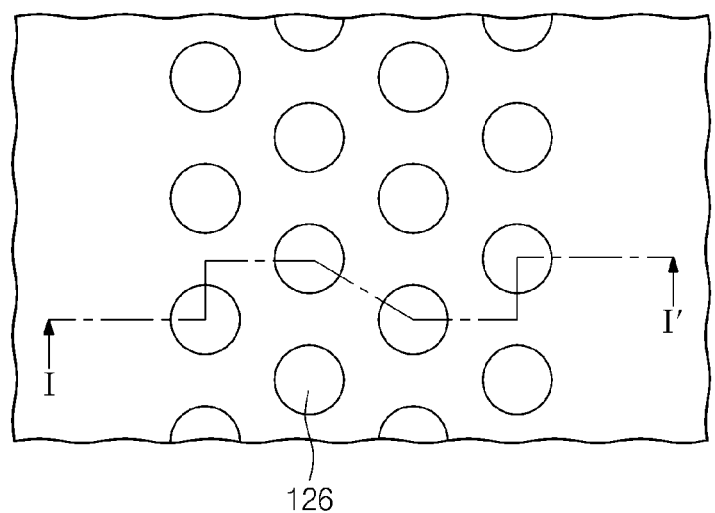
Figure 9B:
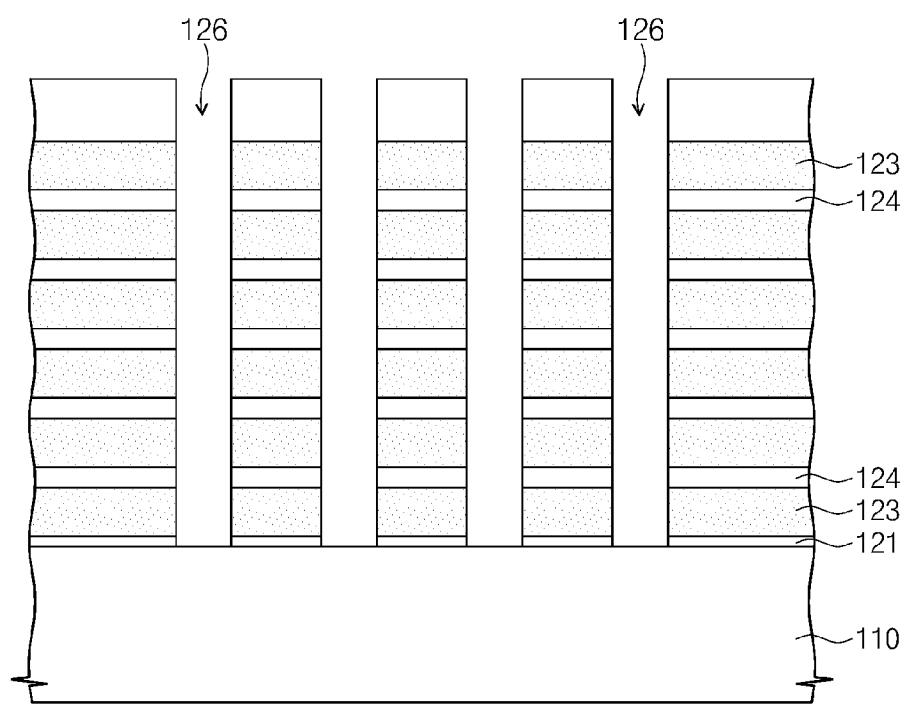

Referring to FIGS. 9A and 9B, cell holes 126 are formed to penetrate the buffer dielectric layer 121, the sacrificial layers 123 and the insulating layers 124. The cell holes 126 expose the substrate 110. Arrangement of the cell holes 126 may be the same as the arrangement of the cell pillars PL described with reference to FIG. 7A.

Figure 10A:
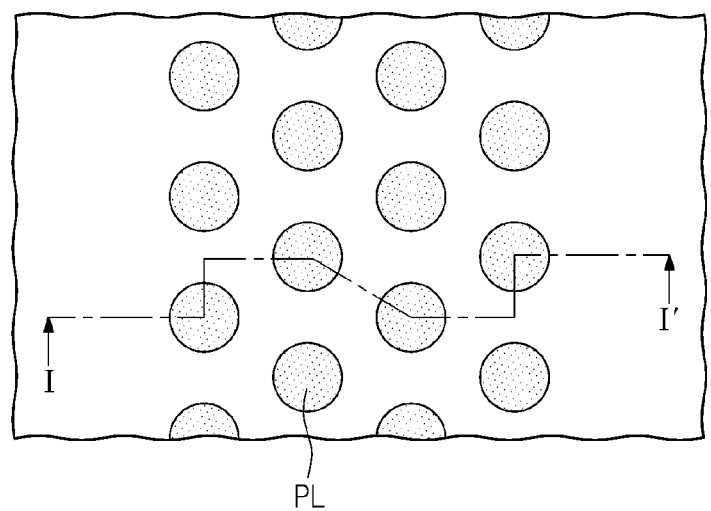
Figure 10B:
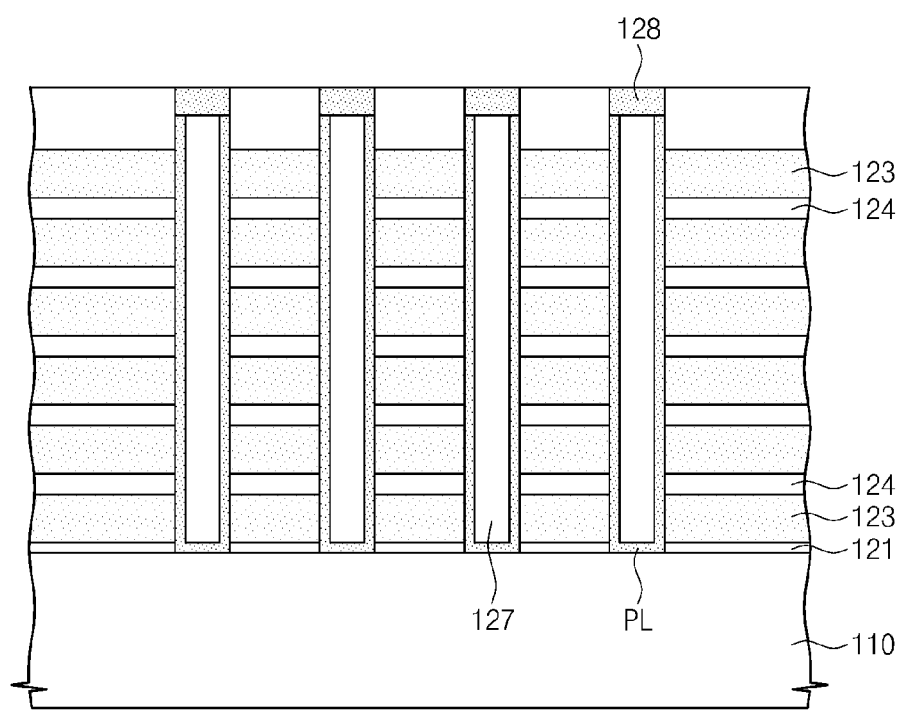

Referring to FIGS. 10A and 10B, cell pillars PL are formed in the cell holes 126, respectively. In an aspect, the cell pillars PL may include a semiconductor layer having the first conductivity type. The semiconductor layer may be formed to partially fill the cell holes 126 and then an insulating material may be formed on the semiconductor layer to completely fill the cell holes 126. The semiconductor layer and the insulating material may be planarized to expose the uppermost insulating layer. Thus, the cell pillars PL may be formed to have hollow cylinder-shapes of which inner regions are filled with filling insulating layers 127. In other embodiments, the semiconductor layer may be formed to completely fill the cell holes 126. In this case, the filling insulating layer is omitted. Upper portions of the cell pillars PL may be recessed to be lower than a top surface of the uppermost insulating layer. Conductive patterns 128 may be formed on the recessed cell pillars PL in the cell holes 126, respectively. The conductive patterns 128 may be formed of a conductive material such as doped poly-silicon or a metal. Dopant ions of a second conductivity type may be injected into the conductive patterns 128 and upper portions of the cell pillars PL to form drain regions. For example, the second conductivity type may be an N-type.

In another aspect, the cell pillars PL may include at least one of conductive materials such as a doped semiconductor material, a metal, a conductive metal nitride, a metal silicide, and a nano-structure (e.g., a carbon nanotube or a graphene).

Figure 11A:
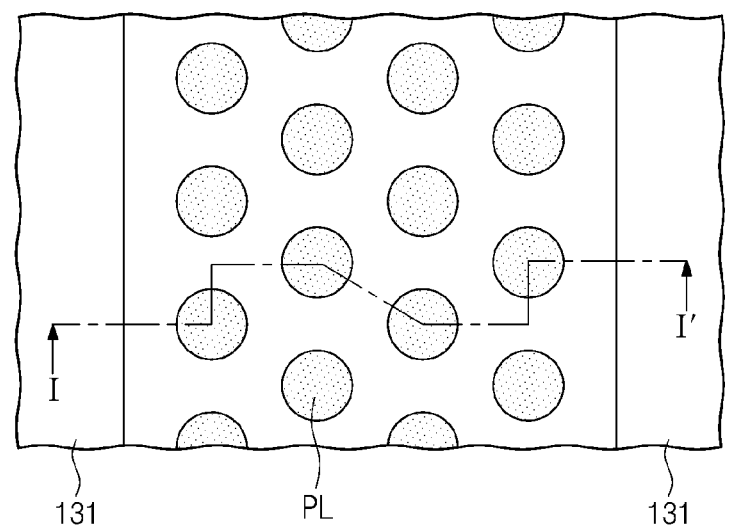
Figure 11B:
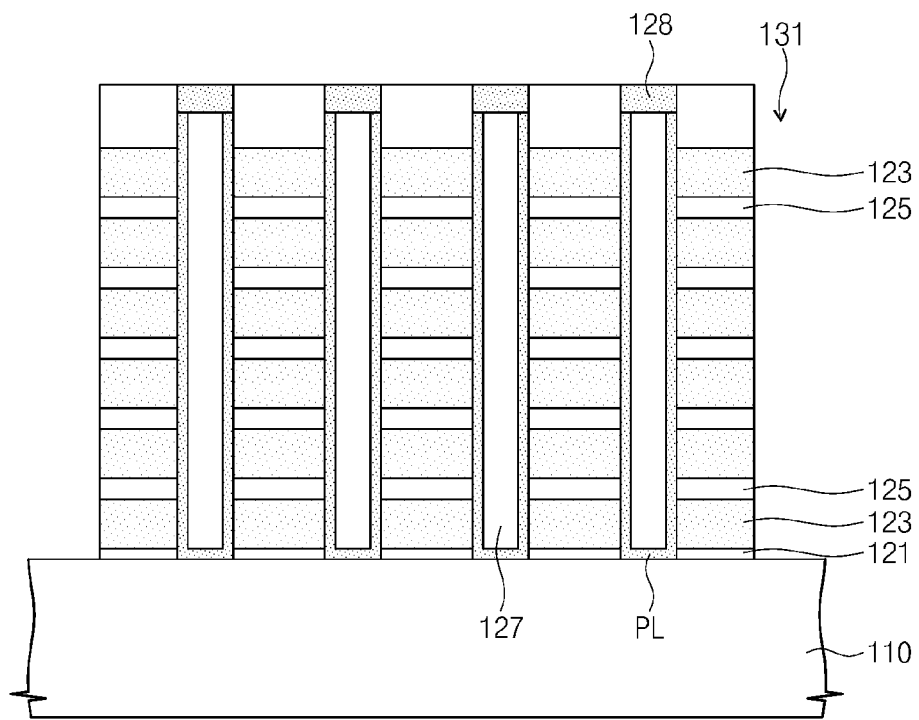

Referring to FIGS. 11A and 11B, the insulating layers 124, the sacrificial layers 123 and the buffer dielectric layer 121 may be successively patterned to form isolation regions 131 spaced apart from each other. The isolation regions 131 may extend in a first direction and may expose the substrate 110. The patterned insulating layers 124 correspond to insulating patterns 125.

Figure 12A:
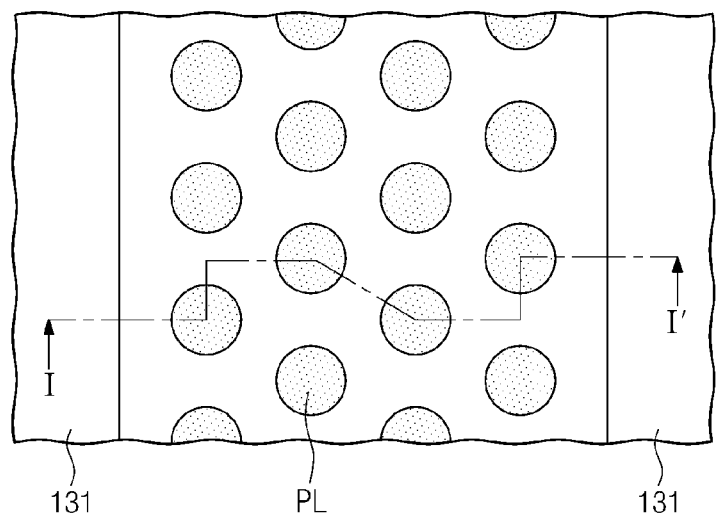
Figure 12B:
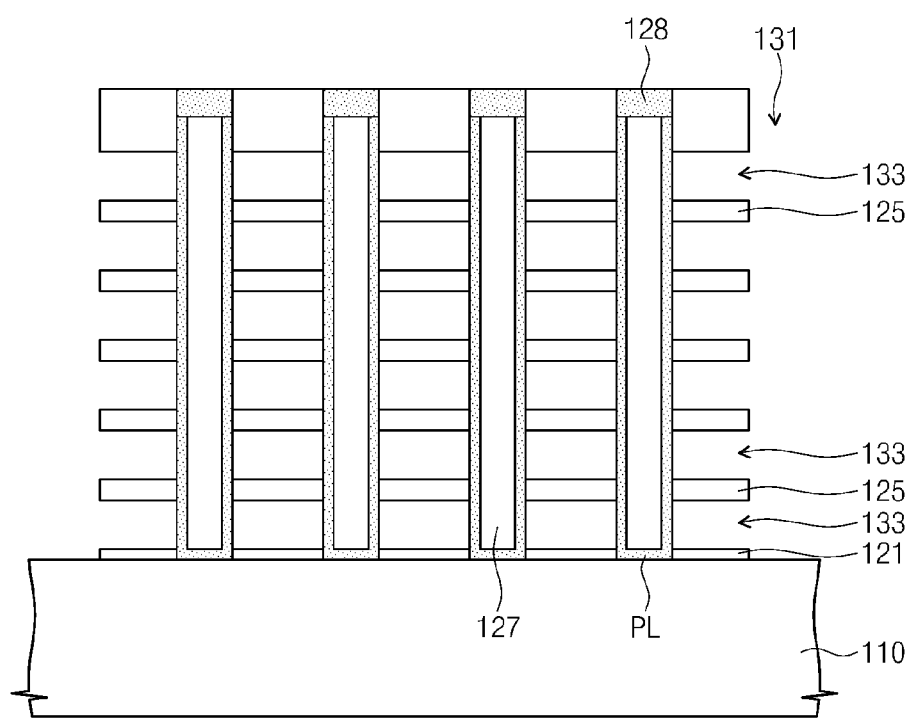

Referring to FIGS. 12A and 12B, the sacrificial layers 123 exposed by the isolation regions 131 may be selectively removed to form recess regions 133. The recess regions 133 correspond to regions where the sacrificial layers 123 are removed. The recess regions 133 are defined by the cell pillars PL and the insulating patterns 125. If the sacrificial layers 123 include silicon nitride layers or silicon oxynitride layers, the removal process of the sacrificial layers 123 may be performed using an etching solution including phosphoric acid. Sidewalls of the cell pillars PL are partially exposed by the recess regions 133.

Figure 13A:
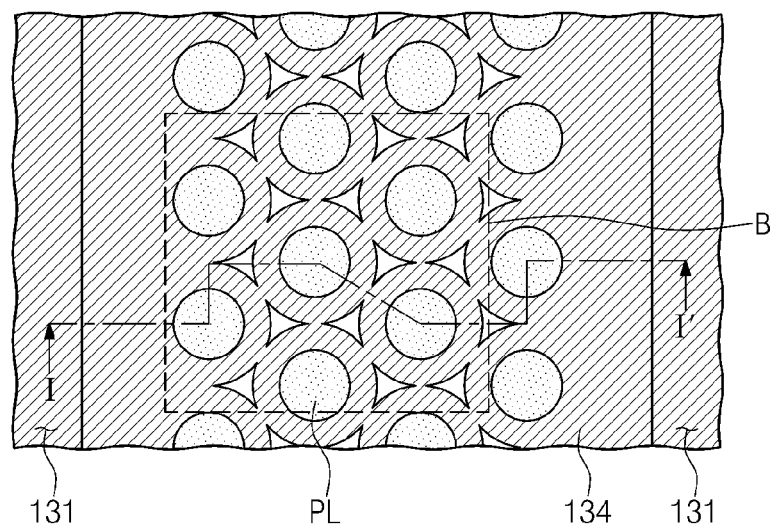
Figure 13B:
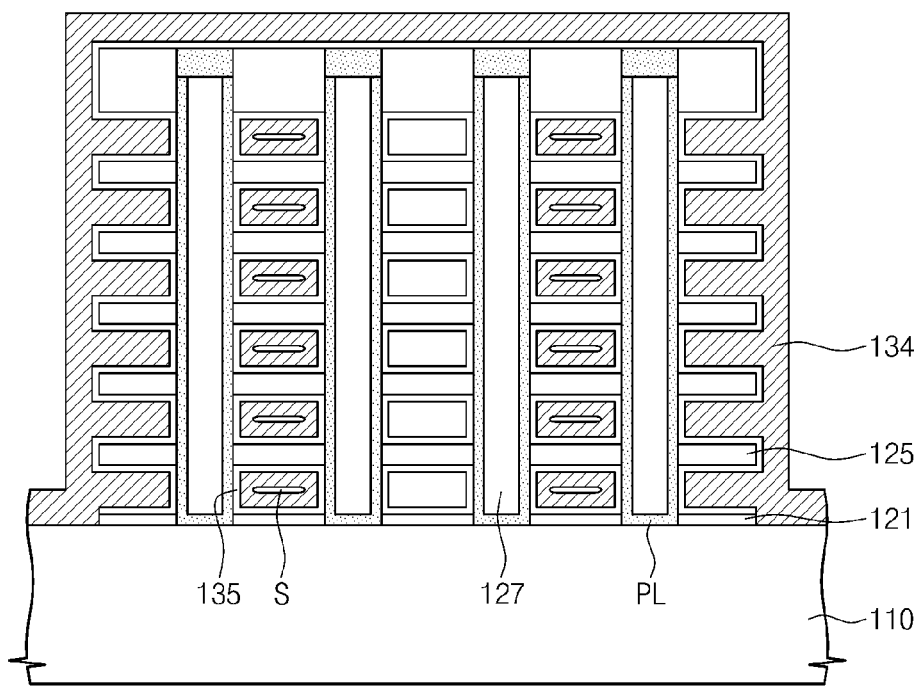

Referring to FIGS. 13A and 13B, a data storage element 135 is formed in each of the recess regions 133.

In an aspect, the data storage element 135 may include a tunnel insulating layer contacting the cell pillar PL, a charge storage layer on the tunnel insulating layer, and a blocking insulating layer on the charge storage layer. (See FIG. 5A). In this case, the cell pillars PL may be semiconductor pillars. The tunnel insulating layer may include a silicon oxide layer. The cell pillar PL exposed by the recess region 133 may be thermally oxidized to form the tunnel insulating layer. Alternatively, the tunnel insulating layer may be formed by an atomic layer deposition (ALD) process. The charge storage layer may be a charge trap layer or an insulating layer including conductive nano particles. The charge trap layer may include, for example, a silicon nitride layer. The blocking insulating layer may include a high-k dielectric layer (e.g., an aluminum oxide layer or a hafnium oxide layer). The blocking insulating layer may be a multi-layer consisting of a plurality of thin films. For example, the blocking insulating layer may include an aluminum oxide layer and/or a hafnium oxide layer, and a stack order of the aluminum oxide layer and the hafnium oxide layer may be various. Each of the charge storage layer and the blocking insulating layer may be formed by an atomic layer deposition (ALD) method and/or a chemical vapor deposition (CVD) method having an excellent step coverage property. Alternatively, if the data storage element 135 has one of the structures of FIGS. 5B to 5D, at least one of the tunnel insulating layer, the charge storage layer and the blocking insulating layer included in the data storage element 135 may be formed in the cell holes 126 before the cell pillars PL are formed.

In another aspect, the data storage element 135 may be a variable resistance pattern. (See FIGS. 6A to 6C) The variable resistance pattern may include at least one of materials having a resistance selectively changed by passing a current through it. In other words, the variable resistance pattern may include a material having a variable resistance property. In this case, the cell pillars PL may be conductive pillars including at least one conductive material such as a doped semiconductor, a metal, a conductive metal nitride, a metal silicide, and a nano structure (e.g., a carbon nanotube or a graphene). If the data storage element 135 includes the structure of FIG. 6B, the data storage element 135 may be formed in the cell holes 126 before the cell pillars PL are formed.

A conductive layer 134 is formed on the data storage element 135 in the recess regions 133. The conductive layer 134 may be formed from materials such as a doped poly-silicon layer, a metal layer (e.g., a tungsten layer), a metal nitride layer, and a metal silicide layer. The conductive layer 134 may be formed by a CVD method or an ALD method. If the conductive layer 134 is the metal silicide layer, forming the conductive layer 134 may include forming a poly-silicon layer, removing a portion of the poly-silicon layer adjacent to the isolation region 131 to recess the poly-silicon layer, forming a metal layer on the recessed poly-silicon layer, thermally treating the metal layer, and removing an unreacted metal layer. The metal layer for the metal silicide layer may include tungsten, titanium, cobalt, or nickel.

Figure 15A:
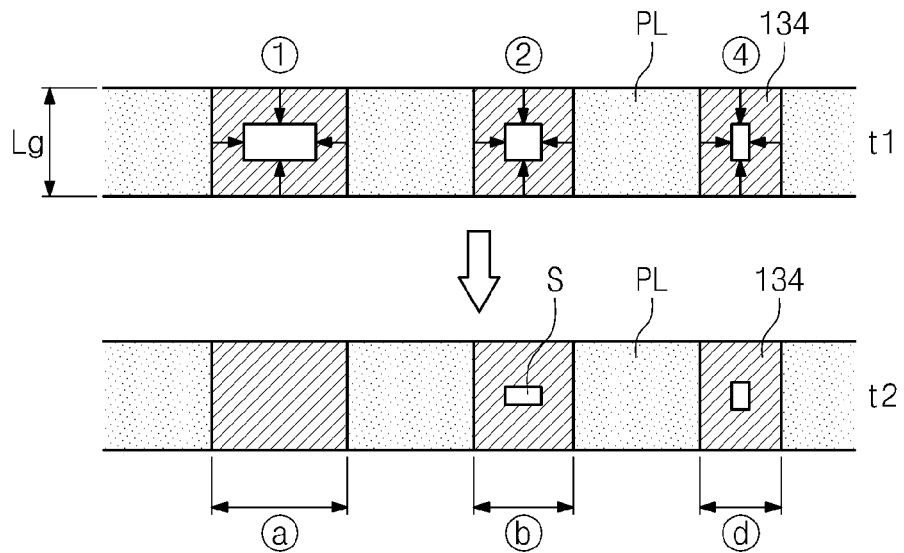
FIG. 15A is a diagram corresponding to a cross-sectional view of FIG. 14 according to a general technique.
Figure 15B:
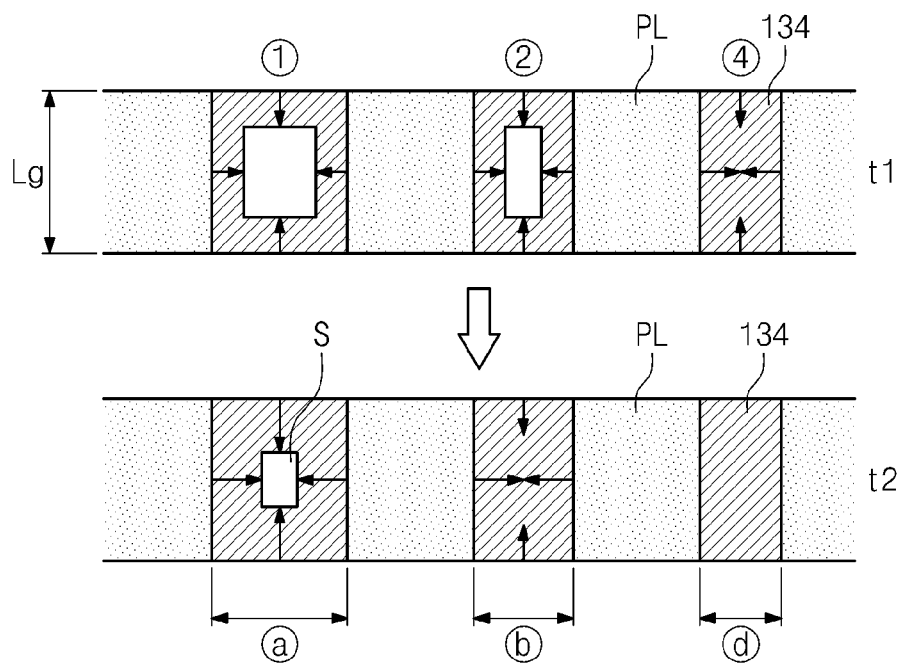
FIG. 15B is a diagram corresponding to a cross-sectional view of FIG. 14 according to aspects of the invention.

FIG. 14 is an enlarged view of a portion 'B' of 13A to illustrate filling of a conductive layer for horizontal electrodes. FIG. 15A is a diagram corresponding to a cross-sectional view of FIG. 14 according to a general technique. FIG. 15B is a diagram corresponding to a cross-sectional view of FIG. 14 according to aspects of the inventions. Spaces ①, ② and ④ correspond to the relative locations shown for ⓐ, ⓑ and ⓓ in FIG. 7A, respectively.

Referring to FIG. 14, the process of filling the recess regions 133 with the conductive layer 134 will be described in more detail. The conductive layer 134 is provided from the isolation region 131 into the recess regions 133.

Referring to FIG. 14 and FIG. 15A, in a general technique, a height Lg of a recess region 133 (i.e., a thickness of each horizontal electrode) is less than a distance ⓐ between the cell pillars PL that are nearest to the isolation region 131 and are adjacent to each other. Thus, as time passes (t1→t2), the space ① between the cell pillars nearest to the isolation region 131 is filled or plugged with the conductive layer 134 before the space ④ between the cell pillars far from the isolation region 131 is completely filled with the conductive layer 134. Thus, a great hollow region S is generated within the conductive layer 134. As a distance from the isolation region 131 increases, a horizontal thickness of the conductive layer 134 may be progressively reduced. The hollow regions S may be connected to each other to extend in one direction (e.g., the first direction D1).

In this case, various problems may be caused. Firstly, resistances of the horizontal electrodes may be increased. In particular, resistances of the horizontal electrode formed adjacently to the second cell pillars PL2 far from the isolation regions 131 may be very great. Thus, a voltage or current applied to the data storage element adjacent to the second cell pillars PL2 may be less than that adjacent to the first cell pillars PL1. Secondly, the insulating patterns 125, the data storage element 135 and/or the cell pillars PL may be damaged during a subsequent process by chemicals permeating into or confined in the hollow region S. Thus, an electrical insulation characteristic between the horizontal electrodes and/or between the horizontal electrode and the cell pillar may deteriorate. Data storing characteristics of the data storage element 135 may be negatively affected.

Referring to FIG. 15B, according to embodiments of the inventions, a height Lg of the recess region 133 (i.e., a thickness of each horizontal electrode) is greater than the distances ⓐ, ⓑ, ⓒ and ⓓ between the cell pillars PL. Thus, at an initial time t1, the space ④ between the cell pillars far from the isolation region 131 is completely filled with the conductive layer 134 but the spaces ①, ② and ③ between the cell pillars PL near to the isolation region 131 are not completely filled with the conductive layer 134. As time passes (t1→t2), the spaces between the cell pillars PL near to the isolation region 131 are sequentially filled with the conductive layer 134. In other words, the conductive layer 134 fills the spaces ④, ③, ② and ① in the order named. Thus, the hollow region S within the conductive layer 134 may not be generated or a size of the hollow region S may be reduced or minimized.

In addition, since the cell pillars PL are arranged as described with reference to FIG. 7A, the conductive layer 134 may be easily provided into the recess regions 133 between the cell pillars PL. Thus, the size of the hollow region S may be more reduced or the hollow region S may be removed.

Figure 16A:
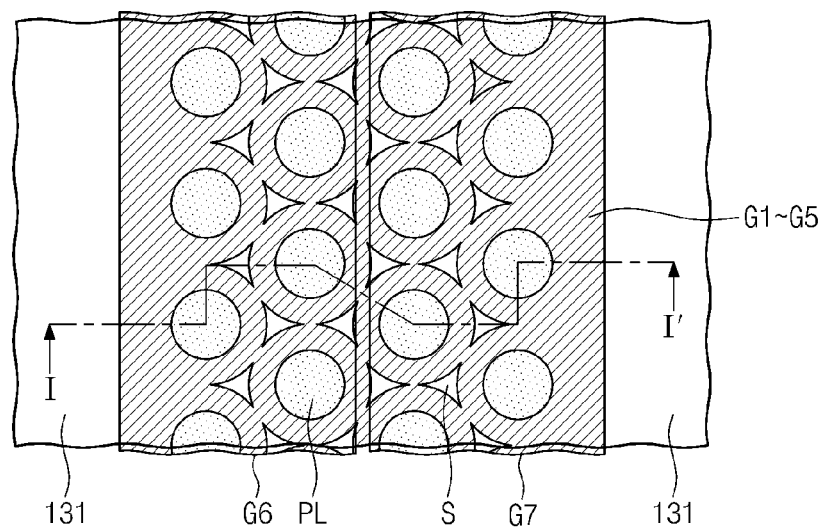
Figure 16B:
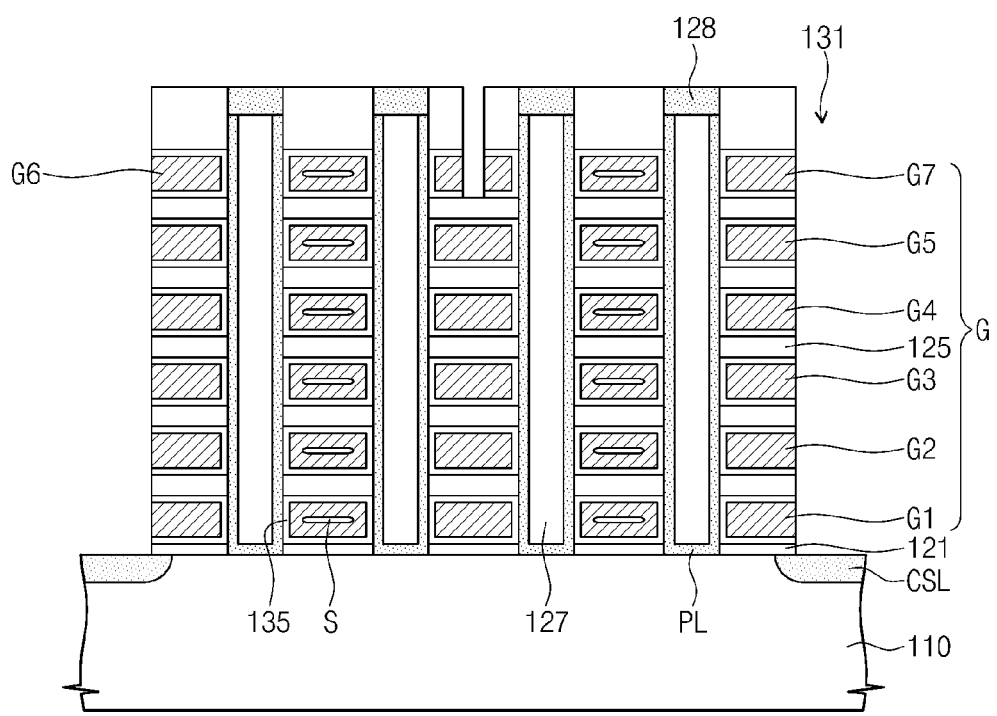

Referring to FIGS. 16A and 16B, the conductive layer 134 formed outside of the recess regions 133 is removed. Thus, horizontal electrodes G1 to G7 are formed in the recess regions 133. As described with reference to FIG. 7A, the uppermost horizontal electrode is divided into a sixth horizontal electrode G6 and a seventh horizontal electrode G7. The sixth and seventh horizontal electrodes G6 and G7 extend in the first direction.

The conductive layer in the isolation regions 131 is removed to expose the substrate 110. Dopant ions of a second conductivity type may be heavily provided into the exposed substrate 110, thereby forming common source lines CSL.

Referring again to FIGS. 7B and 7C, a first isolation insulating layer 136 is formed to fill the isolation regions 131. The cell pillars PL arranged in the second direction may be connected in common to one upper interconnection BL1 or BL2.

The conductivity, electrical insulation characteristic and/or data storing characteristic of the horizontal electrodes may be improved by controlling of the arrangement of the cell pillars PL and the thickness of the horizontal electrodes G1 to G7 according to aspects of the inventions.

Figure 17:
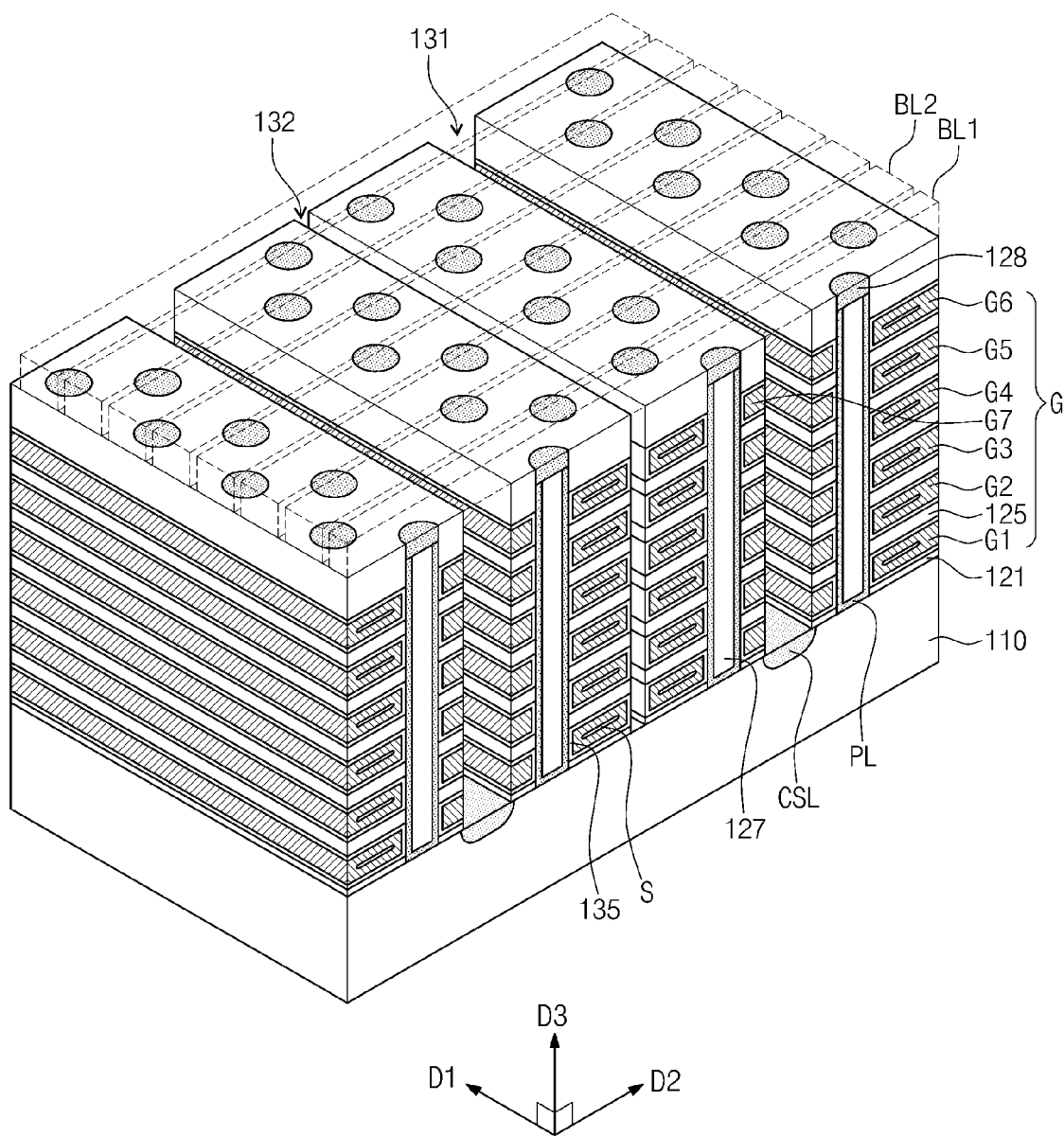
FIG. 17 is a perspective view illustrating another embodiment of a memory block of a semiconductor device according to aspects of the inventions.
Figure 18A:
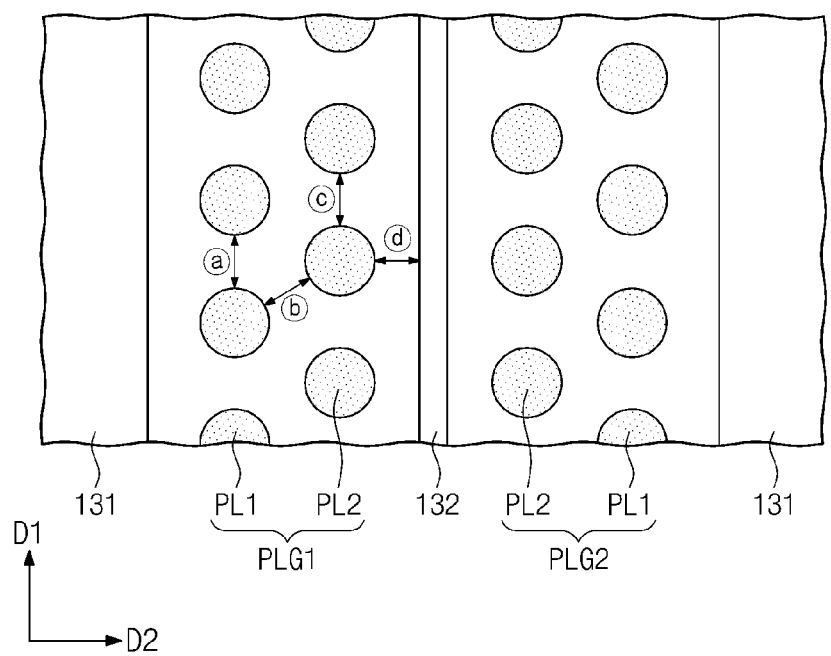
FIG. 18A is a plan view illustrating arrangement of cell pillars of the memory block of FIG. 17.
Figure 18B:
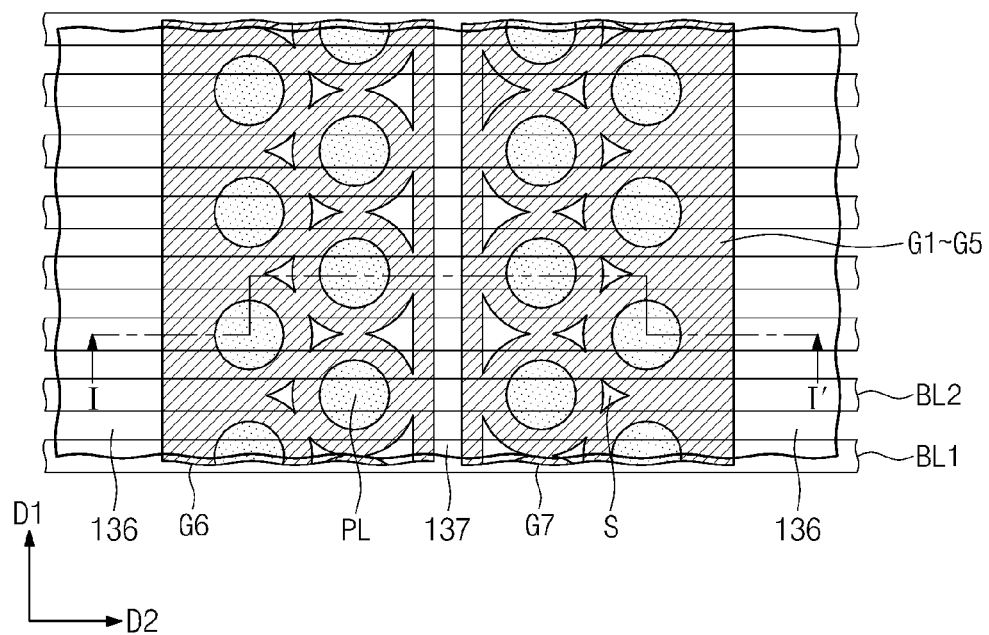
FIG. 18B is a plan view illustrating shapes of horizontal electrodes of the memory block of FIG. 17.
Figure 18C:
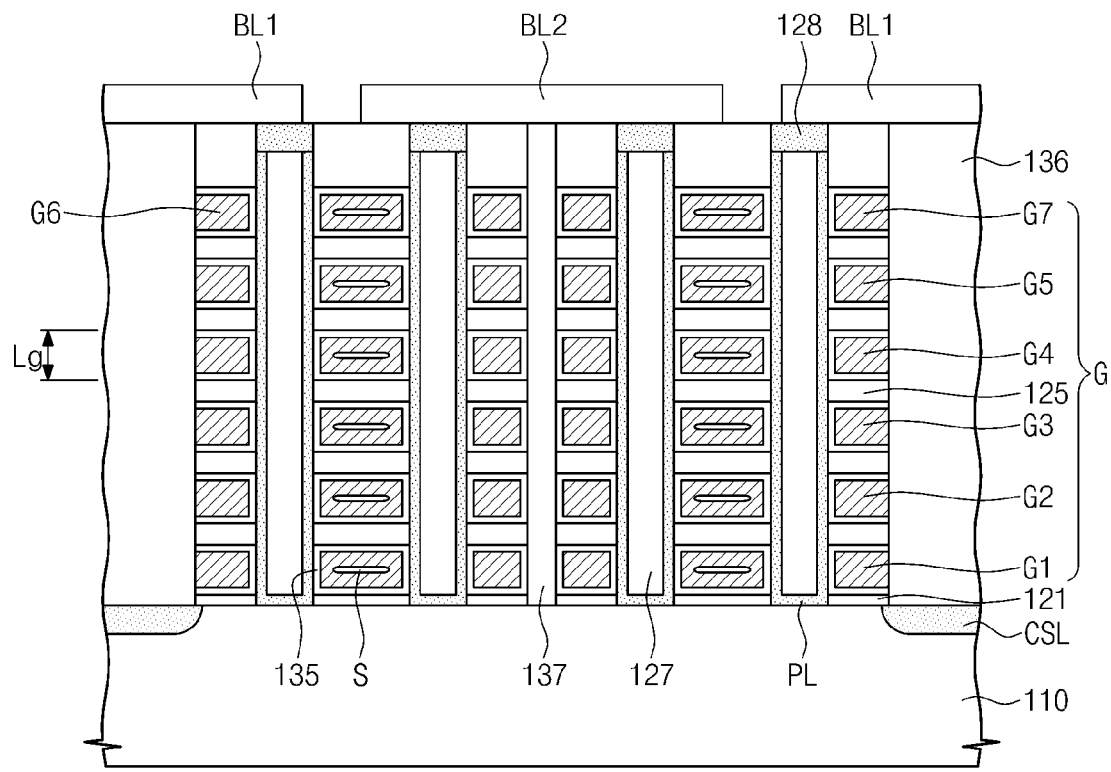
FIG. 18C is a cross-sectional view taken along a line I-I' of FIG. 18B.
Figure 19A:
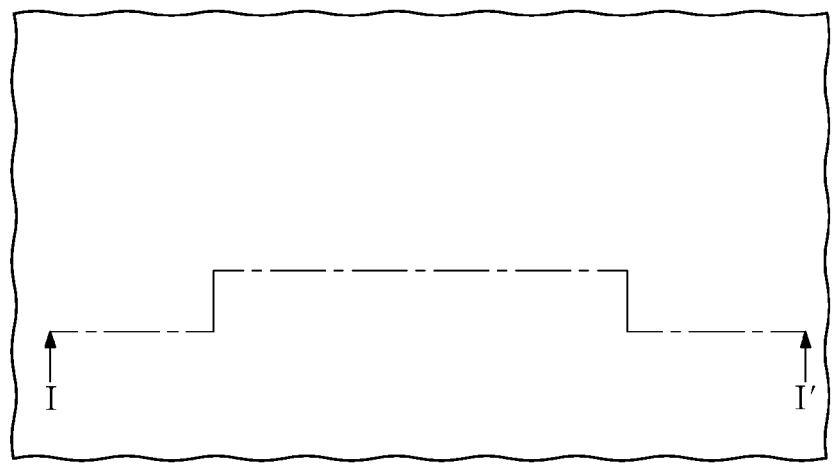
Figure 19B:
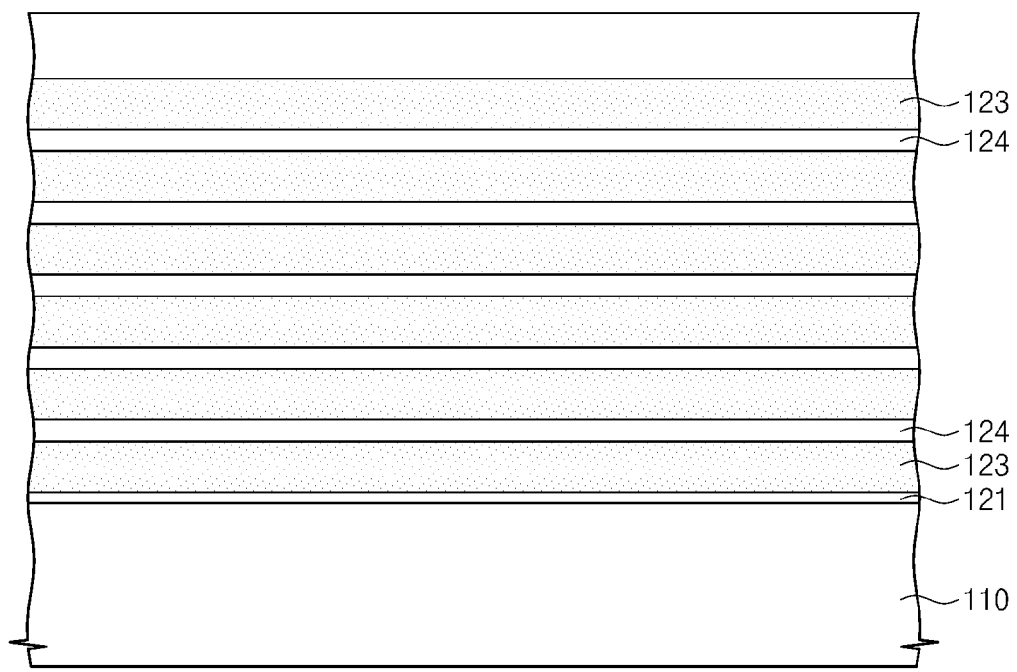
Figure 20A:
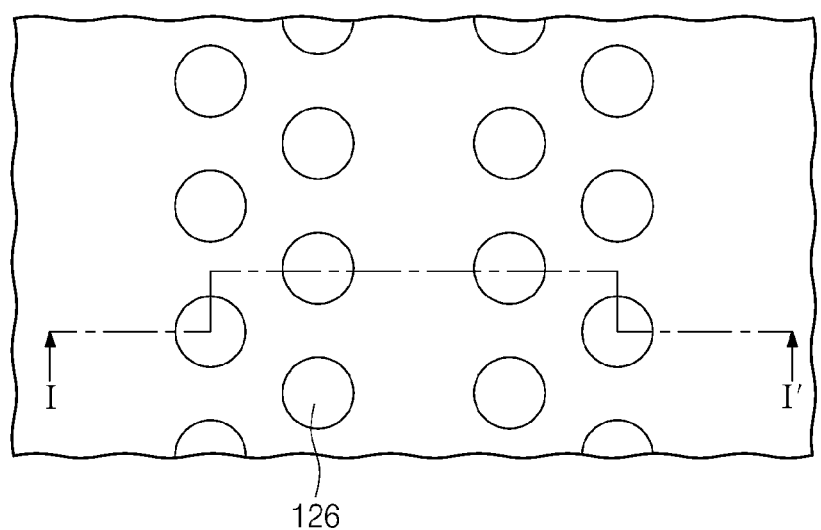
Figure 20B:
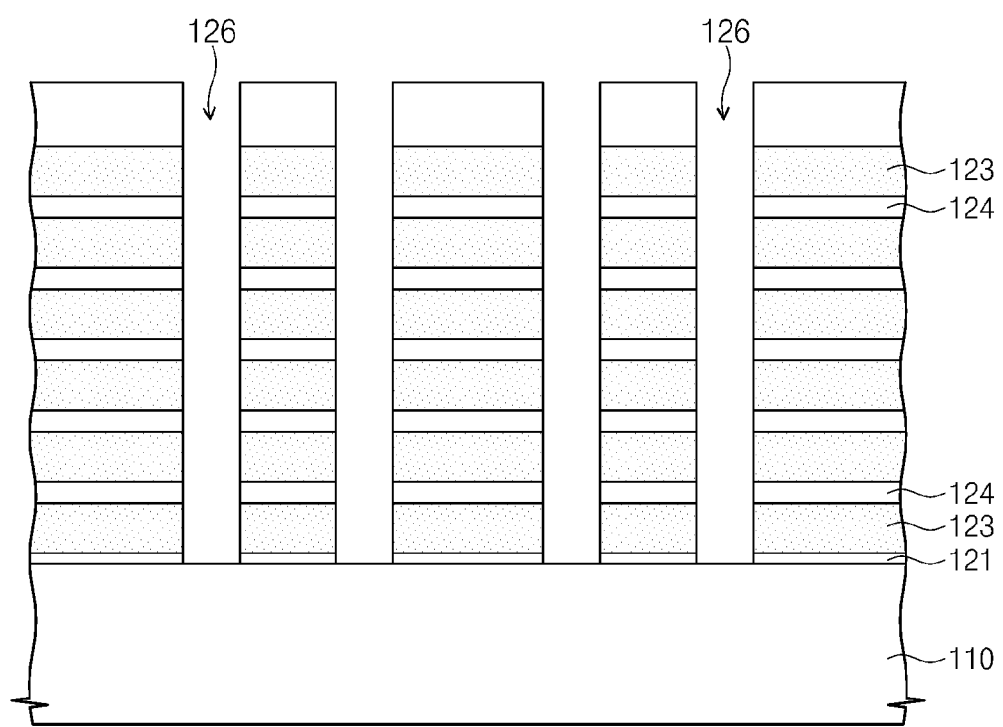
Figure 21A:
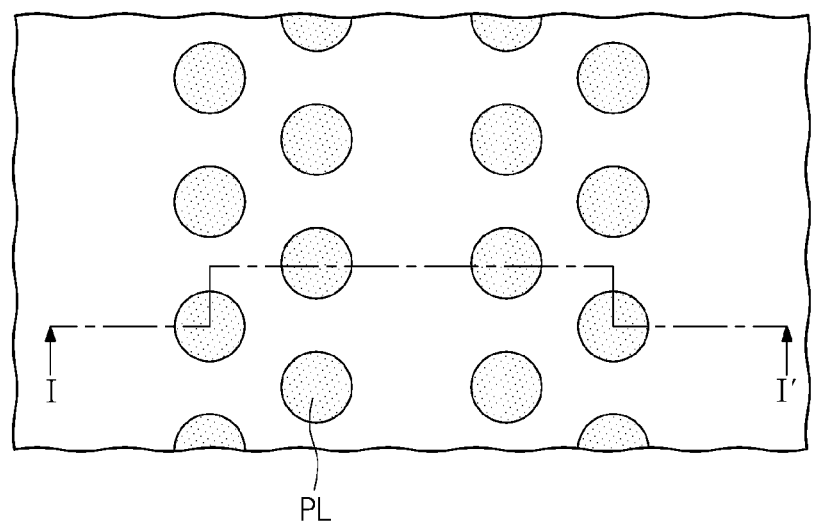
Figure 21B:
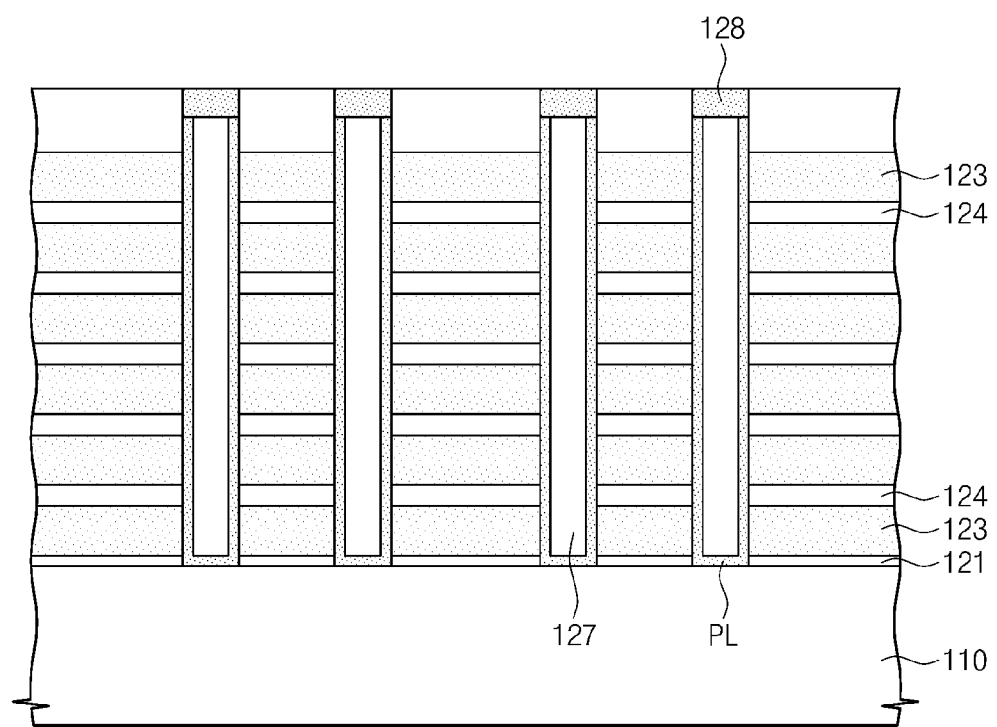

FIG. 17 is a perspective view illustrating another embodiment of a memory block of a semiconductor device according to the inventions. FIG. 18A is a plan view illustrating arrangement of cell pillars of a memory block of FIG. 17. FIG. 18B is a plan view illustrating shapes of horizontal electrodes of a memory block of FIG. 17. FIG. 18C is a cross-sectional view taken along a line I-I' of FIG. 18B. In FIG. 18, the data storage element 135 is not illustrated for the purpose of simplicity in the drawing.

In the present embodiment, the descriptions to the same technical features as described with reference to FIGS. 3 and 7A to 7C will be omitted or mentioned briefly. Differences between the present embodiment and the embodiment of FIGS. 3 and 7A to 7C will be mainly described.

Referring to FIGS. 17, 18A, 18B, and 18C, one group of cell pillars (e.g., PLG1) and another group (e.g., PLG2) adjacent thereto may include mirror-symmetrically arranged cell pillars. Alternatively, the groups PLG1 and PLG2 adjacent to each other may have cell pillars arranged in the same form (See FIG. 7A).

Upper interconnections may include a first upper interconnection BL1 and a second upper interconnection BL2. First cell pillars PL1 and second cell pillars PL2 in one group may be connected to different upper interconnections from each other. The first cell pillar PL 1 of the first group PLG1 and the first cell pillar PL1 of the second group PLG2 may be connected to the first upper interconnection BL1. The second cell pillar PL2 of the first group PLG1 and the second cell pillar PL2 of the second group PLG2 may be connected to the second upper interconnection BL2. The first upper interconnection BL1 is directly adjacent to the second upper interconnection BL2.

Each of the gate structures G may be divided into sub-gate structures separated from each other in the second direction D2. The trench 132 may penetrate the gate structure G to expose the substrate 110 and may extend in the first direction D1. The trench 132 may be provided between the cell pillars PL in the center portion of the gate structure. The trench 132 may be provided between the uppermost horizontal electrodes G6 and G7. A second isolation insulating layer 137 fills the trench 132. The width of the second isolation insulating layer 137 may be less than the width of the first isolation insulating layer 136.

According to aspects of the inventions, the thickness Lg of each of the horizontal electrodes G1 to G7 is greater than the distance ⓐ between the cell pillars (i.e., the first cell pillars PL1) that are nearest to the first isolation insulating layer 136 and are directly adjacent to each other. Additionally, the thickness Lg of each of the horizontal electrodes G1 to G7 may be greater than the minimum value of distances ⓐ, ⓑ and ⓒ between adjacent cell pillars. The distances ⓐ, ⓑ and ⓒ between the cell pillars may be greater than a distance ⓓ between a cell pillar nearest to the second isolation insulating layer 137 and the second isolation insulating layer 137.

A method of manufacturing the semiconductor device of FIG. 17 will now be described with reference to FIGS. 19A to 24A, which are plan views corresponding to FIG. 18B, and FIGS. 19B to 24B, which are cross-sectional views corresponding to FIG. 18C.

Referring to FIGS. 19A to 21A and 19B to 21B, the cell pillars PL may be formed to penetrate the buffer dielectric layer 121, the sacrificial layers 123 and the insulating layer 124 stacked on the substrate 110 by the method described with reference to FIGS. 8A to 10A and 8B to 10B. The cell pillars PL may be arranged as described with reference FIG. 18A.

Figure 22A:
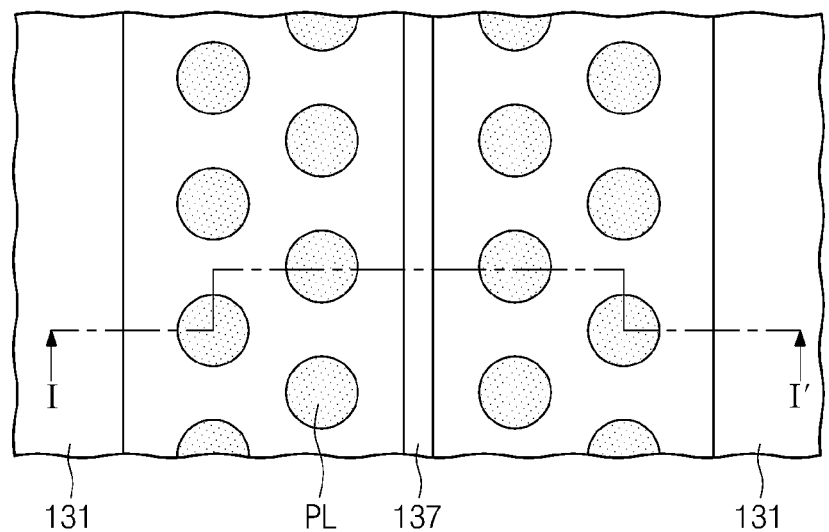
Figure 22B:
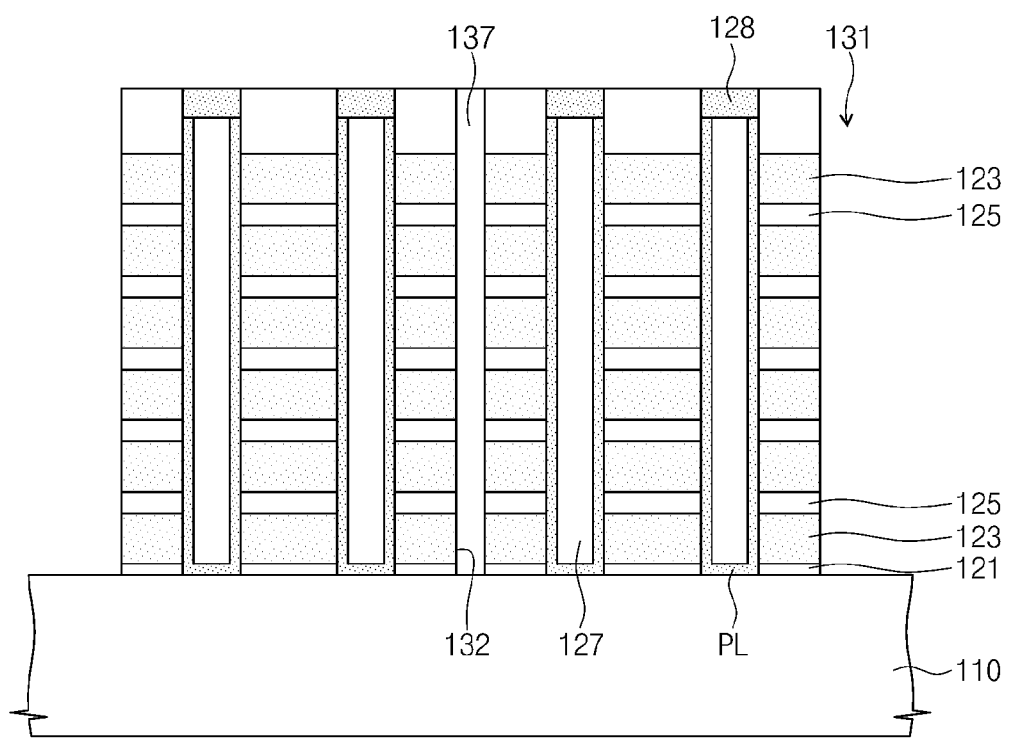

Referring to FIGS. 22A and 22B, the buffer dielectric layer 121, the sacrificial layers 123 and the insulating layers 124 may be patterned to form a trench 132 exposing the substrate 110 and extending in a first direction. A second isolation insulating layer 137 is formed to fill the trench 132. The second isolation insulating layer 137 may, for example, be a silicon oxide layer. Isolation regions 131 are formed. The trench 132 is formed between the isolation regions 131. The patterned insulating layers 124 are insulating patterns 125.

Figure 23A:
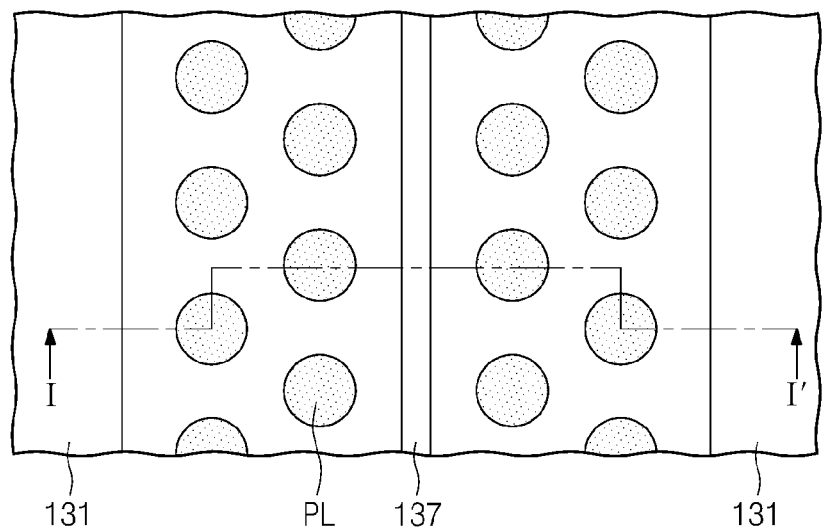
Figure 23B:
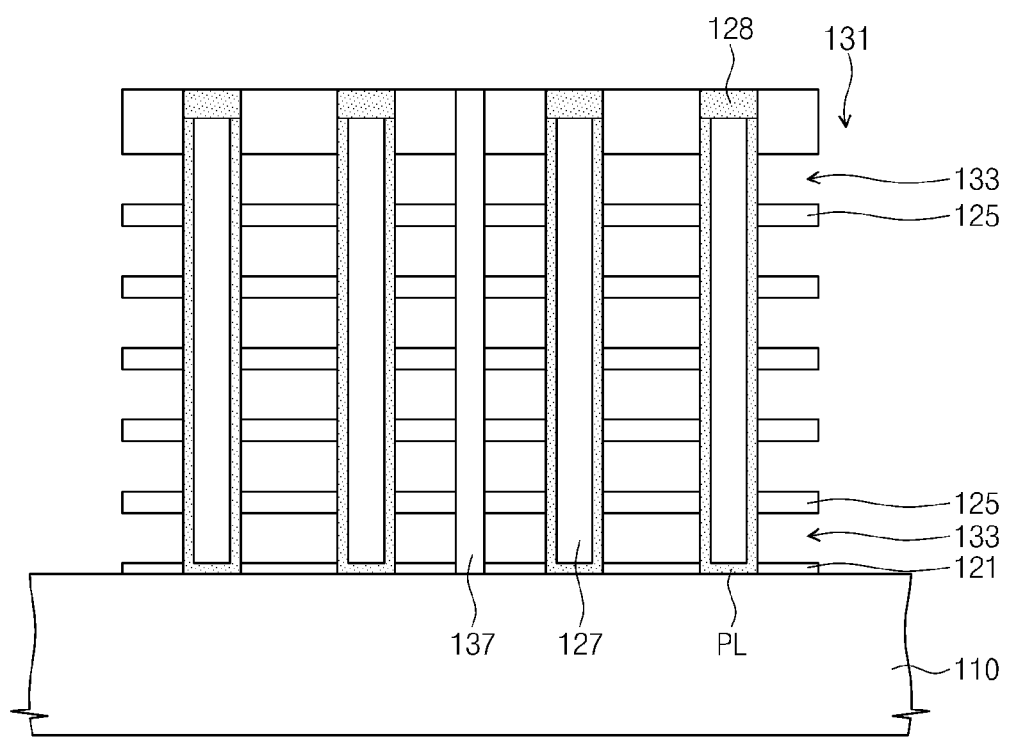

Referring to FIGS. 23A and 23B, the sacrificial layers 123 exposed by the isolation regions 131 are selectively removed to form recess regions 133, as described with reference to FIGS. 12A and 12B.

Figure 24A:
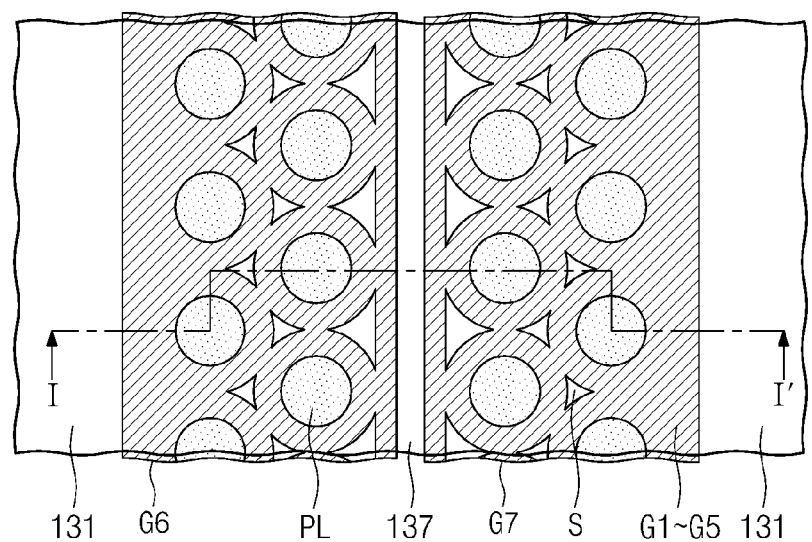
Figure 24B:
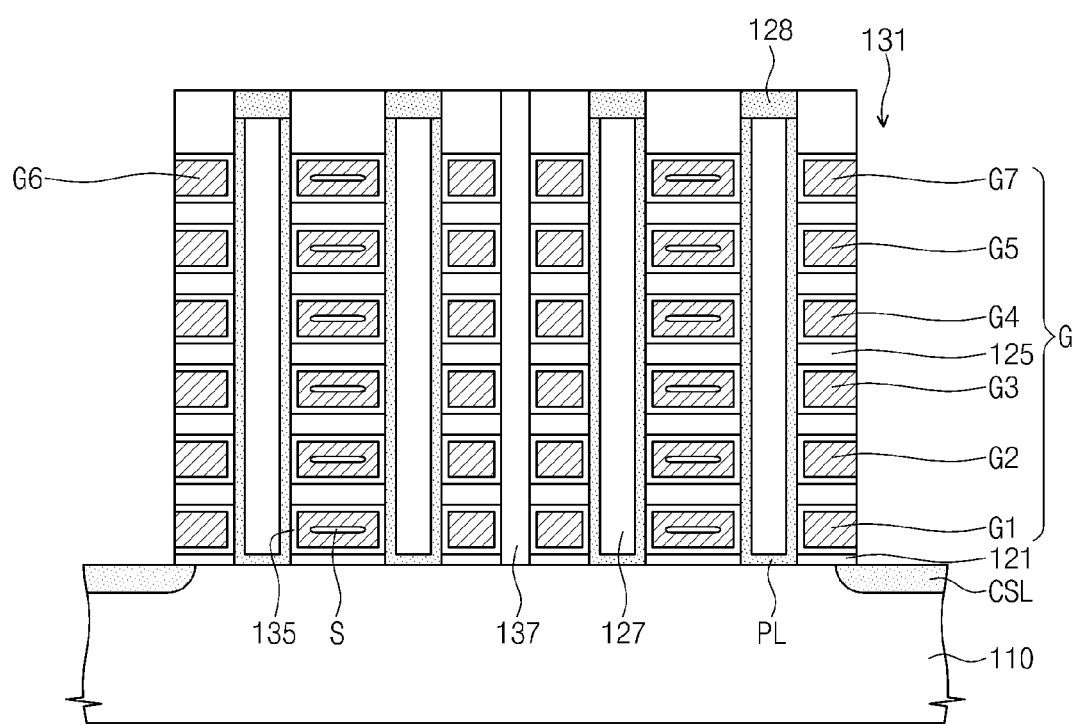

Referring to FIGS. 24A and 24B, horizontal electrodes may be formed by the method described with reference to FIGS. 14, 15A, 15B, 16A and 16B. The second isolation insulating layer 137 may further reduce sizes of hollow regions S within the horizontal electrodes caused by a replacement process, or may result in complete elimination of the hollow regions S.

Dopant ions of the second conductivity type may be heavily provided into the exposed substrate 110 to form common source lines CSL. Referring again to FIGS. 18B and 18C, the first isolation insulating layer 136 may be formed to fill the isolation regions 131. The cell pillars PL arranged in the second direction D2 may be connected in common to one upper interconnection BL1 or BL2.

Figure 25:
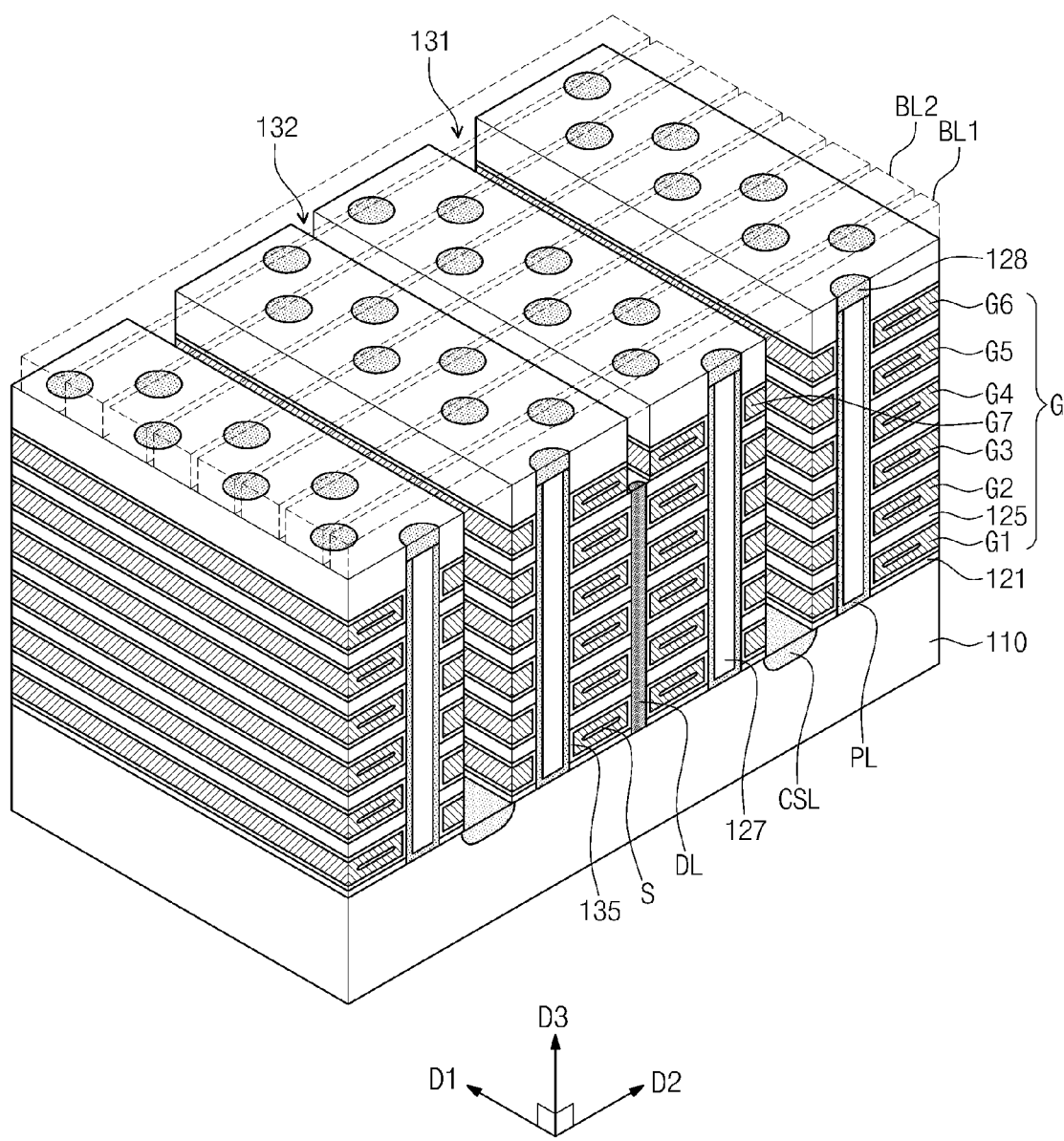
FIG. 25 is a perspective view illustrating still another embodiment of a memory block of a semiconductor device according to aspects of the inventions.
Figure 26A:
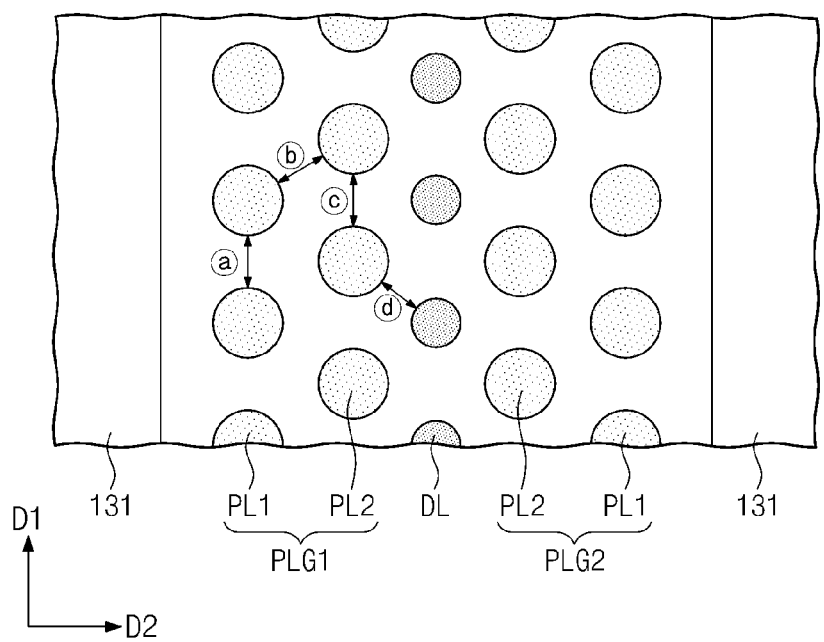
FIG. 26A is a plan view illustrating an example of arrangement of cell pillars of the memory block of FIG. 25.
Figure 26B:
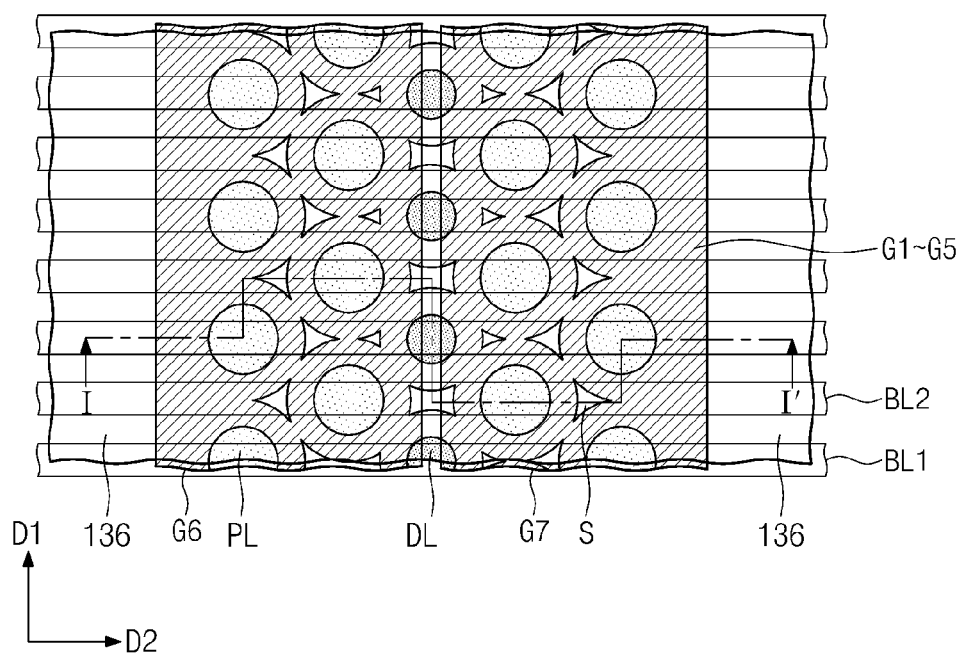
FIG. 26B is a plan view illustrating shapes of horizontal electrodes of the memory block of FIG. 25.
Figure 26C:
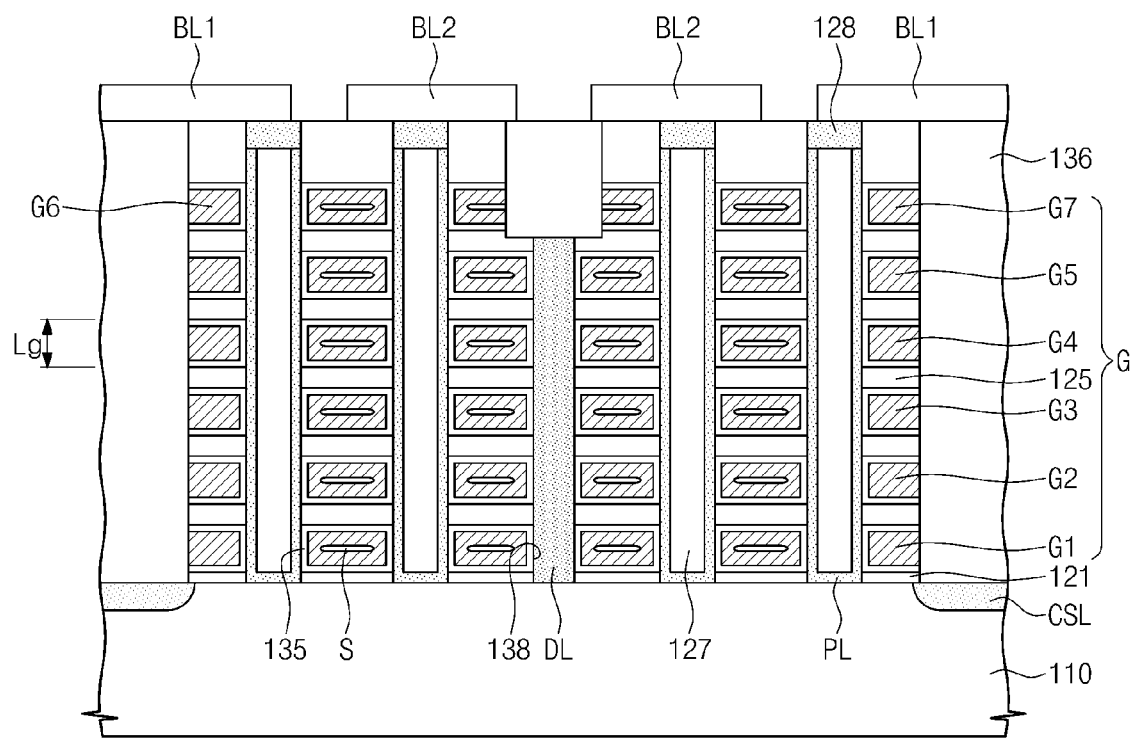
FIG. 26C is a cross-sectional view taken along a line I-I' of FIG. 26B.
Figure 27A:
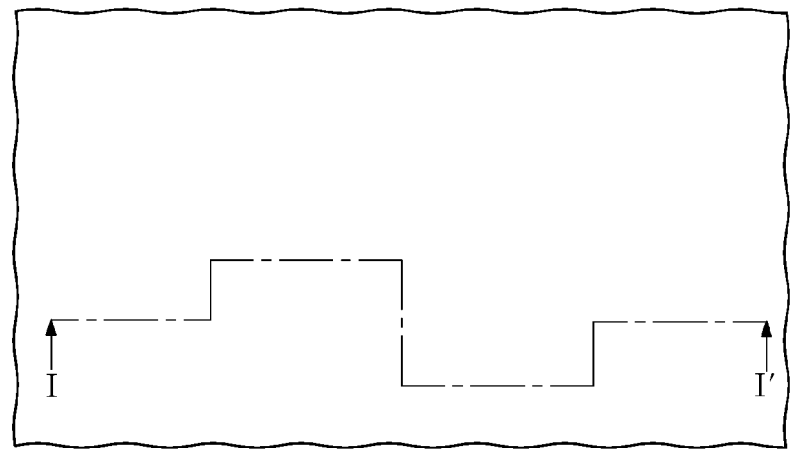
Figure 27B:
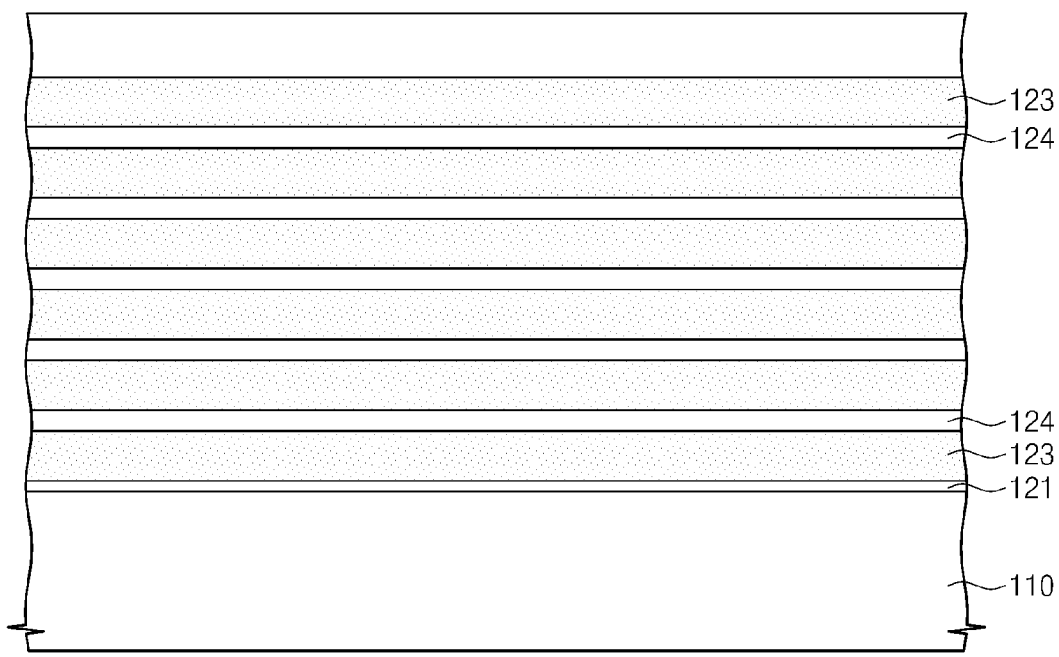
Figure 28A:
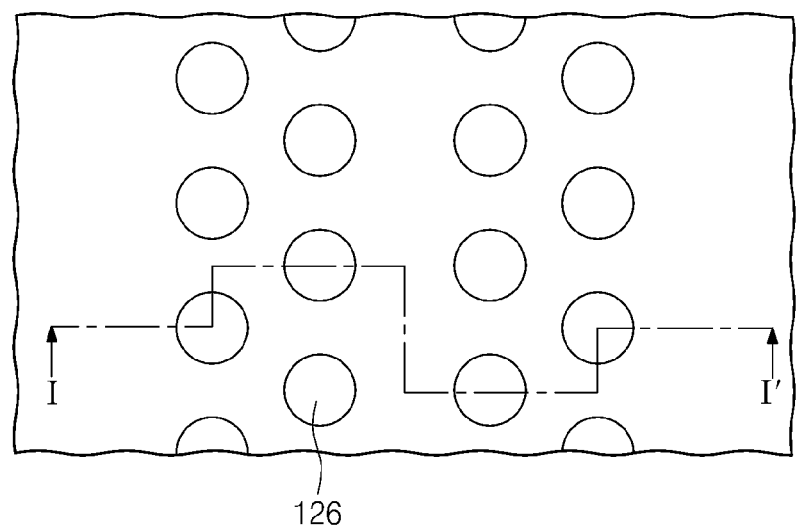
Figure 28B:
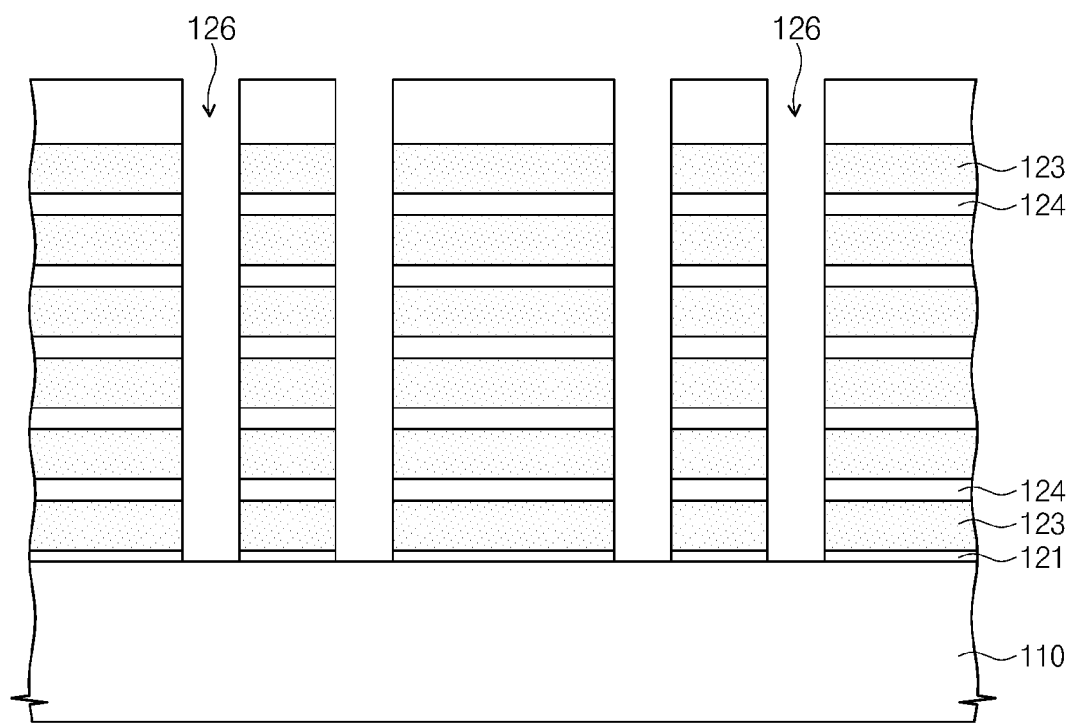
Figure 29A:
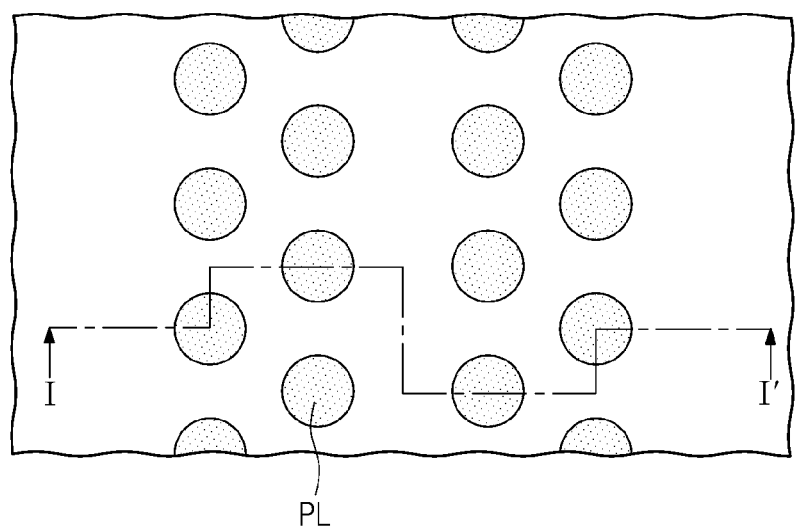
Figure 29B:
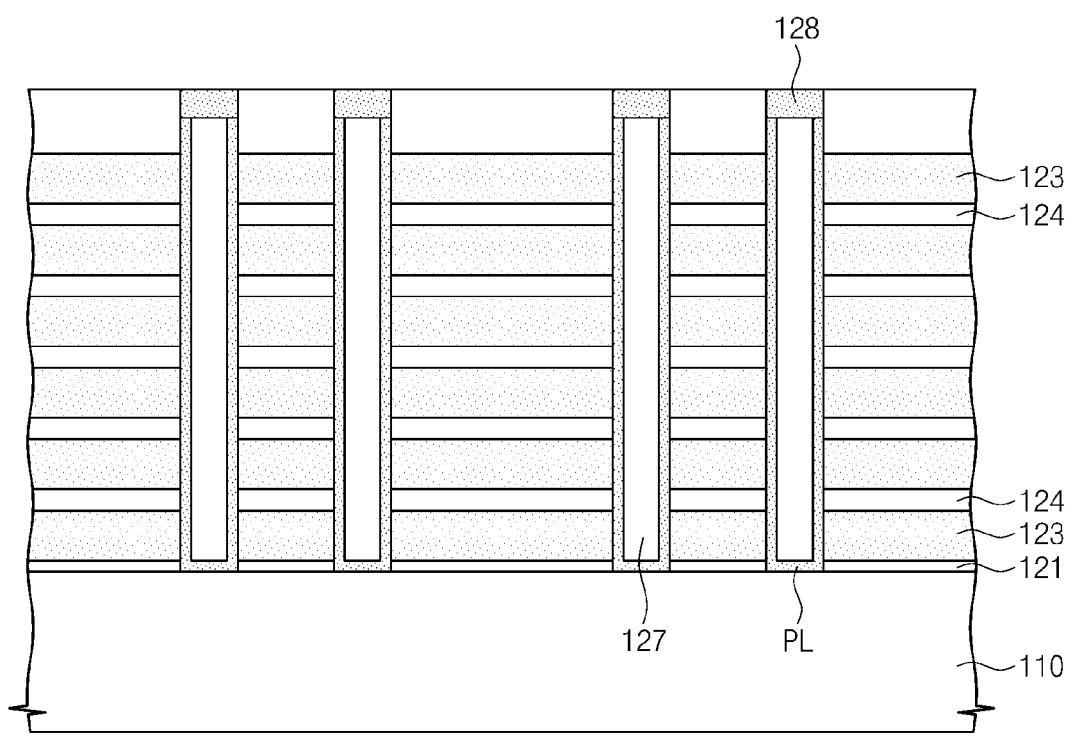

FIG. 25 is a perspective view illustrating still another embodiment of a memory block of a semiconductor device according to aspects of the inventions. FIG. 26A is a plan view illustrating an example of arrangement of cell pillars of a memory block of FIG. 25. FIG. 26B is a plan view illustrating shapes of horizontal electrodes of a memory block of FIG. 25. FIG. 26C is a cross-sectional view taken along a line I-I' of FIG. 26B.

In this embodiment, the descriptions of the same technical features as described with reference to FIGS. 17 and 18A to 18C will be omitted or mentioned briefly. Differences between the present embodiment and the embodiment of FIGS. 17 and 18A to 18C will be mainly described in detail.

Referring to FIGS. 25, 26A, 26B, and 26C, dummy pillars DL are provided in dummy holes 138 that penetrate the gate structure G between the uppermost horizontal electrodes G6 and G7 to expose the substrate 110. The dummy pillars DL are arranged in the first direction D1.

The dummy pillars DL are provided between the cell pillars PL in the center portion of the gate structure G. The dummy pillars DL may be insulating pillars. Top surfaces of the dummy pillars DL may be lower than top surfaces of the cell pillars PL. The dummy pillars DL and cell pillars PL adjacent thereto (e.g., the second cell pillars PL2) may be arranged in zigzag layout or orientation along the first direction D1. A diameter of the dummy pillars DL may be different from a diameter of the cell pillars PL. For example, the diameter of the dummy pillars DL may be equal to or less than the diameter of the cell pillars PL.

According to aspects of the inventions, the thickness Lg of each of the horizontal electrodes G1 to G7 is greater than the distance ⓐ between the cell pillars (i.e., the first cell pillars PL1) that are nearest to the first isolation insulating layer 136 and are directly adjacent to each other. The thickness Lg of each of the horizontal electrodes G1 to G7 may be greater than the minimum value of distances ⓐ, ⓑ, ⓒ and ⓓ between directly adjacent pillars PL and DL. The distances ⓐ, ⓑ and ⓒ between the cell pillars PL may be greater than the distance ⓓ between the dummy pillar DL and a cell pillar nearest thereto. Hollow regions S adjacent to the first cell pillars PL1 may have sizes smaller than those of hollow regions adjacent to the dummy pillars DL or may not exist. The dummy pillars DL may separate the hollow regions S adjacent to the dummy pillars DL in the first and second directions D1 and D2.

A method of manufacturing the semiconductor device of FIG. 25 will now be described with reference to FIGS. 27A to 32A, which are plan views corresponding to FIG. 26B, and FIGS. 27B to 32B, which are cross-sectional views corresponding to FIG. 26C.

Referring to FIGS. 27A to 29A and 27B to 29B, the cell pillars PL may be formed to penetrate the buffer dielectric layer 121, the sacrificial layers 123 and the insulating layer 124 stacked on the substrate 110 by the method described with reference to FIGS. 8A to 10A and 8B to 10B. The cell pillars PL may be arranged as described with reference FIG. 26A.

Figure 30A:
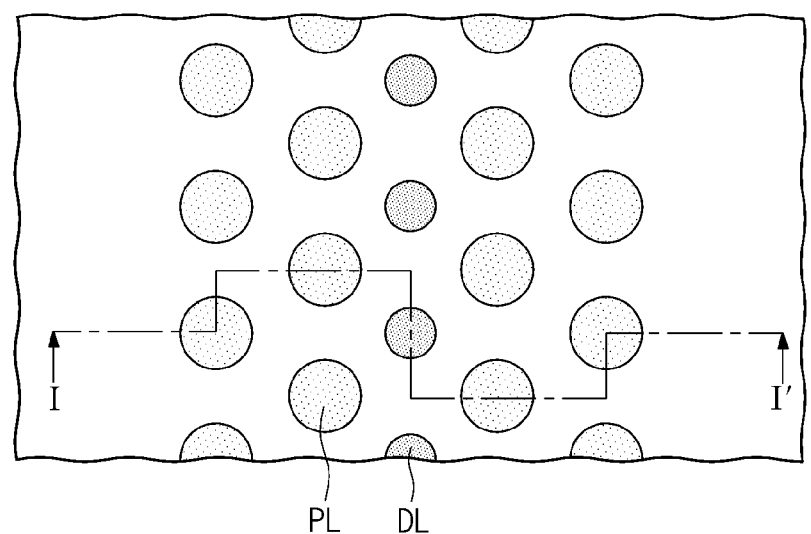
Figure 30B:
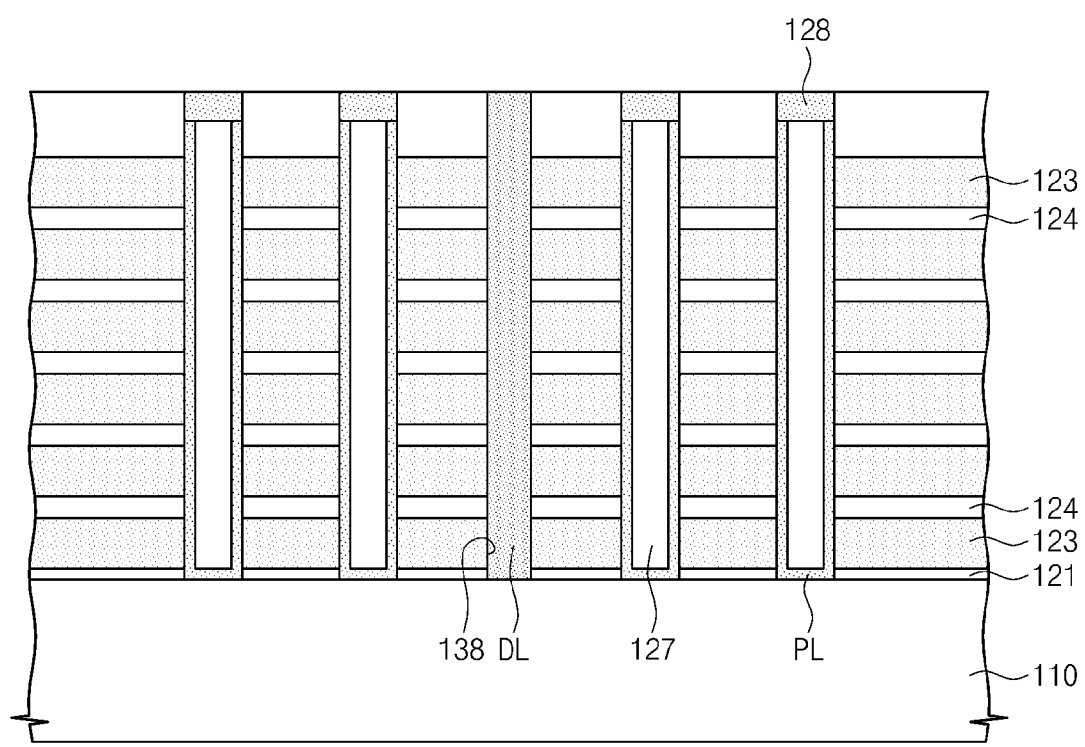
Figure 31A:
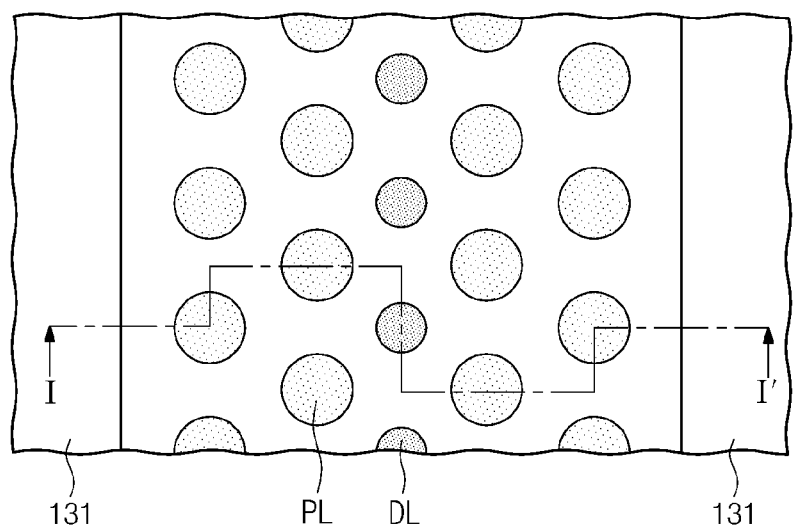
Figure 31B:
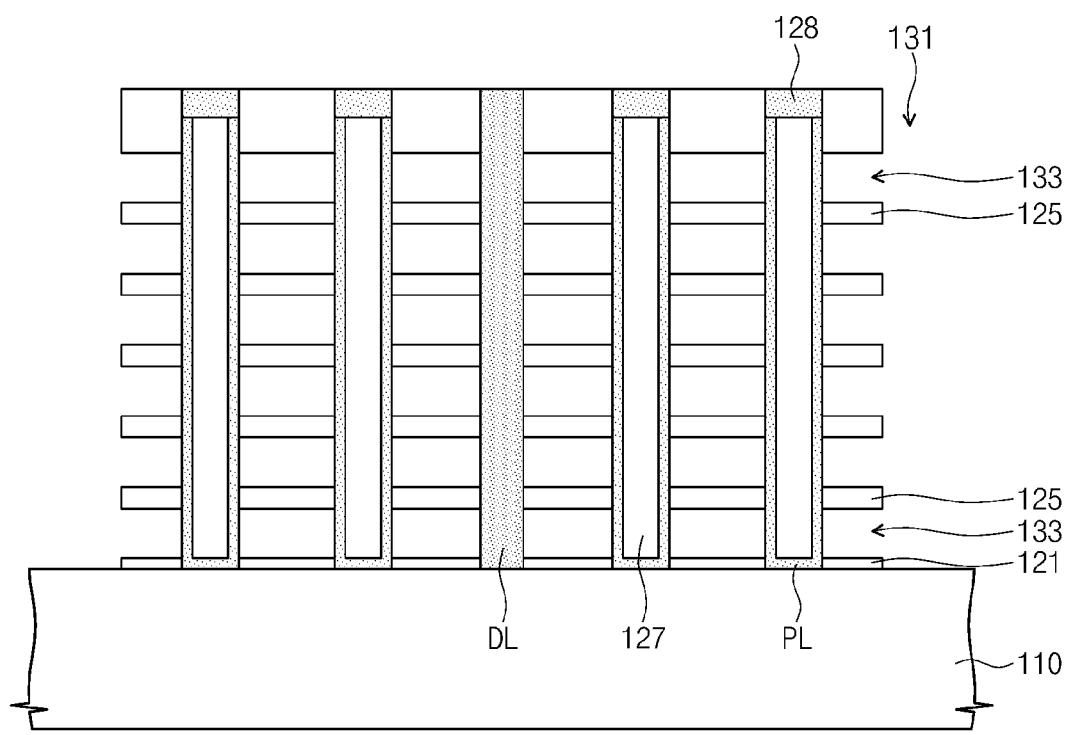

Referring to FIGS. 30A and 30B, dummy holes 138 are formed to penetrate the insulating layers 124, the sacrificial layers 123 and the buffer dielectric layer 121. The dummy holes 138 expose the substrate 110. The dummy holes 138 may be provided between the cell pillars PL disposed in a center portion of a gate structure G formed in a subsequent process. The dummy holes 138 are arranged in the first direction. The dummy holes 138 and the cell pillars PL directly adjacent thereto (e.g., second cell pillars PL2) may be arranged in zigzag form along the first direction. A diameter of the dummy holes 138 may be less than a diameter of the cell pillars PL.

Dummy pillars DL are formed in the dummy holes 138, respectively. The dummy pillars DL may be formed of an insulating material (e.g., silicon oxide).

Referring to FIGS. 31A, 32A, 31B, and 32B, horizontal electrodes (G1 to G7) may be formed by the method described with reference to FIGS. 14, 15A, 15B, 16A, and 16B. The dummy pillars DL may more reduce sizes of hollow regions S within the horizontal electrodes caused by the replacement process or may completely eliminate any hollow regions S. In particular, since the dummy pillars DL are formed between the cell pillars PL farthest from the isolation regions 131, sizes of hollow regions S between the cell pillars PL farthest from the isolation regions 131 may be effectively reduced, or the hollows regions S may be eliminated.

Figure 32A:
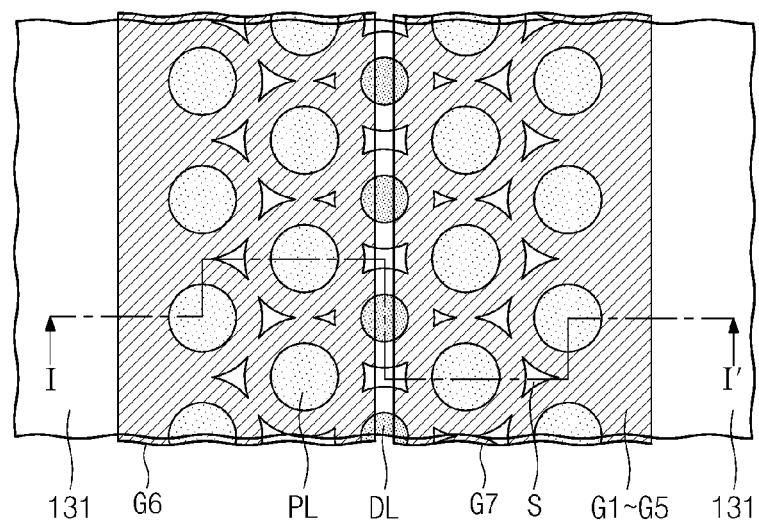
Figure 32B:
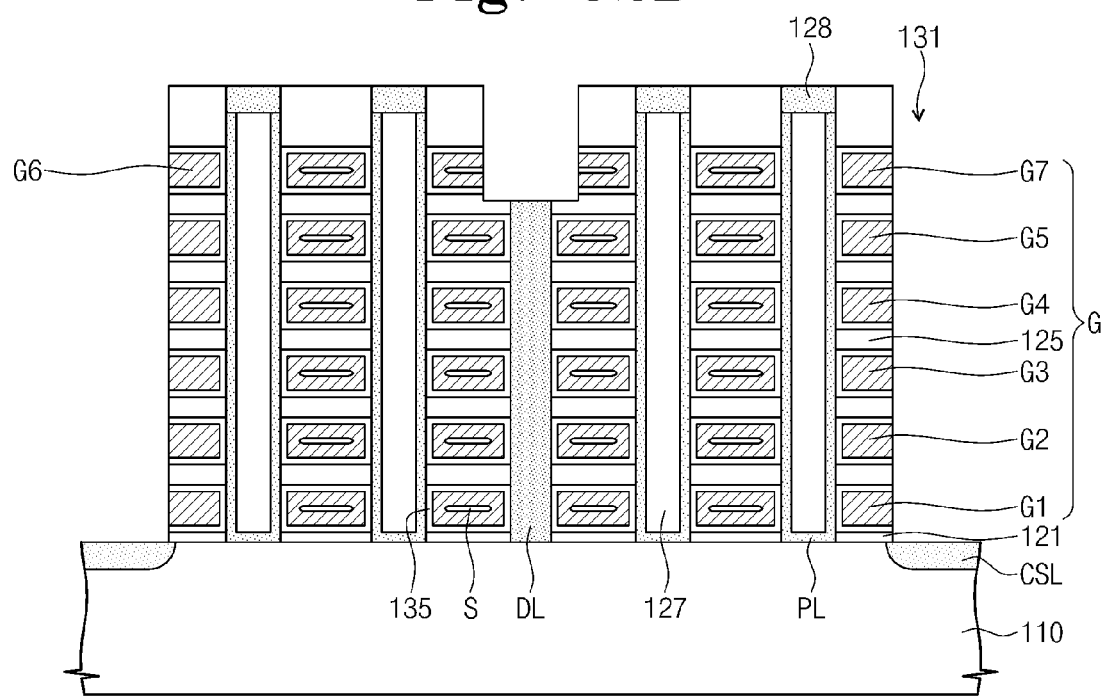

An uppermost horizontal electrode may be cut along the dummy pillars DL to be divided into the sixth horizontal electrode G6 and the seventh horizontal electrode G7. At this time, the dummy pillars DL will be recessed as shown in FIG. 32B.

Dopant ions of the second conductivity type may be heavily provided into the substrate 110 exposed by the isolation regions 131, thereby forming common source lines CSL. Referring again to FIGS. 26B and 26C, the first isolation insulating layer 136 may be formed to fill the isolation regions 131. The cell pillars PL arranged in the second direction D2 may be connected in common to one upper interconnection BL1 or BL2.

Figure 33:
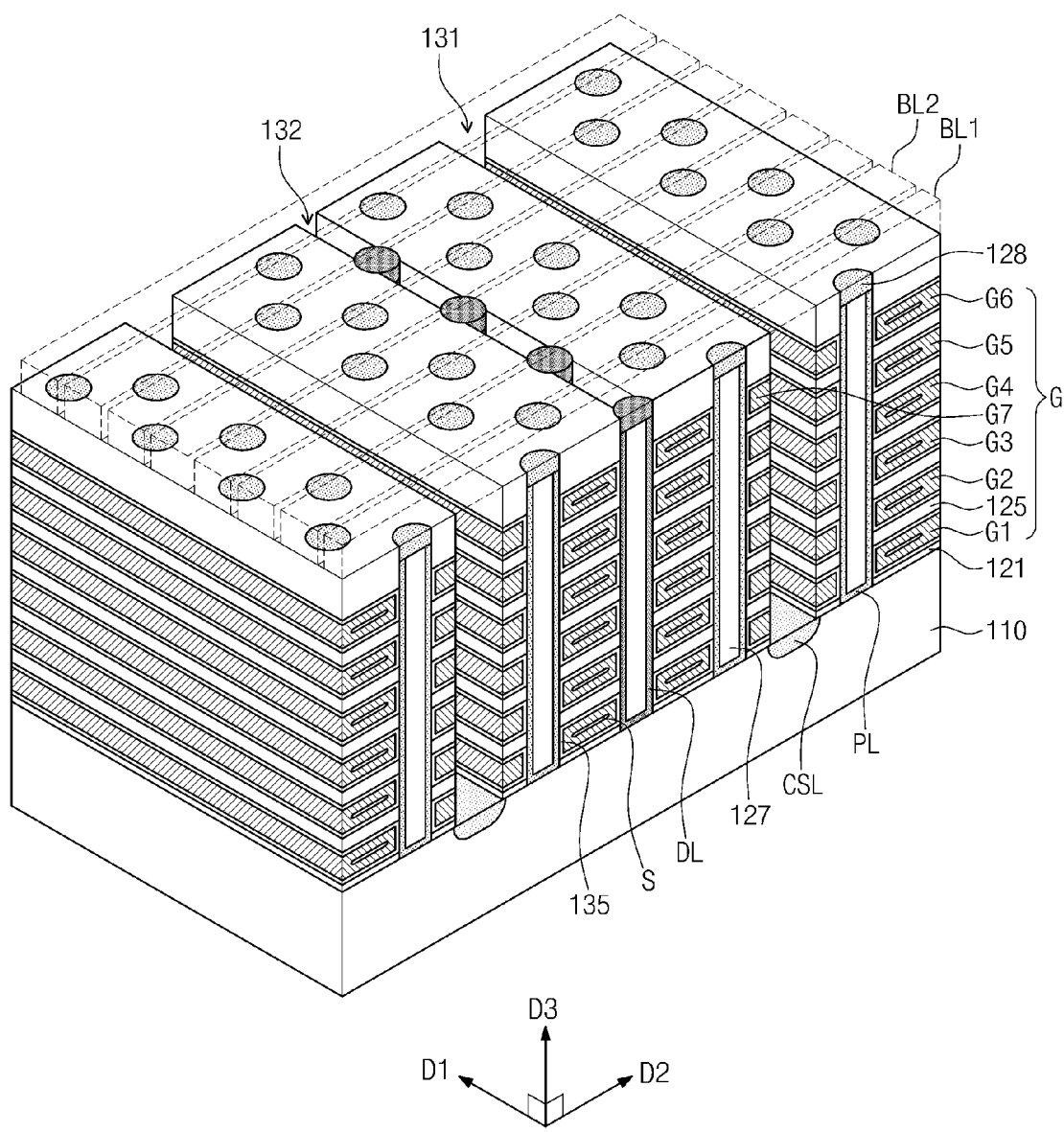
FIG. 33 is a perspective view illustrating yet another embodiment of a memory block of a semiconductor device according to aspects of the inventions.
Figure 34A:
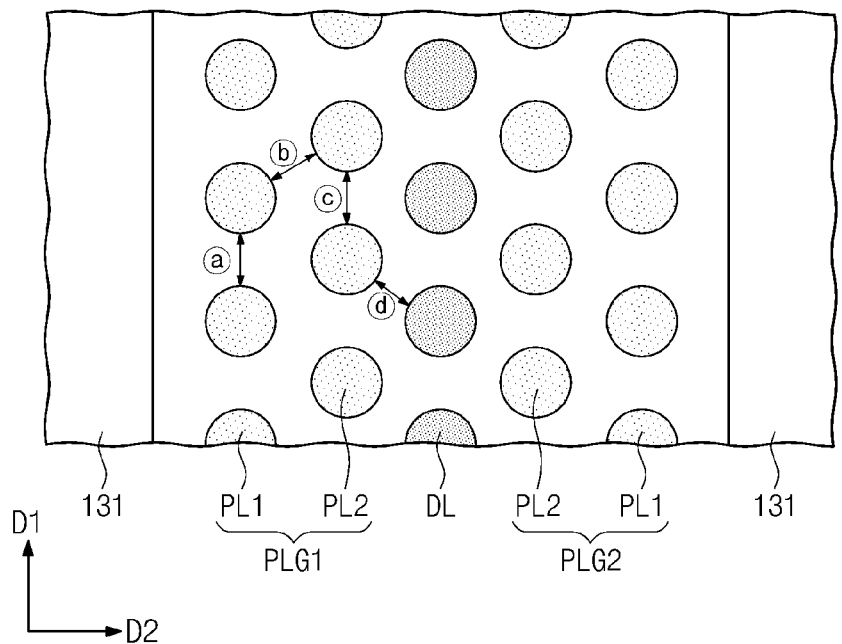
FIG. 34A is a plan view illustrating an example of arrangement of cell pillars of the memory block of FIG. 33.
Figure 34B:
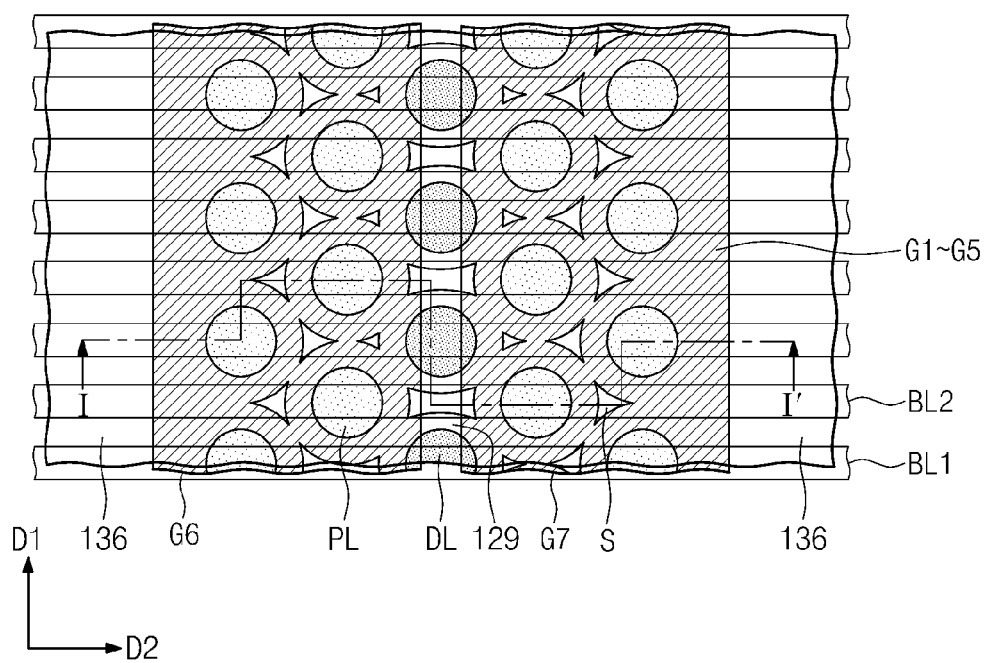
FIG. 34B is a plan view illustrating shapes of horizontal electrodes of the memory block of FIG. 33.
Figure 34C:
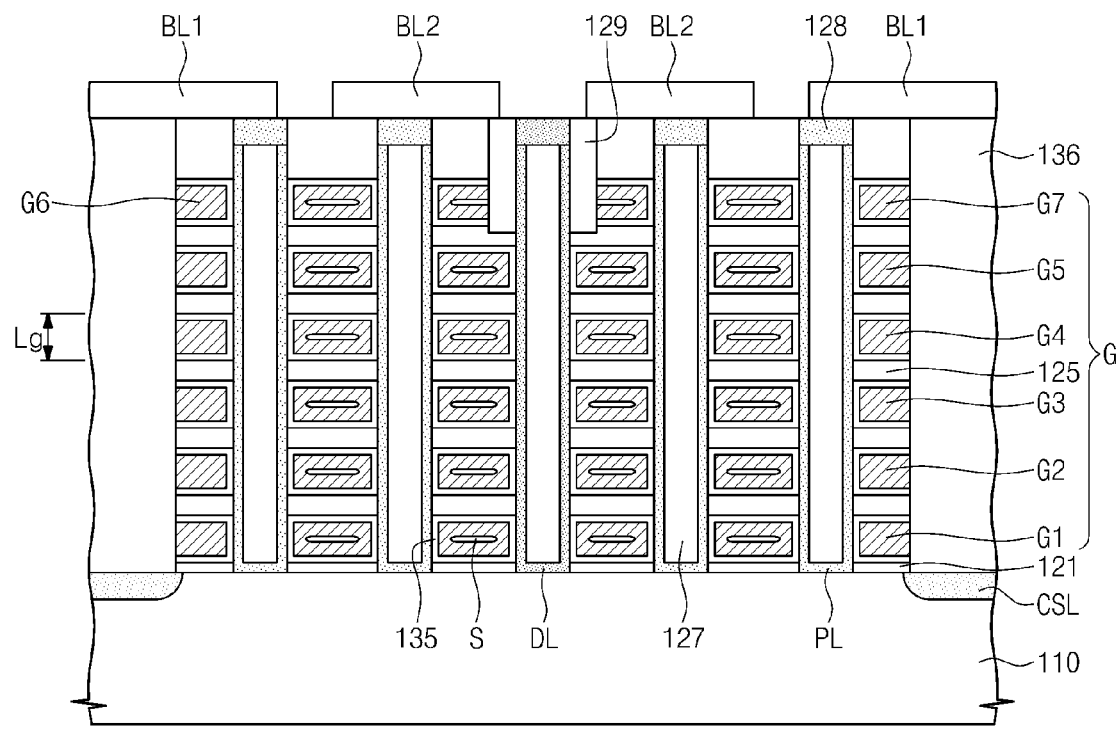
FIG. 34C is a cross-sectional view taken along a line I-I' of FIG. 34B.

FIG. 33 is a perspective view illustrating yet another embodiment of a memory block of a semiconductor device according to aspects of the inventions. FIG. 34A is a plan view illustrating an example of arrangement of cell pillars of a memory block of FIG. 33. FIG. 34B is a plan view illustrating shapes of horizontal electrodes of a memory block of FIG. 33. FIG. 34C is a cross-sectional view taken along a line I-I' of FIG. 34B. In FIG. 34B, the data storage element 135 is not illustrated for the purpose of simplicity in the drawing.

Referring to FIGS. 33, 34A, 34B, and 34C, a semiconductor device according to yet other embodiments will be described. In the present embodiment, the descriptions of the same technical features as described with reference to FIGS. 17 and 18A to 18C will be omitted or mentioned briefly. Differences between the present embodiment and the embodiment of FIGS. 17 and 18A to 18C will be mainly described in detail.

Dummy pillars DL may have the same structure as the cell pillars PL, unlike the embodiment described with reference to FIGS. 25 and 26A to 26C. In the following drawings, hatching of the dummy pillars DL is illustrated to be different from hatching of the cell pillars PL in order to distinguish the dummy pillars DL from the cell pillars PL. A diameter of the dummy pillars DL may be different from a diameter of the cell pillars PL. For example, the diameter of the dummy pillars DL may be greater than the diameter of the cell pillars PL. A dummy insulating pattern 129 may be additionally provided to connect upper portions of the dummy pillars DL to each other. The dummy insulating pattern 129 may extend in the first direction D1.

According to aspects of the inventions, the thickness Lg of each of the horizontal electrodes G1 to G7 is greater than the distance (a) between the cell pillars (i.e., the first cell pillars PL1) that are nearest to the first isolation insulating layer 136 and are directly adjacent to each other. The thickness Lg of each of the horizontal electrodes G1 to G7 may be greater than the minimum value of distances (a), (b), (c) and (d) between directly adjacent pillars PL and DL. The distances (a), (b) and (c) between the cell pillars PL may be greater than the distance (d) between the dummy pillar DL and the cell pillar PL nearest thereto. Sizes of hollow regions S adjacent to the first cell pillars PL1 may be smaller than those of hollow regions S adjacent to the dummy pillars DL, or the hollow regions adjacent to the first cell pillars PL1 may not exist. The dummy pillars DL may separate the hollow regions S adjacent to the dummy pillars DL in the first and second directions D1 and D2.

A method of manufacturing the semiconductor device of FIG. 33 will be described hereinafter.

Figure 35A:
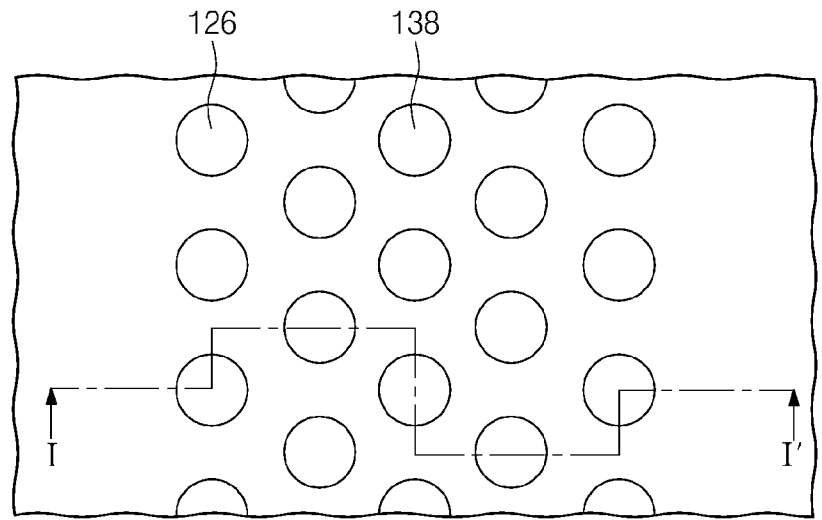
Figure 35B:
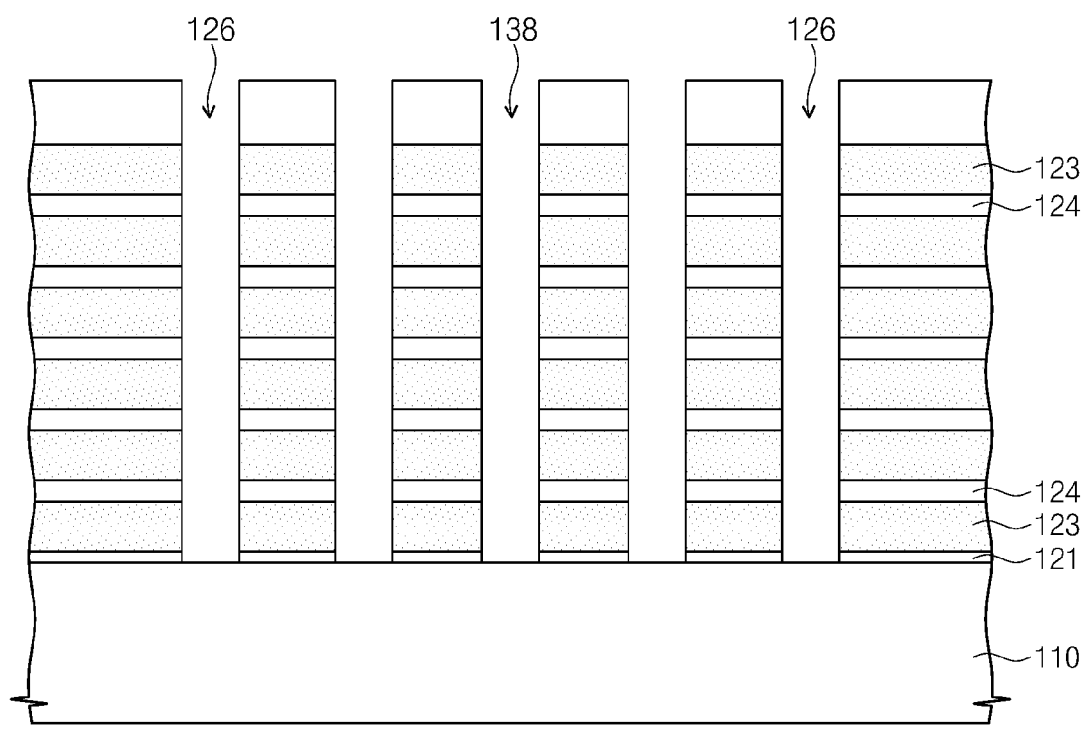

Referring to FIGS. 35A and 35B, holes are formed to penetrate the buffer dielectric layer 121, the sacrificial layers 123 and insulating layer 124 by the method described with reference to FIGS. 27A, 28A, 27B, and 28B. The holes may include cell holes 126 and dummy holes 138. The dummy holes 138 may be provided between the cell holes 126 in a region corresponding to the center portion of the gate structure G. The dummy holes 138 are arranged in the first direction D1. The dummy holes 138 and the cell holes 126 directly adjacent thereto may be arranged in zigzag form along the first direction. A diameter of the dummy holes 138 may be equal to or greater than a diameter of the cell holes 126. The cell holes 126 and the dummy holes 138 arranged in the same form as the cell pillars PL and the dummy pillars DL described with reference to FIG. 34A.

Figure 36A:
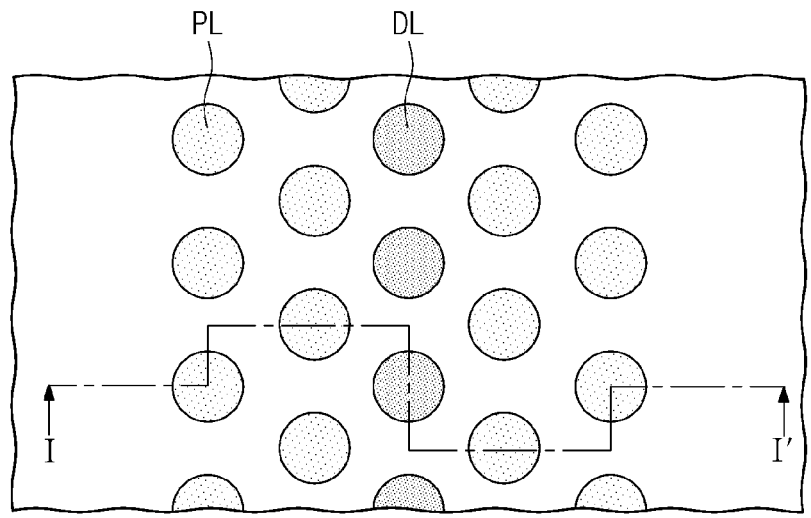
Figure 36B:
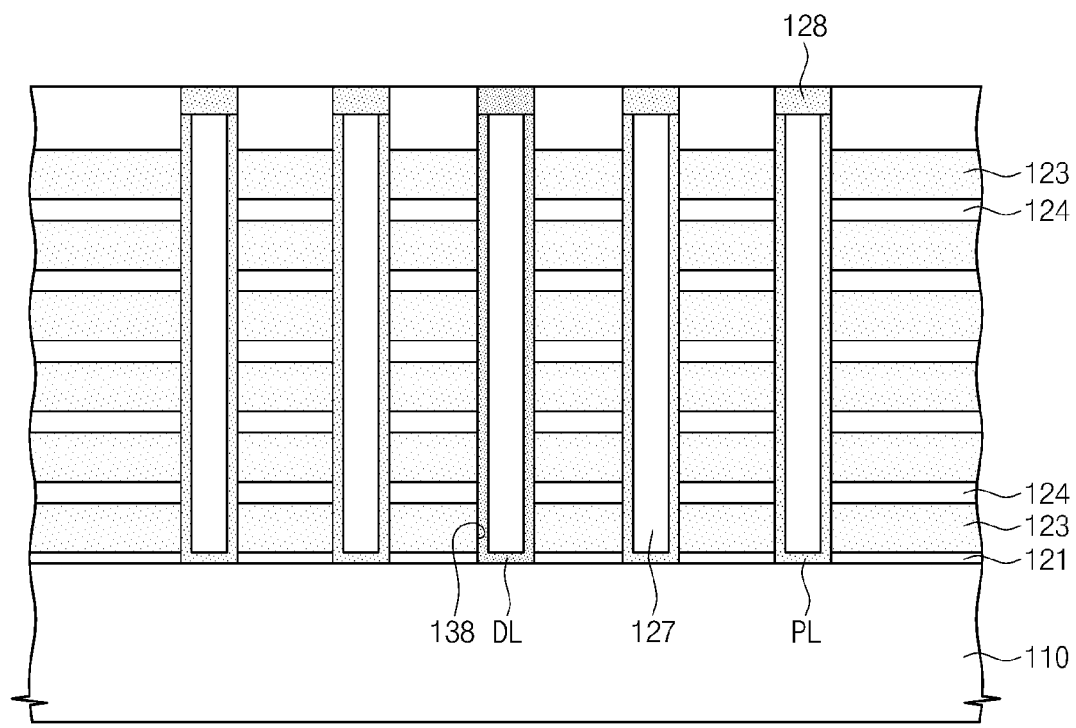

Referring to FIGS. 36A and 36B, cell pillars PL and dummy pillars DL are formed in the cell holes 126 and the dummy holes 138, respectively. Even though the diameter of the cell holes 126 is different from the diameter of the dummy holes 138, a structure of the cell pillars PL may be the same as a structure of the dummy pillars DL. The cell pillars PL and the dummy pillars DL may be semiconductor pillars or conductive pillars, as described above.

Figure 37A:
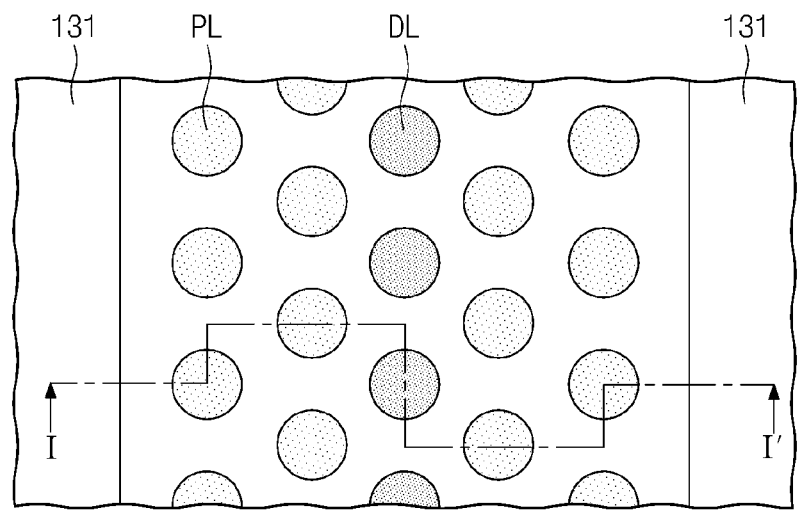
Figure 37B:
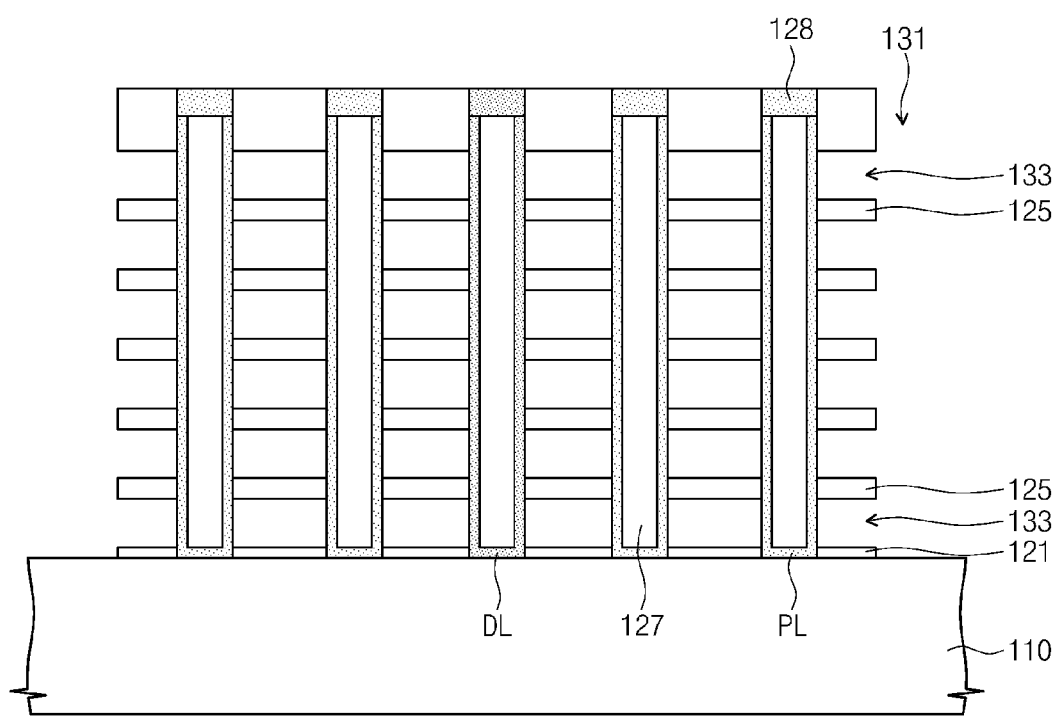

Referring to FIGS. 37A and 37B, the insulating layers 124, the sacrificial layers 123 and the buffer dielectric layer 121 are successively patterned to form isolation regions 131 spaced apart from each other. The isolation regions 131 extend in the first direction and expose the substrate 110. The patterned insulating layers 124 correspond to insulating patterns 125.

The sacrificial layers 123 exposed by the isolation regions 131 are selectively removed to form recess regions 133. The recess regions 133 correspond to regions where the sacrificial layers 123 are removed. The recess regions 133 are defined by the cell pillars PL, the dummy pillar DL, and the insulating patterns 125. If the sacrificial layers 123 include silicon nitride layers or silicon oxynitride layers, the sacrificial layers 123 may be removed using an etching solution including phosphoric acid. Portions of sidewalls of the cell and dummy pillars PL and DL are exposed by the recess regions 133.

Figure 38A:
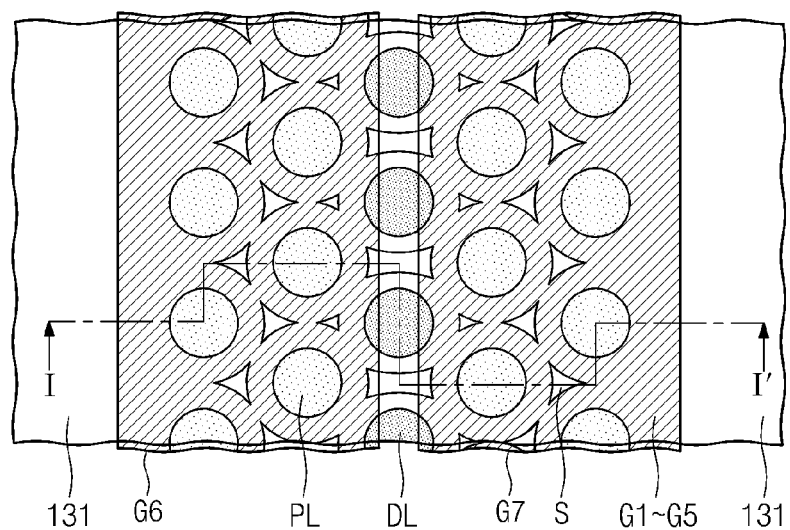
Figure 38B:
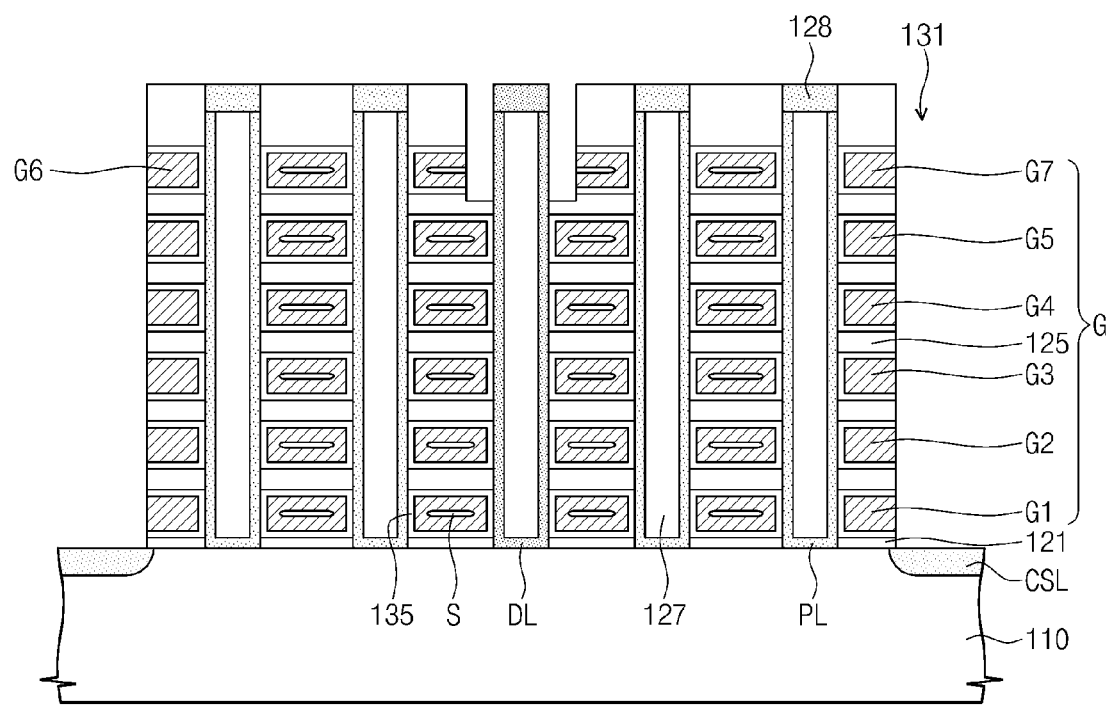

Referring to FIGS. 38A and 38B, horizontal electrodes may be formed by the method described with reference to FIGS. 14, 15A, 15B, 16A, and 16B. The dummy pillars DL may more reduce sizes of the hollow regions S within the horizontal electrodes caused by the replacement process or may remove the hollow regions S.

The uppermost horizontal electrode may be cut along the dummy pillars DL to be divided into the sixth horizontal electrode G6 and the seventh horizontal electrode G7.

Dopant ions of the second conductivity type may be heavily provided into the exposed substrate 110 to form common source lines CSL.

Thereafter, referring again to FIGS. 34B to 34C, the first isolation insulating layer 136 is formed to fill the isolation regions 131. The cell pillars PL arranged in the second direction may be connected in common to one upper interconnection BL1 or BL2. The dummy insulating pattern 129 may be additionally provided between the sixth horizontal electrode G6 and the seventh horizontal electrode G7. The dummy insulating pattern 129 may connect upper portions of the dummy pillars DL to each other and may extend in the first direction.

The embodiments described above may be combined in various forms within the scope of the inventions.

Figure 39:
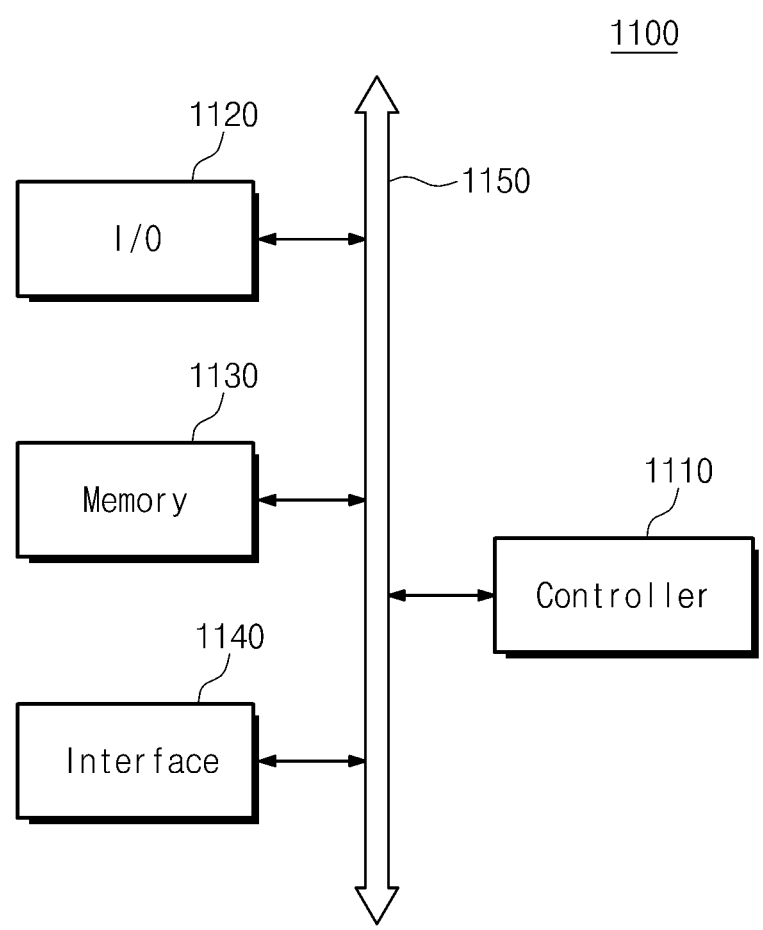
FIG. 39 is a schematic block diagram illustrating an example of electronic systems including semiconductor devices according to embodiments of the inventions.

FIG. 39 is a schematic block diagram illustrating an example of electronic systems including semiconductor devices according to embodiments of the inventions.

Referring to FIG. 39, an electronic system 1100 according to embodiments of the inventions may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may be coupled to each other through the data bus 1150. The data bus 1150 may correspond to a path through which data are transmitted. The memory device 1130 may include at least one of the semiconductor devices according to embodiments of the inventions.

The controller 1110 may include at least one of a microprocessor, a digital signal processor, a microcontroller, or other logic devices having a similar function to any one thereof. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast dynamic random access memory (DRAM) device and/or a fast static random access memory (SRAM) device, which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 40:
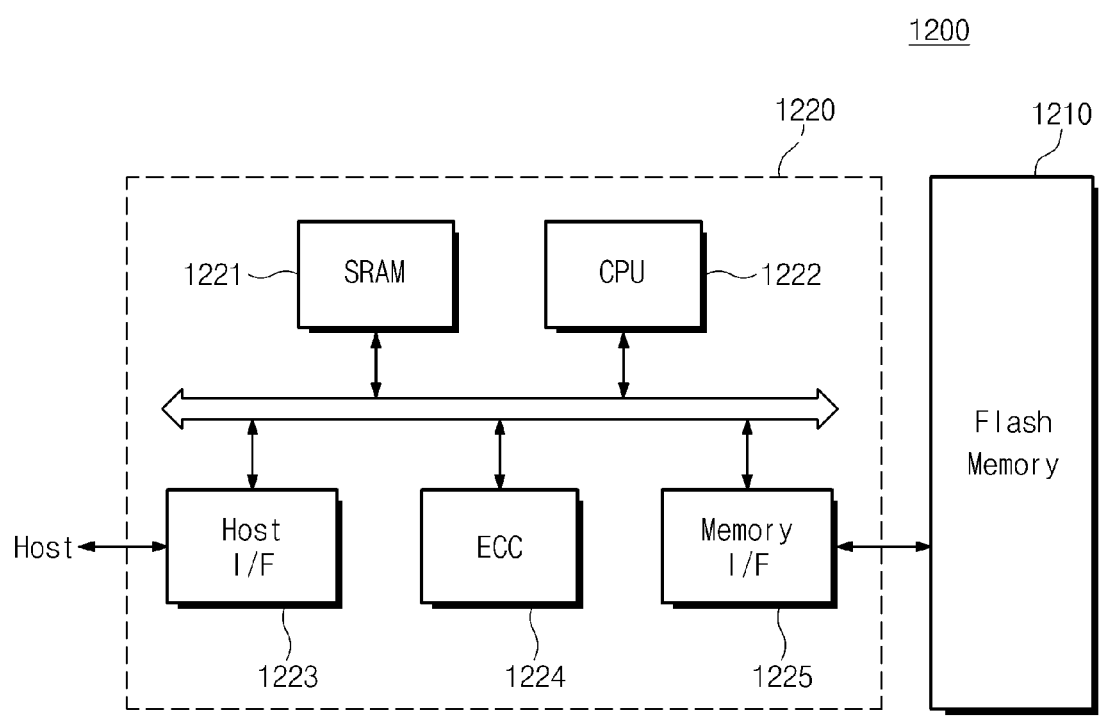
FIG. 40 is a schematic block diagram illustrating an example of memory systems including semiconductor devices according to embodiments of the invention.

FIG. 40 is a schematic block diagram illustrating an example of memory systems including semiconductor devices according to embodiments of the inventions.

Referring to FIG. 40, a memory system 1200 includes a memory device 1210. The memory device 1210 may include at least one of the semiconductor devices according to the aforementioned embodiments. Additionally, the memory device 1210 may further include another type of semiconductor memory devices (e.g., a DRAM device and/or a SRAM device). The memory system 1200 may include a memory controller 1220 that controls data communication between a host and the memory device 1210. The memory device 1210 and/or the controller 1220 may include at least one semiconductor device according to embodiments of the inventions.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory system 1200 and the host. The memory interface unit 1225 may connect the memory controller 1220 to the memory device 1210. Furthermore, the memory controller 1220 may further include an error check and correction (ECC) block 1224. The ECC block 1224 may detect and correct errors of data which are read out from the memory device 1210. Even though not shown in the drawings, the memory system 1200 may further include a read only memory (ROM) device that stores code data to interface with the host. The memory system 1200 may be used as a portable data storage card. Alternatively, the memory system 1200 may be realized as solid state disks (SSD) which are used as hard disks of computer systems.

Figure 41:
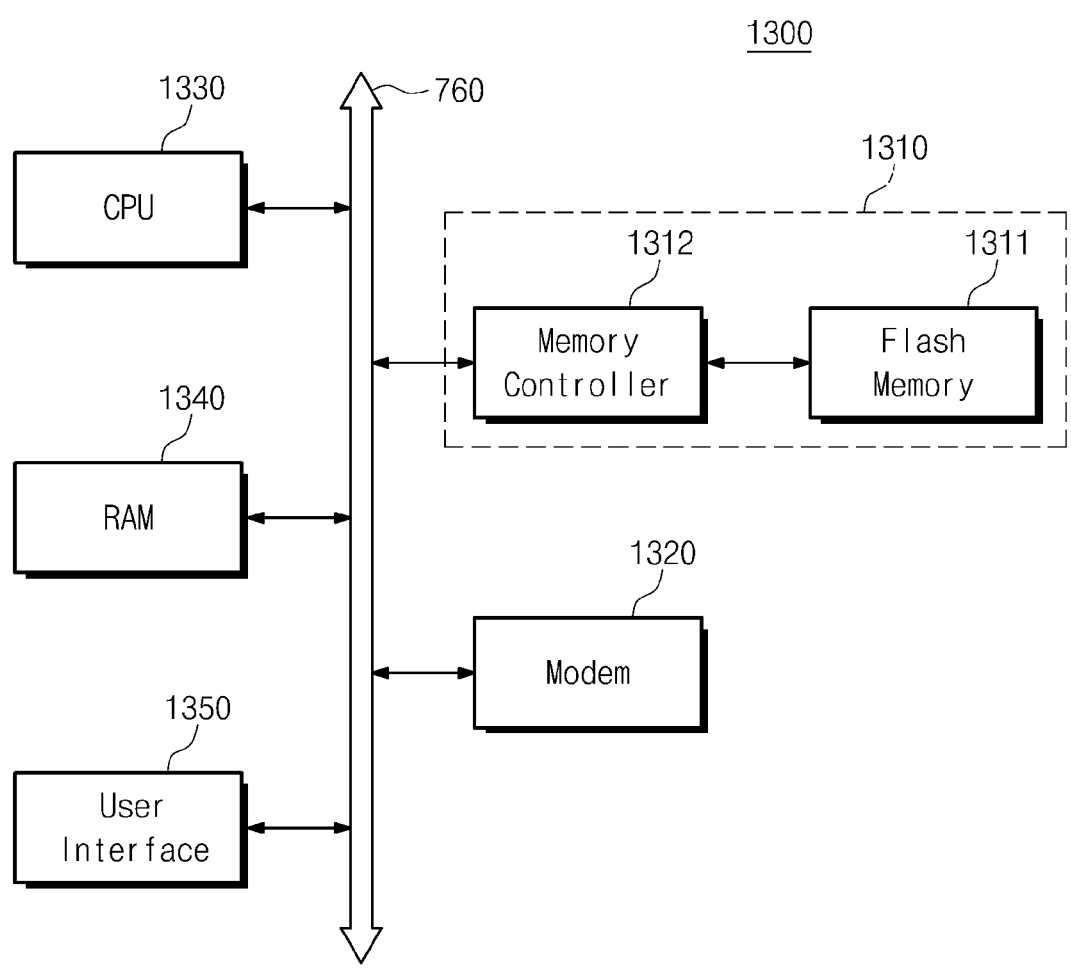
FIG. 41 is a schematic block diagram illustrating an example of information processing systems including semiconductor devices according to embodiments of the inventions.

FIG. 41 is a schematic block diagram illustrating an example of information processing systems including semiconductor devices according to embodiments of the inventions.

Referring to FIG. 41, a flash memory system 1310 according to embodiments of the inventions is installed in an information processing system such as a mobile device or a desktop computer. The information processing system 1300 according to embodiments of the inventions may include a modem 1320, a central processing unit (CPU) 1330, a random access memory (RAM) 1340, and a user interface unit 1350 that are electrically connected to the memory system 1310 through a system bus 760. The flash memory system 1310 may be substantially the same as the aforementioned memory system. The flash memory system 1310 may store data processed by the CPU 1330 or data inputted from the outside of the information processing system 1300. Here, the flash memory system 1310 may be realized as a solid state disk (SSD). In this case, the information processing system 1300 may be able to reliably store massive data in the memory system 1310. This increase in reliability enables the memory system 1310 to conserve resources for error correction such that a high-speed data exchange function may be provided to the information processing system 1300. Although not shown in the drawings, the information processing system 1300 may further include an application chipset, a camera image processor (CIS), and/or an input/output device.

Additionally, the semiconductor devices and memory systems described above may be encapsulated using various packaging techniques. For example, the flash memory devices and the memory systems according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

According to embodiments of the inventions, it is possible to reduce the sizes of the hollow regions within the horizontal electrodes formed by the replacement process. Additionally, embodiments of the inventions may suppress or eliminate formation of hollow regions that are connected to each other to extend in one direction. Thus, the problem of increasing the resistances of the horizontal electrodes may be reduced. Additionally, it is possible to inhibit the insulating patterns, the data storage element and/or the cell pillars from being damaged by the chemicals permeating into the hollow regions or confined in the hollow regions. As a result, the electrical characteristics between the horizontal electrodes and/or between cell pillars and the horizontal electrodes and cell characteristics may be improved. Additionally, performance and reliability of the data storing characteristics of the data storage elements may be improved.

While the inventions have been described with reference to example embodiments, it will be apparent to those skilled in the art that various changes and modifications may be made without departing from the spirits and scopes of the inventions. Therefore, it should be understood that the above embodiments are not limiting, but illustrative. Thus, the scopes of the inventions are to be determined by the broadest permissible interpretation of the following claims and their equivalents, and shall not be restricted or limited by the foregoing description.

What is claimed is:

1. A semiconductor device comprising:
   a plurality of gate structures spaced apart above a top surface of a substrate, the plurality of gate structures including a horizontal electrode extending in a first direction parallel with the top surface of the substrate;
an isolation insulating material disposed between the gate structures; and
a plurality of cell pillars penetrating the horizontal electrode to be spaced apart from each other, each of the cell pillars surrounded by the horizontal electrode,
wherein a vertical thickness of the horizontal electrode is greater than a first spacing defined by a shortest horizontal distance between any two of the plurality of the cell pillars.

2. The semiconductor device of claim 1, wherein the thickness of the horizontal electrode is greater than a second spacing of the cell pillars defined by a shortest distance between two adjacent cell pillars of the plurality of cell pillars that are nearest to the isolation insulating material.

3. The semiconductor device of claim 2, wherein the second spacing of the cell pillars is greater than the first spacing of the cell pillars.

4. The semiconductor device of claim 1, wherein the plurality of cell pillars includes first cell pillars nearest to the isolation insulating material and second cell pillars next nearest to the isolation insulating material.

5. The semiconductor device of claim 4, wherein the first cell pillars and the second cell pillars are arranged in a zigzag.

6. The semiconductor device of claim 4, wherein a distance between a pair of immediately adjacent first cell pillars is equal to or greater than a distance between a pair of immediately adjacent second cell pillars.

7. The semiconductor device of claim 4, wherein a diameter of a first cell pillar is less than a diameter of a second cell pillar.

8. The semiconductor device of claim 6, wherein the distance between the pair of immediately adjacent first cell pillars is greater than a distance between one of the first cell pillars and one of the second cell pillars nearest to the one of the first cell pillars.

9. The semiconductor device of claim 4, further comprising:
a plurality of third pillars third-nearest to the isolation insulating material; and
wherein the first cell pillars, second cell pillars, and third pillars are arranged in a zigzag.

10. The semiconductor device of claim 9, wherein a distance between one of the second cell pillars and one of the first cell pillars nearest thereto is greater than a distance between one of the second cell pillars and one of the third pillars nearest thereto.

11. A semiconductor device comprising:
gate structures disposed above a substrate, each of the gate structures including vertically stacked horizontal electrodes and insulating patterns between the horizontal electrodes;
a first isolation insulating layer disposed between the gate structures; and
a plurality of cell pillars penetrating the gate structures to be spaced apart from each other, each of the cell pillars surrounded by the horizontal electrode,
wherein a vertical thickness of each of the horizontal electrodes in the gate structures is greater than a horizontal distance between adjacent cell pillars where the cell pillars penetrate the horizontal electrode.

12. The semiconductor device of claim 11, wherein each of the gate structures includes horizontally spaced apart first and second uppermost horizontal electrodes.

13. The semiconductor device of claim 12, further comprising:
a second isolation insulating layer filling a trench between the first and second uppermost horizontal electrodes, the trench extending from a top surface of the gate structure to the substrate through the vertically stacked horizontal electrodes.

14. The semiconductor device of claim 13, wherein the trench is provided between cell pillars in a center portion of each of the gate structures; and
wherein a distance between the second isolation insulating layer and a cell pillar nearest to the second isolation insulating layer is less than a distance between a pair of immediately adjacent cell pillars.

15. A semiconductor device comprising:
gate structures disposed above a substrate, each of the gate structures including vertically stacked horizontal electrodes and insulating patterns between the horizontal electrodes;
a first isolation insulating layer disposed between the gate structures;
a plurality of cell pillars penetrating the gate structures to be spaced apart from each other, each of the cell pillars surrounded by the horizontal electrode,
wherein a vertical thickness of each of the horizontal electrodes in the gate structures is greater than a horizontal distance between adjacent cell pillars where the cell pillars penetrate the horizontal electrode, and
wherein each of the gate structures includes horizontally spaced apart first and second uppermost horizontal electrodes; and
dummy pillars extending to the substrate through the gate structures between the horizontally spaced apart first and second uppermost horizontal electrodes.

16. The semiconductor device of claim 15, wherein the dummy pillars are disposed between the cell pillars in a center portion of each of the gate structures; and
wherein the dummy pillars and the cell pillars adjacent thereto are arranged in a zigzag.

17. The semiconductor device of claim 16, wherein a distance between one of the dummy pillars and one of the cell pillars nearest to the one of the dummy pillars is less than a distance between a pair of immediately adjacent cell pillars.

18. The semiconductor device of claim 11, wherein the cell pillars are semiconductor pillars, and the semiconductor device further comprises:
a charge storage element between each of the semiconductor pillars and each of the horizontal electrodes.

19. The semiconductor device of claim 18, wherein the charge storage element comprises: a charge storage layer; a blocking insulating layer between the charge storage layer and each of the horizontal electrodes; and a tunnel insulating layer between the charge storage layer and each of the semiconductor pillars.

20. The semiconductor device of claim 19, further comprising:
a common source line provided in the substrate overlapping with the first isolation insulating layer; and
a bit line coupled to the cell pillars.

21. The semiconductor device of claim 11, wherein the cell pillars are conductive pillars, and the semiconductor device further comprises:
a charge storage element between each of the conductive pillars and each of the horizontal electrodes, wherein the charge storage element is a variable resistance pattern.

* * * * *